United States Patent
Aya

(10) Patent No.: US 9,318,416 B2
(45) Date of Patent: Apr. 19, 2016

(54) SEMICONDUCTOR DEVICE INCLUDING CONDUCTIVE LAYER WITH CONDUCTIVE PLUG

(71) Applicant: Micron Technology, Inc., Boise, ID (US)

(72) Inventor: Tsutomu Aya, Toyko (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/601,960

(22) Filed: Jan. 21, 2015

(65) Prior Publication Data

US 2015/0214135 A1   Jul. 30, 2015

(30) Foreign Application Priority Data

Jan. 27, 2014   (JP) .................................. 2014-012367

(51) Int. Cl.
  *H01L 23/52*   (2006.01)
  *H01L 23/48*   (2006.01)
  *H01L 27/108*   (2006.01)

(52) U.S. Cl.
  CPC ........ *H01L 23/481* (2013.01); *H01L 27/10814* (2013.01); *H01L 27/10885* (2013.01); *H01L 27/10894* (2013.01); *H01L 2924/0002* (2013.01)

(58) Field of Classification Search
  CPC .................. H01L 23/481; H01L 23/50; H01L 2924/0002; H01L 23/5221
  See application file for complete search history.

(56) References Cited

U.S. PATENT DOCUMENTS

| 8,390,051 | B2 | 3/2013 | Bicksler | |
|---|---|---|---|---|
| 8,397,182 | B2 * | 3/2013 | Nagahara | G03F 1/144 430/30 |
| 8,558,346 | B1 * | 10/2013 | Cheng | H01L 23/5223 257/532 |
| 8,698,206 | B2 * | 4/2014 | Schulz | H01L 21/027 257/211 |
| 2013/0075934 | A1 * | 3/2013 | Oto | H01L 23/528 257/775 |
| 2013/0175639 | A1 * | 7/2013 | Becker | H01L 27/0207 257/401 |
| 2013/0292836 | A1 * | 11/2013 | Tang | H01L 23/5221 257/773 |
| 2015/0050811 | A1 * | 2/2015 | Mehta | H01L 21/31144 438/703 |

FOREIGN PATENT DOCUMENTS

JP   2012-084738   4/2012
JP   2013-502726   1/2013

* cited by examiner

*Primary Examiner* — A. Sefer
(74) *Attorney, Agent, or Firm* — Wells St. John P.S.

(57) ABSTRACT

Some embodiments include a semiconductor device which includes a first conductive layer formed on the semiconductor substrate and a first contact plug connected to the first conductive layer. The first conductive layer includes a plurality of loops of conductive material over the semiconductor substrate. Each of the plurality of loops comprises a first opening and a second opening, a first portion and a second portion sandwiching the first opening, a third portion and a fourth portion sandwiching the second opening, a first tab portion connected to the first portion and the third portion and having a first length in a first direction and a first width in a second direction perpendicular to the first direction, and a second tab portion connected to the second portion and the fourth portion and having a second length in the first direction and a second width in the second direction.

19 Claims, 69 Drawing Sheets

SEMICONDUCTOR DEVICE INCLUDING CONDUCTIVE LAYER WITH CONDUCTIVE PLUG

RELATED PATENT DATA

This application is based upon and claims the benefit of priority from Japanese Patent Application No. 2014-12367 filed on Jan. 27, 2014, the disclosure of which are incorporated herein in its entirely by reference.

TECHNICAL FIELD

Semiconductor device including conductive layer with conductive plug.

DESCRIPTION OF PRIOR ART

A double patterning technique has been developed as a technique for realizing processing dimensions that exceed in accuracy the critical resolution of the liquid-immersion exposure technique. One example of the double patterning technique is self-aligned double patterning lithography (SADPL) (see, e.g., JP 2013-502726A).

According to SADPL, a core pattern is formed first and then spacers are formed on both side walls of the core pattern, respectively. Subsequently, the core pattern is eliminated and the remaining spacers are used as a mask. By this method, processing with a pitch ½ of the pitch of the core pattern can be realized. SADPL is applicable to, for example, a case of forming a repetitive pattern composed of the same patterns arranged repeatedly at given intervals, such as bit interconnects 15 shown in FIG. 2 of JP 2012-84738A. Using SADPL for forming such a repetitive pattern reduces the minimum processing dimension to about 20 nm.

BRIEF DESCRIPTION OF THE DRAWINGS

FIG. 32D is a sectional view along a line of FIG. 32A.

DETAILED DESCRIPTION OF THE EMBODIMENTS

To facilitate understanding of the present invention, a related technique will first be described before description of the present invention.

FIGS. 1A to 9B are drawings for explaining a manufacturing method for a semiconductor device according to the related technique. Each of FIGS. 1A to 9A is a plan view for explaining each process, and each of FIGS. 1B to 9B is a sectional view along a I-I' line of each of FIGS. 1A to 9A corresponding to FIGS. 1B to 9B.

Figure 1A:
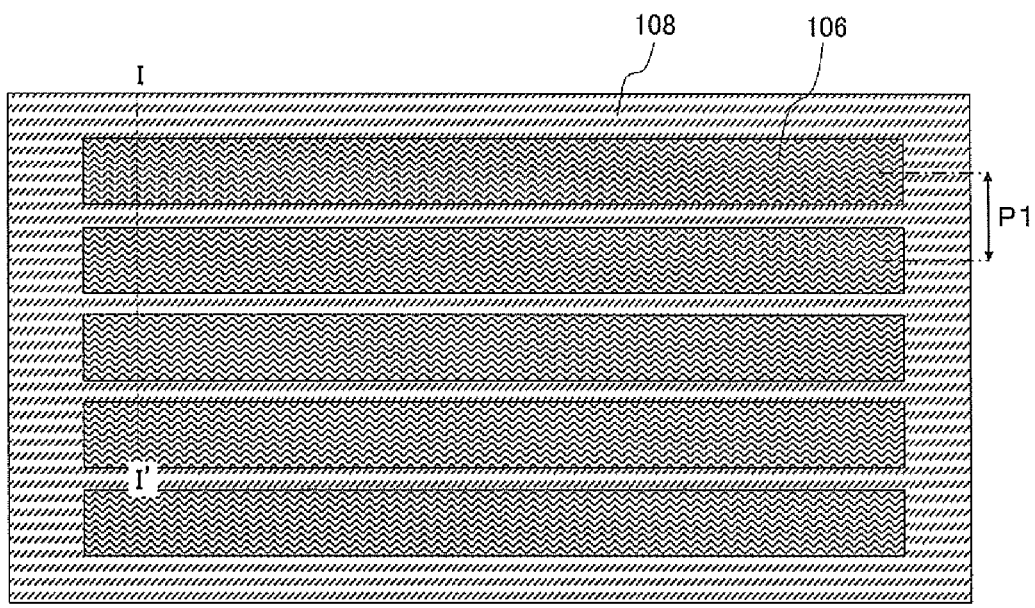
FIG. 1A is a plan view for explaining a manufacturing method for a semiconductor device according to a related technique.
Figure 1B:
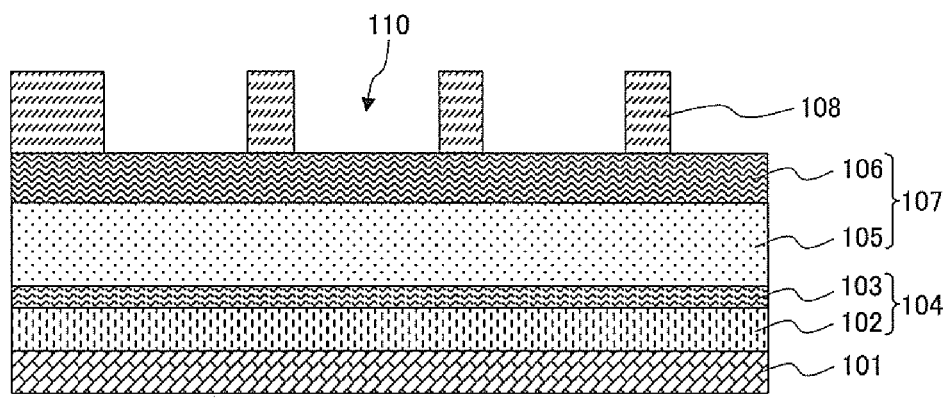
FIG. 1B is a sectional view along a I-I' line of FIG. 1A.

As shown in FIG. 1B, a substrate layer 101 is overlaid with an interconnect conductive film 102 and a cap insulating film 103 to form an etching base material 104 on the substrate layer 101. The etching base material 104 is then overlaid with an amorphous carbon film 105 and with a silicon nitride film 106 in order to form a first mask layer 107 on the etching base material 104. Subsequently, a first organic film pattern 108 is formed on the first mask layer 107.

Both of the amorphous carbon film 105 and silicon nitride film 106 can be formed by plasma CVD.

The first organic film pattern 108 is formed, for example, in the following manner.

First, a first BARC film (first reflection-preventing film or BARC (Bottom Anti-Reflection Coating)), a Si-containing BARC film, and an ArF (laser exposure) resist are formed in order, using a spin coater.

The ArF resist is then subjected to exposure and development processes to form a given pattern in the ArF resist. For the exposure process, a liquid-immersion ArF exposure apparatus can be used.

Subsequently, the Si-containing BARC film is etched selectively, using the formed ArF resist pattern as a mask, and then the first BARC film is etched selectively, using the remaining Si-containing BARC film as a mask. The etching is carried out as dry etching mainly using an oxygen gas under a condition where organic materials are major reactors.

Through the above process, the ArF resist pattern is transferred to the first BARC film to form the first organic film pattern 108. After the selective etching of the first BARC film using the Si-containing BARC film, the ArF resist and the Si-containing BARC film do not exist anymore.

The first organic film pattern 108 defines multiple spaces 110 arranged at the same pitch P1 (80 nm) in a first direction (vertical direction in FIG. 1A). In a plan view, each space has a given width in the first direction and is formed into a rectangular shape extending in a second direction (horizontal direction in FIG. 1A) different from the first direction. FIG. 1A depicts a case where the first organic film pattern defines a pattern of multiple spaces independent of each other. However, the first organic film pattern may define a pattern of lines independent of each other.

Figure 2A:
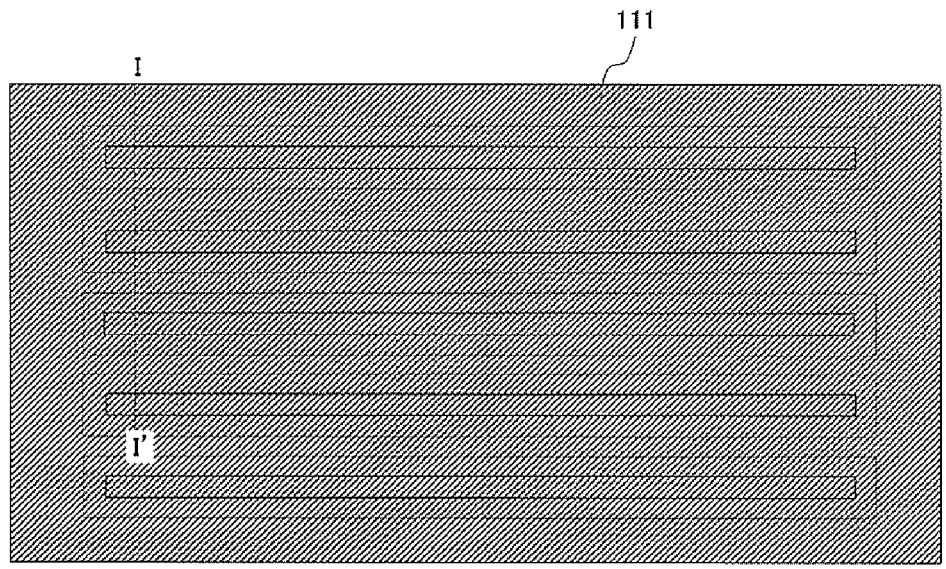
FIG. 2A is a plan view for explaining a process following the process depicted in FIGS. 1A and 1B.
Figure 2B:
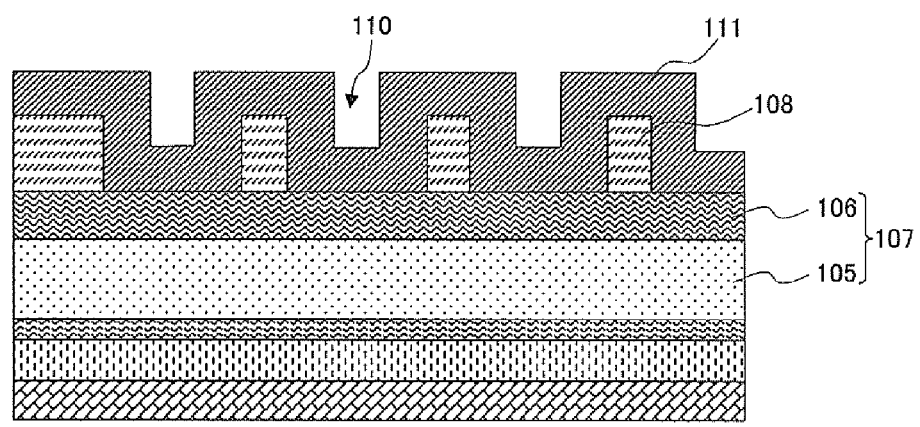
FIG. 2B is a sectional view along a I-I' line of FIG. 2A.

Subsequently, as shown in FIGS. 2A and 2B, an MLD (Molecular Layer Deposition) oxide film 111 is formed on the first organic film pattern 108 such that the MLD oxide film 111 covers the side walls and bottoms of the spaces 110. The thickness of the MLD oxide film 111 is determined to be a thickness with which the MLD oxide film 111 does not fill up the spaces 110. As a result of determining the film thickness in this manner, the part of spaces 110 that is closer to the first mask layer 107 (bottom side) is filled with the MLD oxide film 111 but the opening side of the spaces 110 is left unoccupied as space.

Subsequently, the MLD oxide film 111 is etched back selectively by anisotropic dry etching. This etching back is continued until the top surface of the first organic film pattern 108 is exposed and part of the first mask layer 107 is exposed in the spaces 110 of the first organic film pattern 108. This dry etching is carried out mainly using a C×Fy-based gas, such as $CF_4$ gas and $C_2F_4$ gas, so that the etching rate for the first organic film pattern 108 and the silicon nitride film 106 that is an upper layer is kept low as much as possible.

Figure 3A:
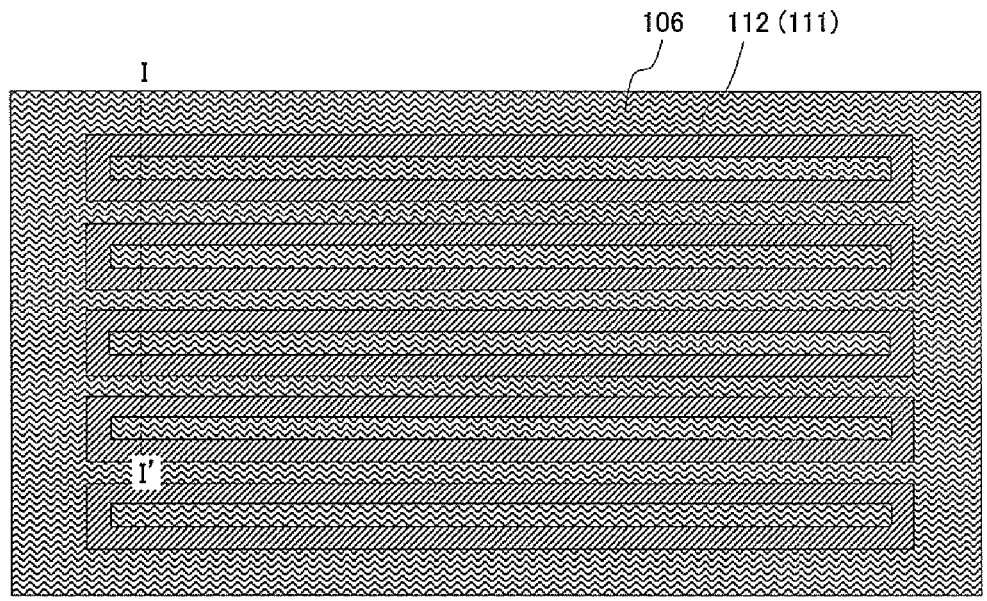
FIG. 3A is a plan view for explaining a process following the process depicted in FIGS. 2A and 2B.
Figure 3B:
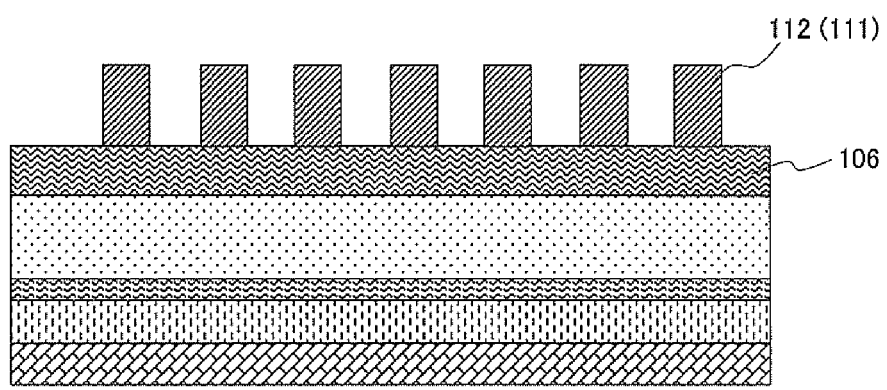
FIG. 3B is a sectional view along a I-I' line of FIG. 3A.

Following the etching back of the MLD oxide film 111, the first organic film pattern 108 is eliminated selectively. As a result, as shown in FIGS. 3A and 3B, rectangular-frame-shaped side walls 112 are formed in the areas of the spaces 110 of the first organic film pattern 108, respectively.

Figure 4A:
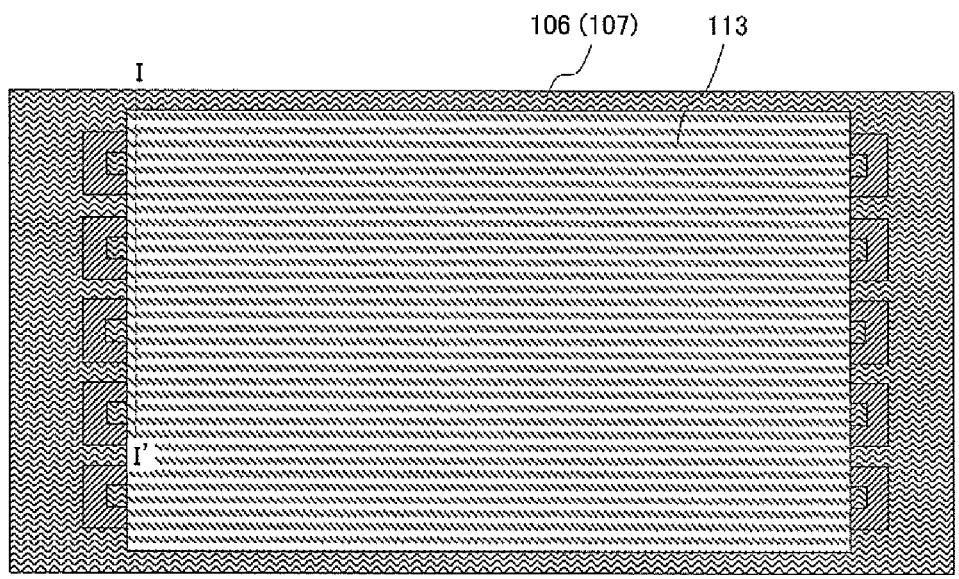
FIG. 4A is a plan view for explaining a process following the process depicted in FIGS. 3A and 3B.
Figure 4B:
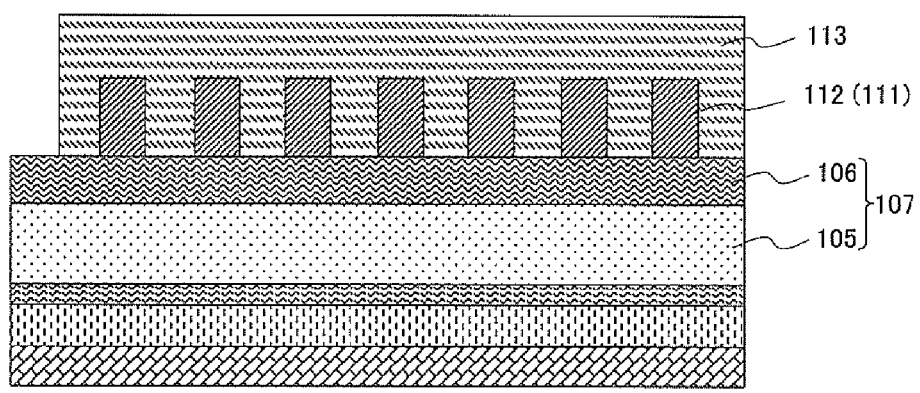
FIG. 4B is a sectional view along a I-I' line of FIG. 4A.

Subsequently, as shown in FIGS. 4A and 4B, an organic film covering part of the first mask layer 107 and side walls 112 is deposited to form a second organic film pattern 113. The second organic film pattern 113 is so formed that pairs of short sides (first and second side walls) of the rectangular-frame-shaped side walls 112 are exposed.

Pairs of long sides (third and fourth side walls) of the side walls 112 that are covered with the second organic film pattern 113 are equivalent to the line portions of a line-and-space pattern. The short sides of the side walls 112 are extra parts that connect adjacent line portions of the line-and-space pattern. The second organic film pattern 113 is used as an etching mask for eliminating these extra connecting portions.

Forming the second organic film pattern 113 does not require processing accuracy as high as processing accuracy required for the formation of the side walls 112. For this reason, a Krf (laser exposure) resist can be used for the formation of the second organic film pattern 113. When the Krf resists is used, however, the resist is apt to leave a resist residue on a microscopic part after the development process. To prevent the creation of the resist residue in the area between the parts of side walls to be exposed, therefore, it is necessary to carry out overexposure with an exposure rate 1.5 times or more the optimum exposure rate of exposure on a flat pattern.

Figure 5A:
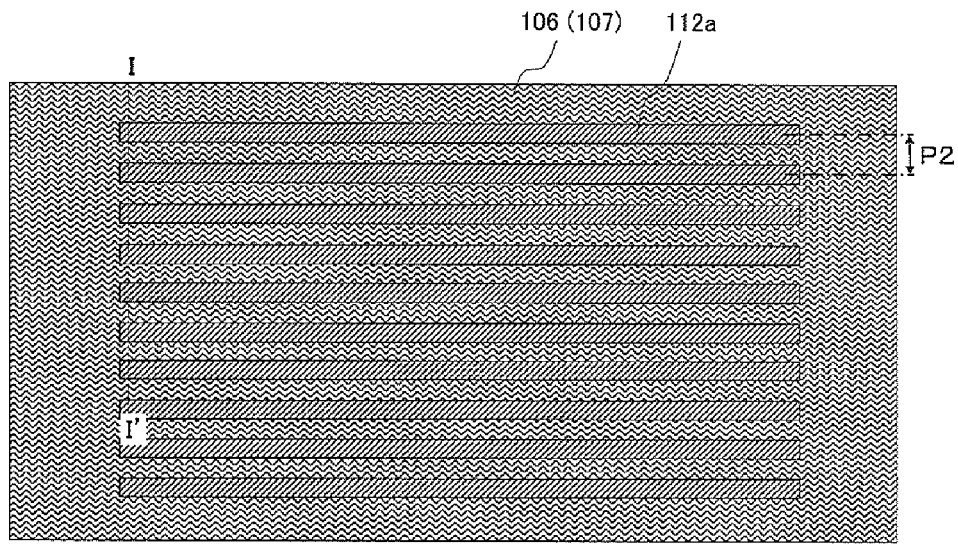
FIG. 5A is a plan view for explaining a process following the process depicted in FIGS. 4A and 4B.
Figure 5B:
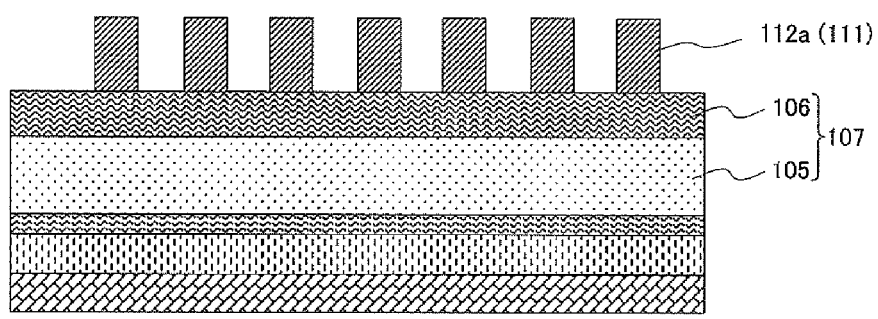
FIG. 5B is a sectional view along a I-I' line of FIG. 5A.

Subsequently, as shown in FIGS. 5A and 5B, the exposed part of the MLD oxide film 111 (side walls 112) that is not covered with the second organic film pattern 113 is eliminated selectively by dry etching. To dry etch the MLD oxide film 111, a C×Fy-based gas, such as $CF_4$ gas and $C_2F_4$ gas, can mainly be used. This dry etching eliminates the short sides (the whole of the first and second side walls and part of the third and fourth side walls) of the side wall 112. The remaining long sides 112a (major part of the third and fourth side walls) of the side wall forms the line-and-space pattern. The pitch P2 of the line-and-space pattern formed of the side wall 112a is ½ of the pitch P1 of the first organic film pattern 108. In other words, the number of pitch-intervals of the pattern formed of the side wall long sides 112a is 2 times the number of pitch-intervals of the first organic film pattern 108 formed in a given area. Such a process of doubling the number of pitch-intervals is often referred to as double number of pitch-intervals process.

Subsequently, the second organic film pattern 113 (Krf resist) is eliminated using an acidic removal agent ($H_2SO_4$+ $H_2O_2$+$H_2O$).

Figure 6A:
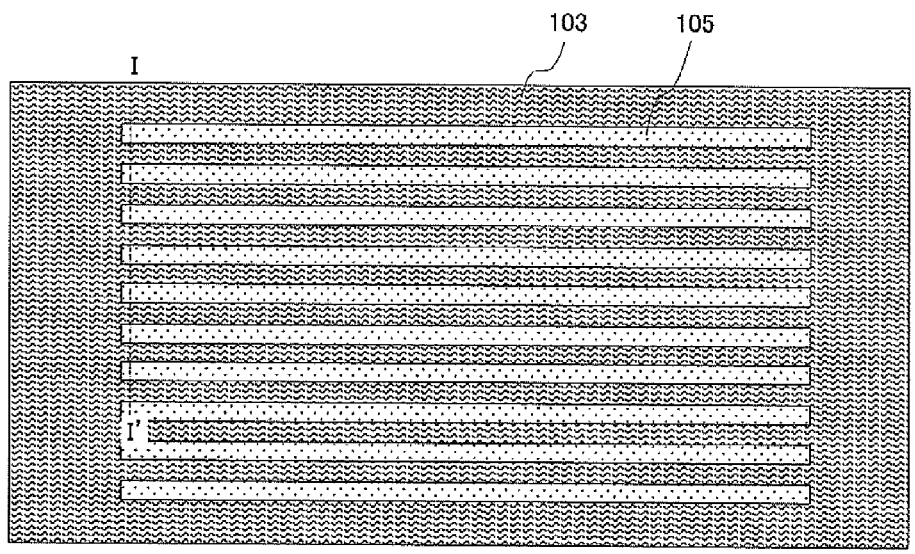
FIG. 6A is a plan view for explaining a process following the process depicted in FIGS. 5A and 5B.
Figure 6B:
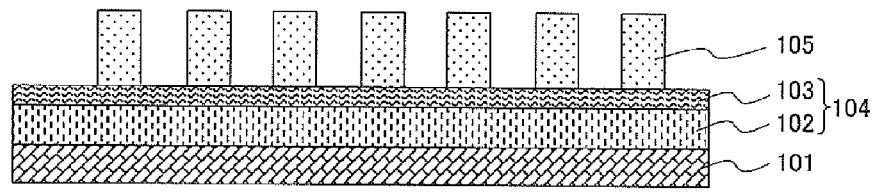
FIG. 6B is a sectional view along a I-I' line of FIG. 6A.

Subsequently, the silicon nitride film 106, which is the upper layer making up the mask layer 107, is dry etched selectively, using the remaining MLD oxide film 111 (side wall long sides 112a) as a mask. The amorphous carbon film 105, which is the lower layer making up the mask layer 107, is then dry etched selectively, using the remaining silicon nitride film 106 as a mask. As a result, a line-and-space pattern having line portions made of the amorphous carbon film 105 is formed, as shown in FIGS. 6A and 6B.

To dry etch the silicon nitride film 106, a C×Fy-based gas, such as $CF_4$ gas and $C_2F_4$ gas, can mainly be used. To dry etch the amorphous carbon film 105, a gas produced by adding an Ar gas to a C×Fy-based gas can mainly be used.

In many cases, the silicon nitride film 106 used as the mask in the process of etching the amorphous carbon film 105 disappears during the etching process. Even if the silicon nitride film 106 does not disappear completely and part of it survives, it does not pose a serious problem to processes to follow.

Figure 7A:
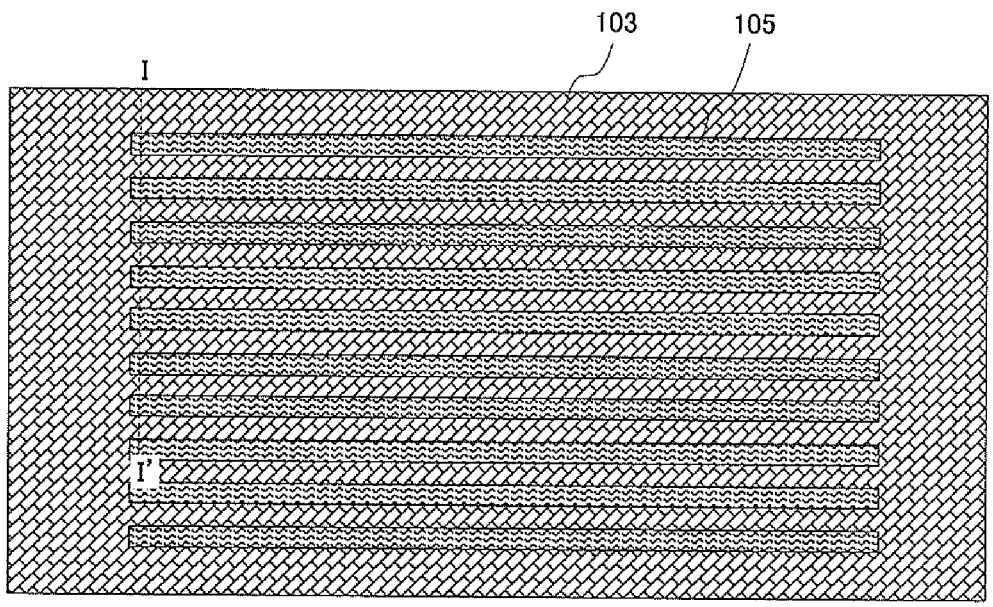
FIG. 7A is a plan view for explaining a process following the process depicted in FIGS. 6A and 6B.
Figure 7B:
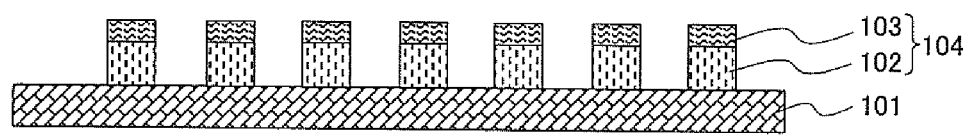
FIG. 7B is a sectional view along a I-I' line of FIG. 7A.

Subsequently, the cap insulating film 103 making up the etching base material 104 is dry etched selectively, using the remaining amorphous carbon film 105 as a mask. The interconnect conductive film 102 making up the etching base material 104 is then dry etched selectively, using the remaining cap insulating film 103 as a mask. As a result, a line-andspace pattern having line portions made of the etching base material 104 is formed as a conductive layer, as shown in FIGS. 7A and 7B.

To dry etch the cap insulating film 103, a C×Fy-based gas, such as $CF_4$ gas and $C_2F_4$ gas, can mainly be used. To dry etch the interconnect conductive film 102, a $Cl_2$+HBr mixed gas can mainly be used, and a gas produced by adding a $CF_4$ gas to the mixed gas may also be used.

Subsequently, a silicon nitride film of about 8 nm in thickness is so formed that the silicon nitride film covers the completely dry etched etching base material 104. The formed silicon nitride film is then etched back to form a side wall nitride film 115 on the side walls of the line-patterned etching base material 104, as shown in FIG. 8B.

Figure 8A:
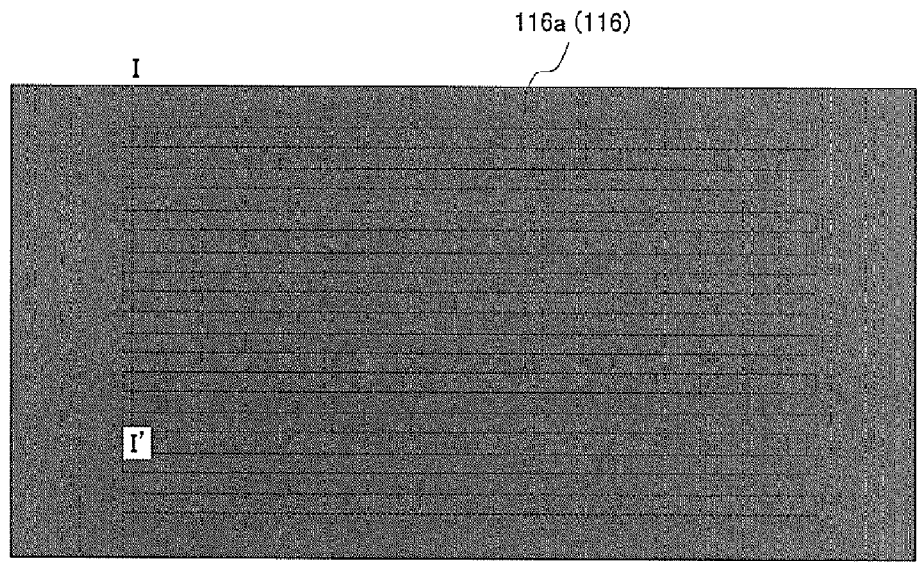
FIG. 8A is a plan view for explaining a process following the process depicted in FIGS. 7A and 7B.
Figure 8B:
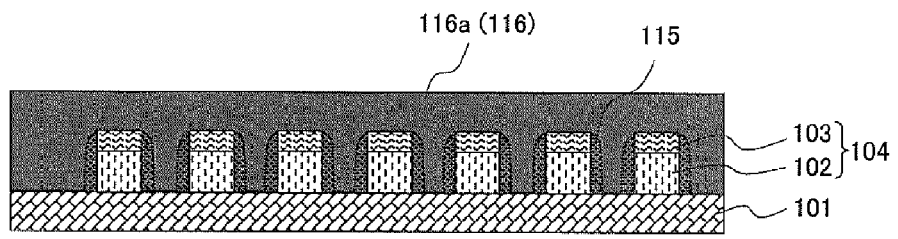
FIG. 8B is a sectional view along a I-I' line of FIG. 8A.

Subsequently, as shown in FIGS. 8A and 8B, an SOD (Spin On Dielectric) film 116 is formed with a spin coater. The formed SOD film 116 is then reformed into a silicon oxide film by steam annealing, which silicon oxide film serves as an inter-layer insulating film 116a. The formed inter-layer insulating film 116a is then polished by CMP (Chemical Mechanical Polishing) to flatten its upper surface.

Figure 9A:
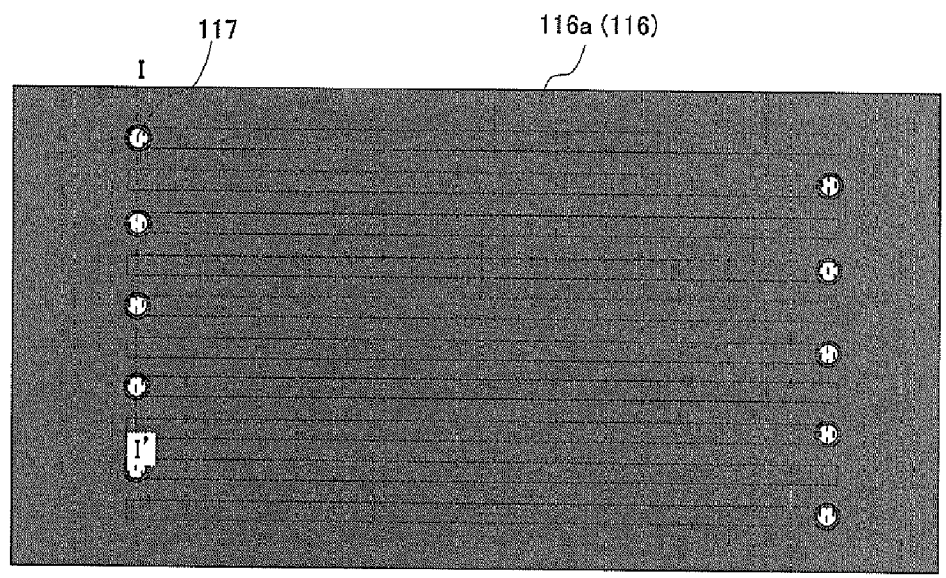
FIG. 9A is a plan view for explaining a process following the process depicted in FIGS. 8A and 8B.
Figure 9B:
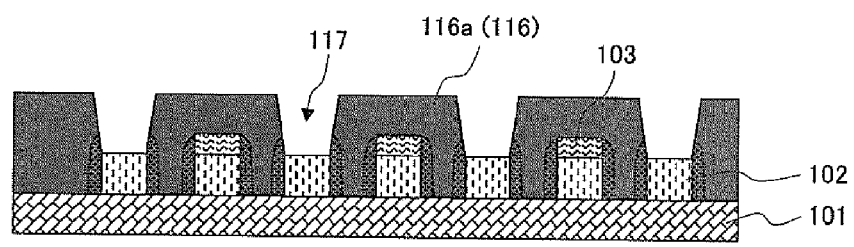
FIG. 9B is a sectional view along a I-I' line of FIG. 9A.

Subsequently, as shown in FIGS. 9A and 9B, contact holes 117 are formed in the inter-layer insulating film 116a. The contact holes 117 are so formed that they penetrate the cap insulating film 103 to reach the interconnect conductive film 102. This means that the contact holes 117 are formed such that the interconnect conductive film 102 is exposed at the bottoms of the contact holes 117.

Figure 10:
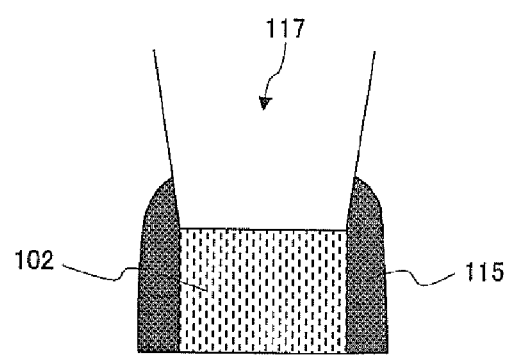
FIG. 10 is a sectional view for explaining a problem with the related technique.

When connection resistance between a contact plug formed in each contact hole 117 and the interconnect conductive film 102 is taken into consideration, the diameter of the bottom of the contact hole 117 should preferably be equal to the width of the interconnect conductive film 102, as shown in FIG. 10. However, when a pitch aligning margin is taken into consideration, determining the bottom diameter to be smaller than the width of the interconnect conductive film 102 is inevitable.

The present invention has been conceived to ease such a size limitation. The object of the present invention is to provide a manufacturing method for a semiconductor device that even if the width of an interconnect conductive film is kept as it is or reduced, allows the formation of a contact hole having a diameter equal to or larger than the width of the interconnect conductive film.

Embodiments of the present invention will hereinafter be described in detail, referring to drawings.

FIRST EMBODIMENT

FIGS. 11A to 19C are process diagrams for explaining a manufacturing method for a semiconductor device according to a first embodiment of the present invention. FIGS. 11A to 19A are plan views, and FIGS. 11B to 19B and 11C to 19C are sectional views along I-I' lines and II-II' lines of FIGS. 11A to 19A corresponding to the FIGS. 11B to 19B and 11C to 19C, respectively. In these drawings, constituent elements identical with or corresponding to constituent elements of the related technique are denoted by the same reference numerals used for depicting the related technique.

Figure 11A:
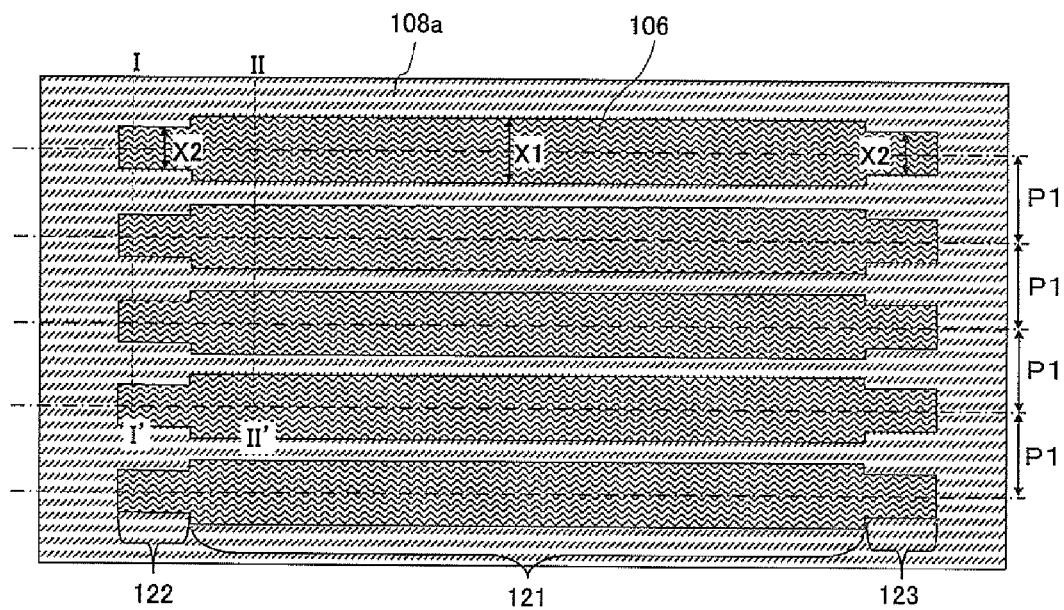
FIG. 11A is a plan view for explaining a manufacturing method for a semiconductor device according to a first embodiment of the present invention.
Figure 11B:
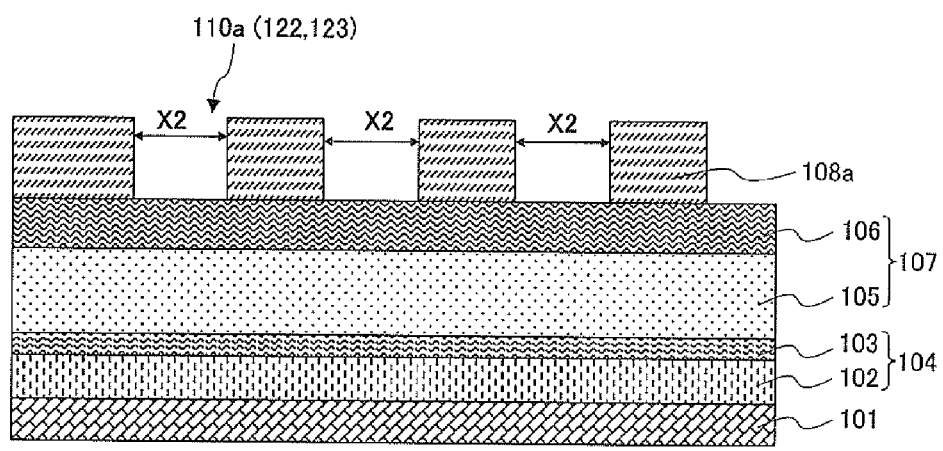
FIG. 11B is a sectional view along a I-I' line of FIG. 11A.
Figure 11C:
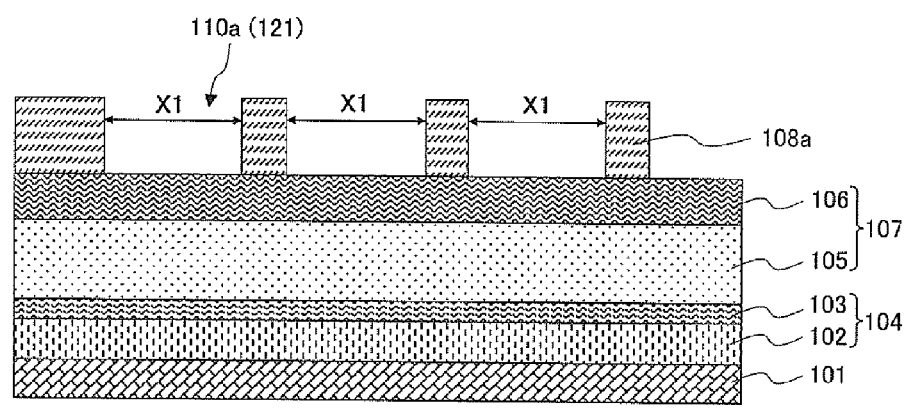
FIG. 11C is a sectional view along a II-II' line of FIG. 11A.

As shown in FIGS. 11A, 11B, and 11C, the interconnect conductive film 102, the cap insulating film 103, the amorphous carbon film 105, the silicon nitride film 106, and the first organic film pattern 108a are formed on the substrate layer 101 through the same process as the process of the relate technique.

This embodiment is different from the related technique in that the plane shape of spaces 110a defined by a first organic film pattern 108a is different from the plane shape of the spaces 110.

The multiple spaces 110a defined by the first organic film pattern 108a are similar to the spaces 110 of the related technique in that, as shown in FIG. 11A, the spaces 110a are arranged in the first direction (vertical direction in FIG. 11A) at the same pitch P1 (e.g., 80 nm) and are extended in the second direction (horizontal direction in FIG. 11A) different from the first direction. However, while each space 110 is of a rectangular shape with a single width, each space 110a has three portions with different widths. Specifically, the space 110a has a first portion 121 having a first width X1 and second and third portions 122 and 123 each having a second width X2 smaller than the first width X1. The second portion 122 and the third portion 123 are located on both sides of the first portion 121 to sandwich the first portion 121 between second portion 122 and the third portion 123. The first width X1 of the first portion 121 can be determined to be, for example, 60 nm, and the second width X2 of the second and third portions 122 and 123 can be determined to be, for example, 40 nm. It is preferable that the second width X2 be determined to be equal to or larger than ½ and equal to or smaller than ⅔ of the first width X1.

Figure 12A:
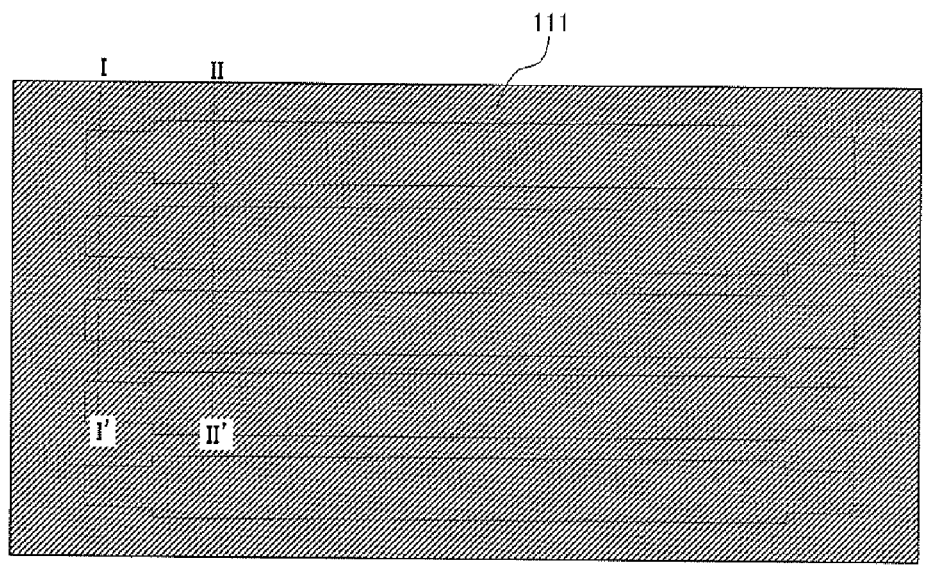
FIG. 12A is a plan view for explaining a process following the process depicted in FIGS. 11A to 11C.
Figure 12B:
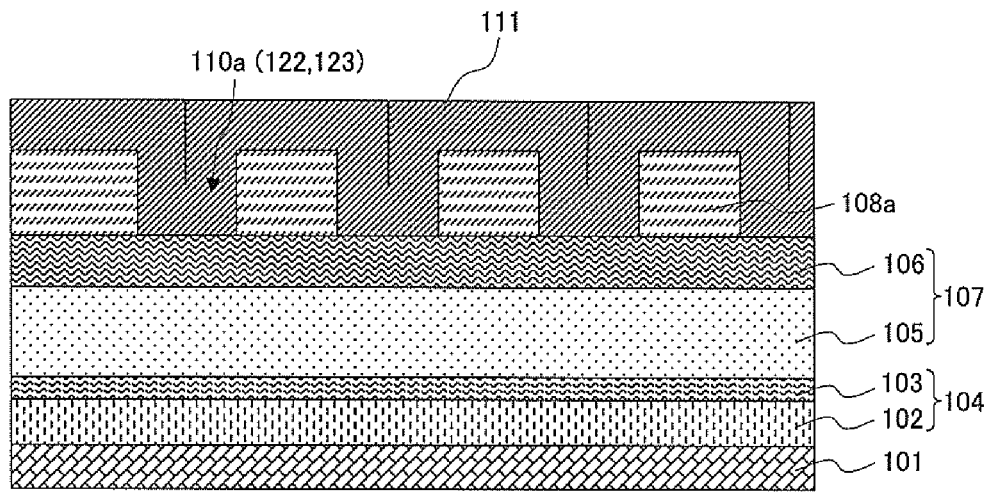
FIG. 12B is a sectional view along a I-I' line of FIG. 12A.
Figure 12C:
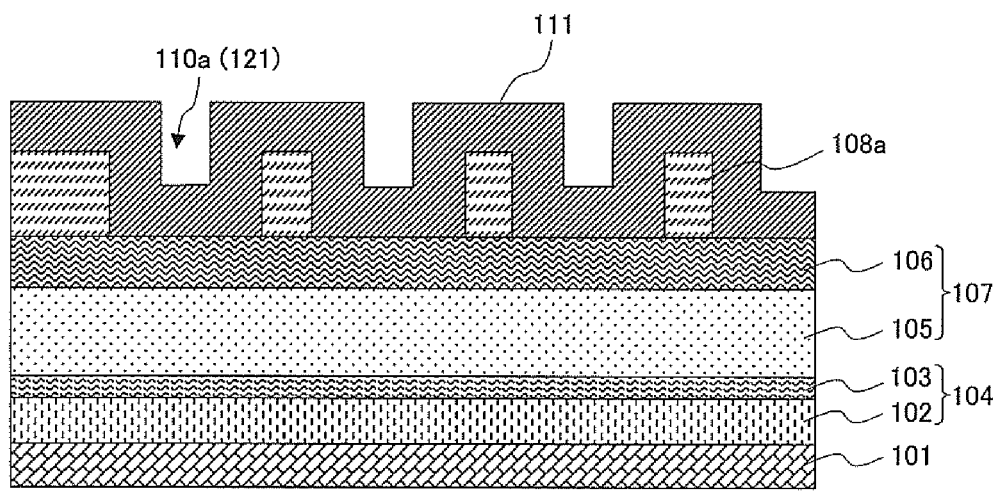
FIG. 12C is a sectional view along a II-II' line of FIG. 12A.

Subsequently, as shown in FIGS. 12A, 12B, and 12C, the MLD oxide film 111 is formed such that the MLD oxide film 111 covers the upper surface of the first organic film pattern 108a as well as the side walls and bottoms of the spaces 110a. The thickness of the MLD oxide film 111 is determined to be a thickness with which the MLD oxide film 111 completely fills up the second and third portions 122 and 123 of the spaces 110a but leaves spaces on the first portions 121. When the widths X1 and X2 of the space 110a are determined in the above manner, the thickness of the MLD oxide film 111 can be determined to be 20 nm. When the MLD oxide film 111 of 20 nm in thickness is formed, the spaces 110a of the first organic film pattern 108a are filled with the MLD oxide film 111 such that the second and third portions 122 and 133 are filled up completely while only the bottom side of first portions 121 that is closer to the first mask layer 107 is filled partially.

Figure 13A:
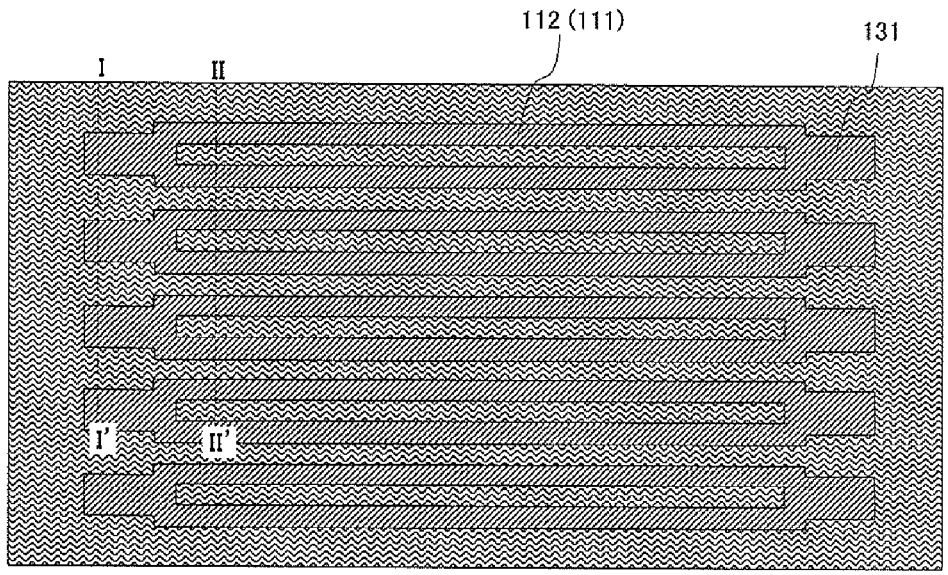
FIG. 13A is a plan view for explaining a process following the process depicted in FIGS. 12A to 12C.
Figure 13B:
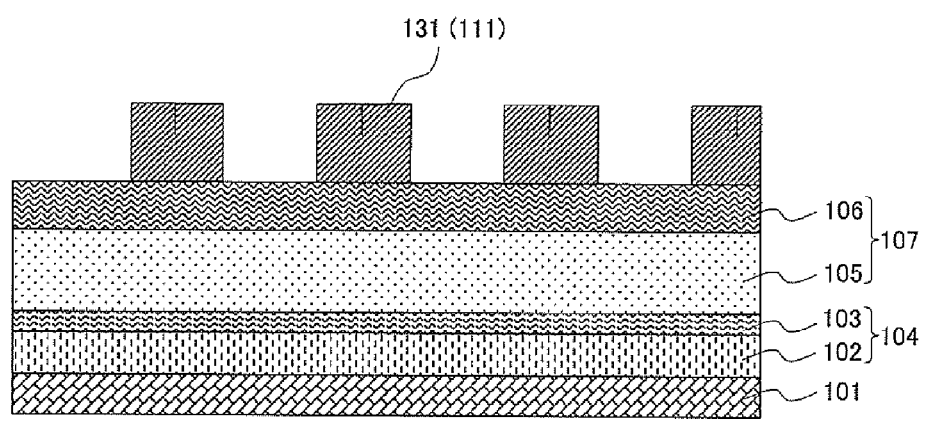
FIG. 13B is a sectional view along a I-I' line of FIG. 13A.
Figure 13C:
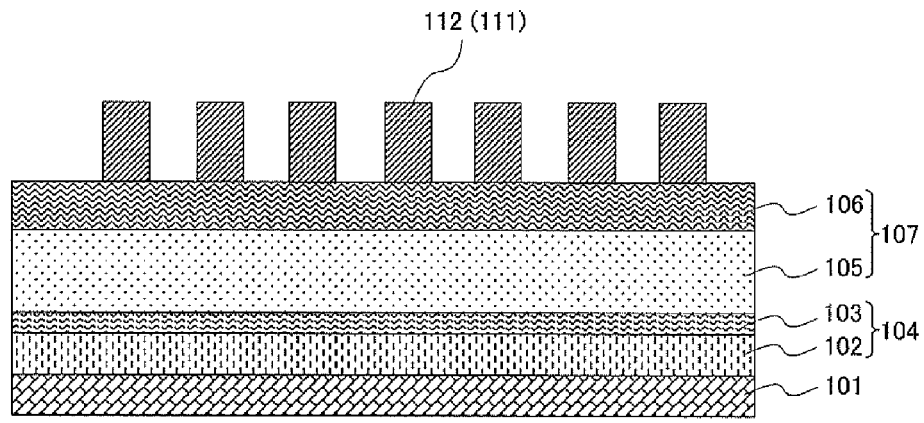
FIG. 13C is a sectional view along a II-II' line of FIG. 13A.

Subsequently, as shown in FIGS. 13A, 13B, and 13C, the MLD oxide film 111 is etched (etched back) selectively through the same process as the process of the related technique, after which the first organic film pattern 108a is eliminated.

FIG. 13A demonstrates that in the area of the first portions 121 of the spaces 110a of the first organic film pattern 108a, the rectangular-frame-shaped side walls 112 are formed. Hereinafter, a pair of short sides of each side wall 112 may be referred to as first and second side walls and a pair of long sides of each side wall 112 may be referred to as third and fourth side walls.

The third and fourth side walls make up a line-and-space pattern, and have a width depending on the thickness of the MLD oxide film 111. The width of the third and fourth side walls (line width) is substantially equal to the width of the MLD oxide film 111, which is, for example, 20 nm.

The MLD oxide film 111 remains in the area of the second and third portions 122 and 123 of the spaces 110a of the first organic film pattern 108a, where the remaining MLD oxide film 111 forms tab portions 131 and the first mask layer 107 is not exposed. The tab portions 131 are continuous with the first and second walls.

Figure 14A:
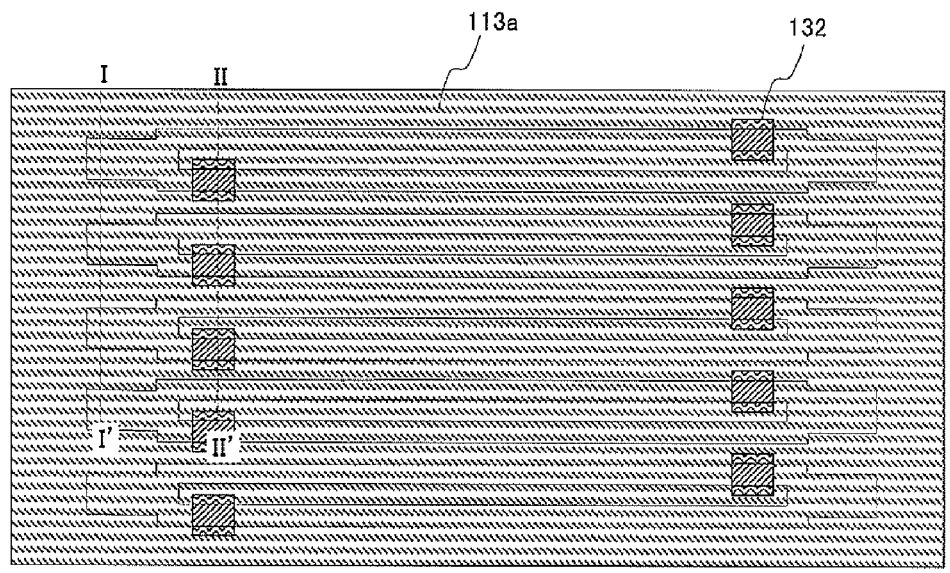
FIG. 14A is a plan view for explaining a process following the process depicted in FIGS. 13A to 13C.
Figure 14B:
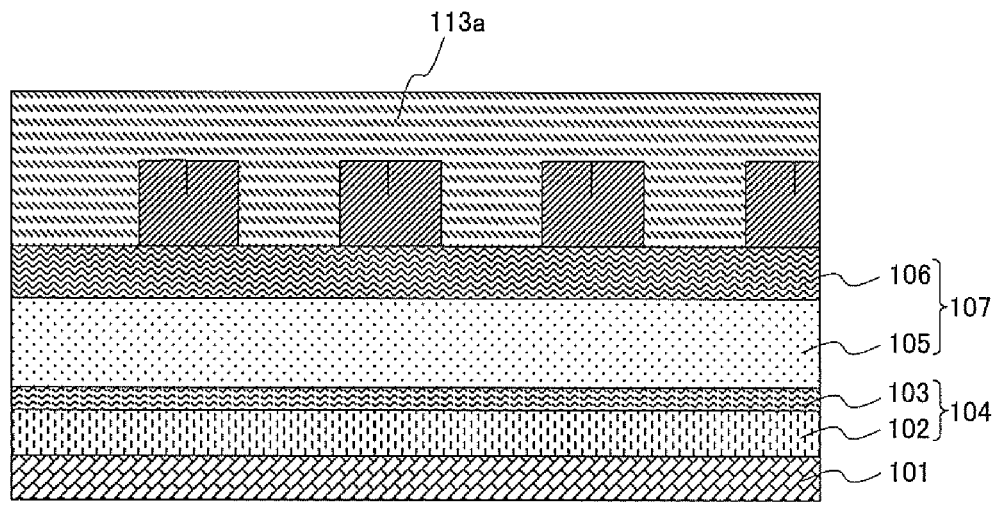
FIG. 14B is a sectional view along a I-I' line of FIG. 14A.
Figure 14C:
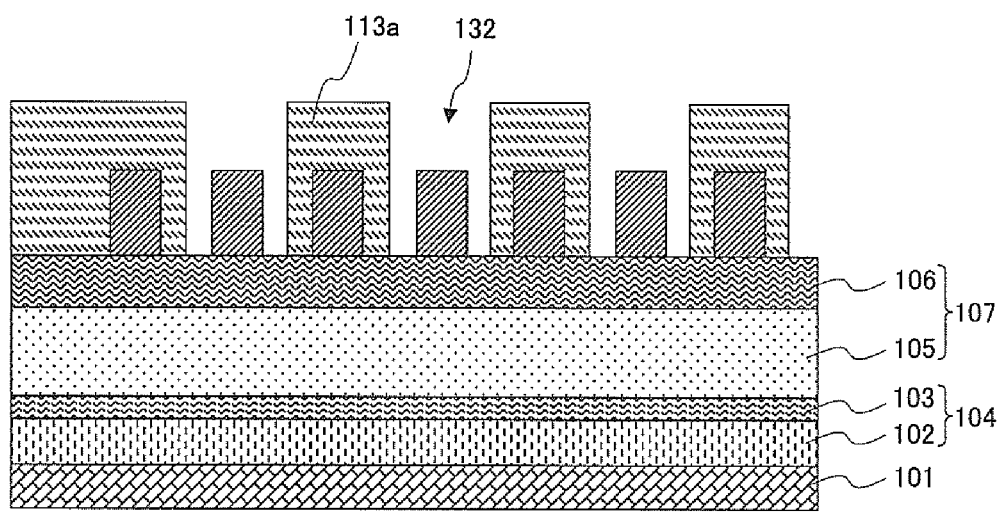
FIG. 14C is a sectional view along a II-II' line of FIG. 14A.
Figure 15A:
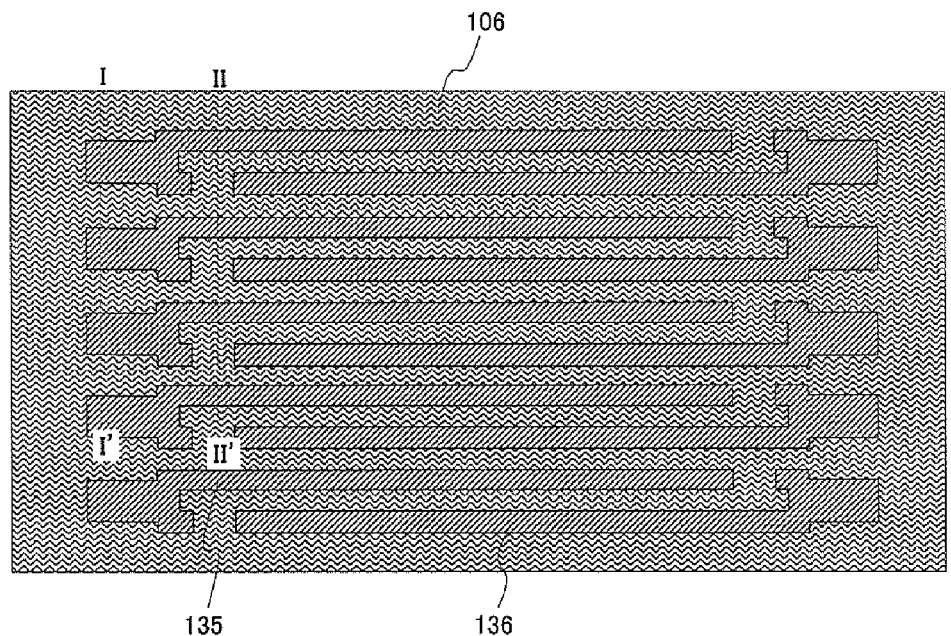
FIG. 15A is a plan view for explaining a process following the process depicted in FIGS. 14A to 14C.
Figure 15B:
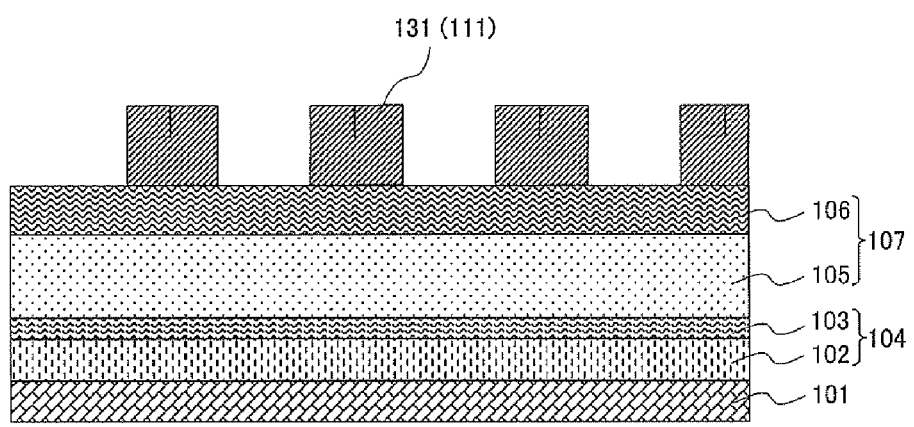
FIG. 15B is a sectional view along a I-I' line of FIG. 15A.
Figure 15C:
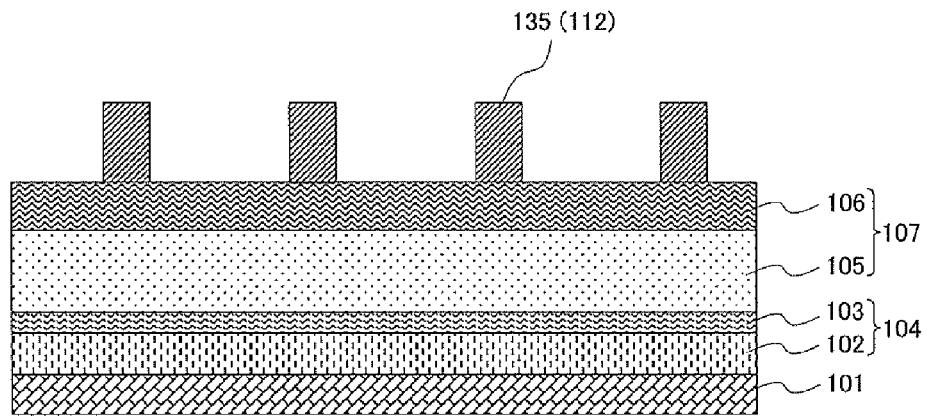
FIG. 15C is a sectional view along a II-II' line of FIG. 15A.
Figure 16A:
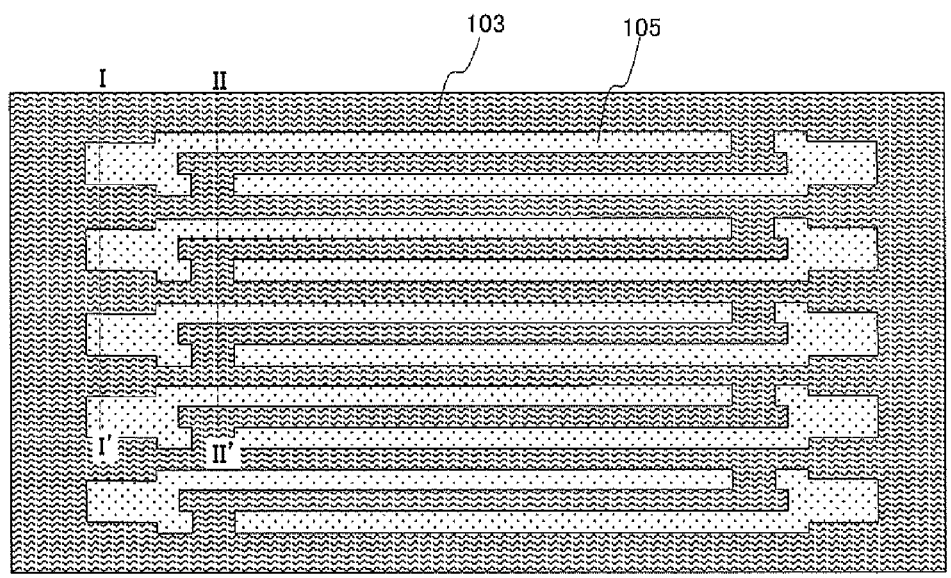
FIG. 16A is a plan view for explaining a process following the process depicted in FIGS. 15A to 15C.
Figure 16B:
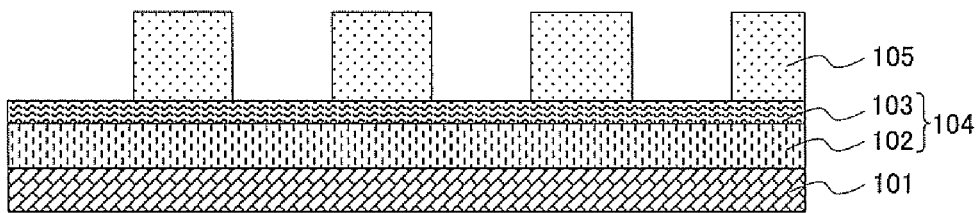
FIG. 16B is a sectional view along a I-I' line of FIG. 16A.
Figure 16C:
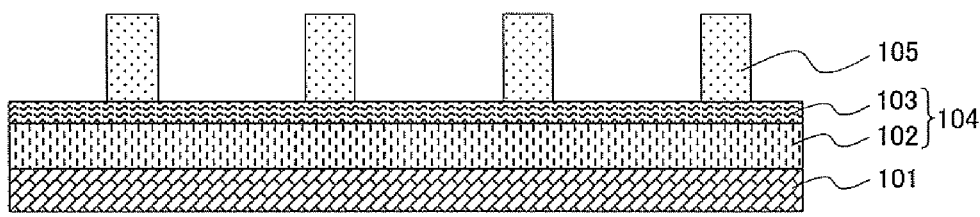
FIG. 16C is a sectional view along a II-II' line of FIG. 16A.

Subsequently, an organic film is so formed on the first mask layer 107 that the organic film covers the side walls 112 and the tab portions 131. As a result, as shown in FIGS. 14A, 14B, and 14C, a second organic film pattern 113a is formed. Multiple openings 132 are formed in the second organic film pattern 113a.

The multiple openings 132 are so formed as to expose part of the long sides (third and fourth side walls) of the side walls 112. On each third side wall, its part closer to the area of the second portion 122 of the space 110a is exposed in the opening 132. On each fourth wall, its part closer to the area of the third portion 123 of the space 110a is exposed in the opening 132.

An ArF resist can be used as the organic film making up the second organic film pattern 113a. Following the formation of the ArF resist, the openings 132 are formed by carrying out exposure and development processes using an ordinary (non-liquid-immersion) ArF exposure apparatus. Each opening 132 can be formed as a 50 nm by 50 nm square. The relative smallness of the opening 132 may lead to the creation of a resist residue after the development process. To prevent the creation of the resist residue, it is preferable to carry out overexposure with an exposure rate 1.5 times or more the optimum exposure rate of exposure on a flat pattern.

Subsequently, dry etching mainly using a C×Fy-based gas, such as $CF_4$ gas and $C_2F_4$ gas, is carried out, using the second organic film pattern 113a as a mask, to eliminate the MLD oxide film 111 exposed in the openings 132. As a result, each of the third and fourth side walls is divided into two portions. Then, the second organic film pattern 113a is eliminated, using an acidic removal agent ($H_2SO_4+H_2O_2+H_2O$). Hence a processed state depicted in FIGS. 15A, 15B, and 15C results.

The parts of MLD oxide film 111 that are exposed in the openings 132 are referred to as first side wall portions and second side wall portions. As a result of removal of the first side wall portion and second side wall portion from each rectangular-frame-shaped side wall 112, therefore, the rectangular-frame-shaped side wall 112 is divided into a third side wall portion 135 and a fourth side wall portion 136. The third side wall portion 135 includes the first side wall, the major part of the third side wall, and a part of the fourth side wall. The fourth side wall portion 136 includes the second side wall, a part of the third side wall, and the major part of the fourth side wall.

Figure 17A:
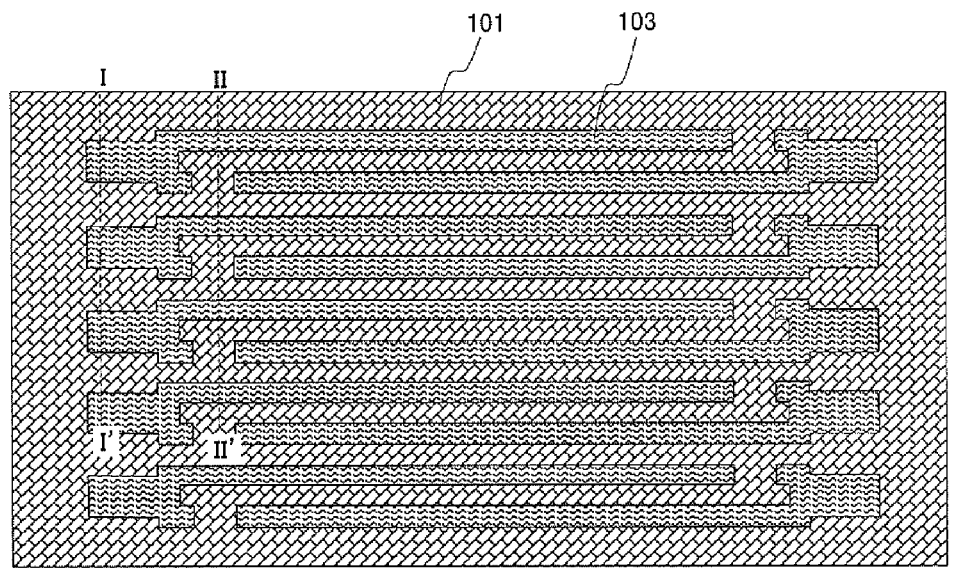
FIG. 17A is a plan view for explaining a process following the process depicted in FIGS. 16A to 16C.
Figure 17B:
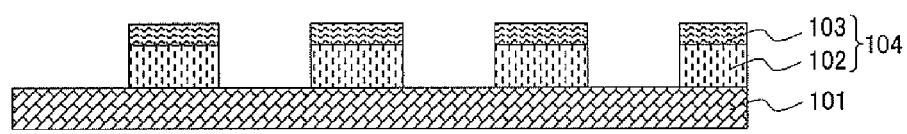
FIG. 17B is a sectional view along a I-I' line of FIG. 17A.
Figure 17C:
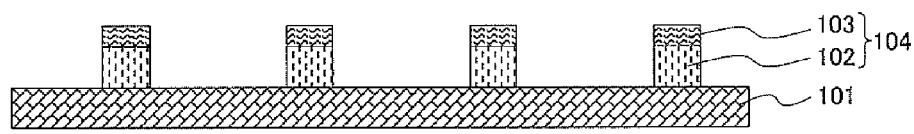
FIG. 17C is a sectional view along a II-II' line of FIG. 17A.

Subsequently, the same process as the process of the related technique follows, that is, the silicon nitride film 106 and the amorphous carbon film 105 are etched selectively (FIGS. 16A, 16B, and 16C) and then the cap insulating film 103 and the interconnect conductive film 102 are etched selectively (FIGS. 17A, 17B, and 17C). Hence a pattern of the etching base material 104 having the same pattern as the line-and-space interconnect pattern formed by the related technique is formed.

Figure 18A:
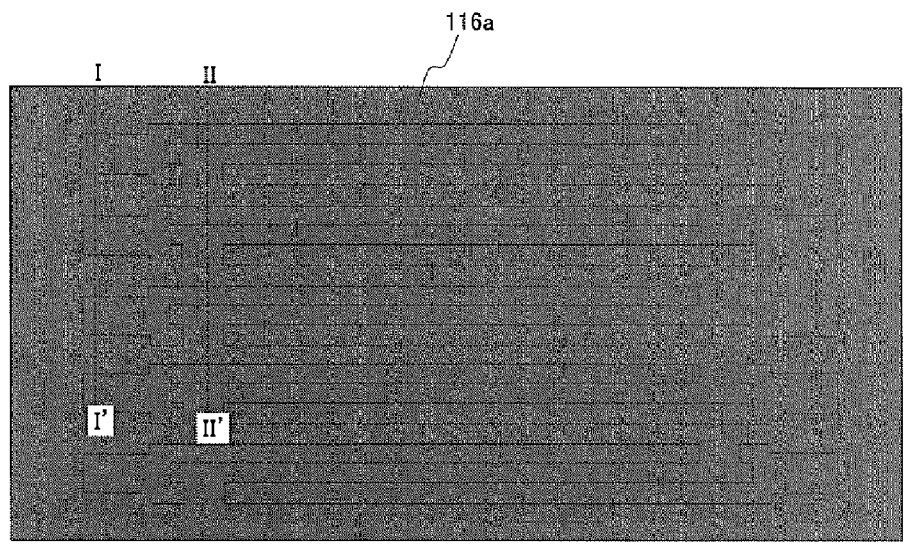
FIG. 18A is a plan view for explaining a process following the process depicted in FIGS. 17A to 17C.
Figure 18B:
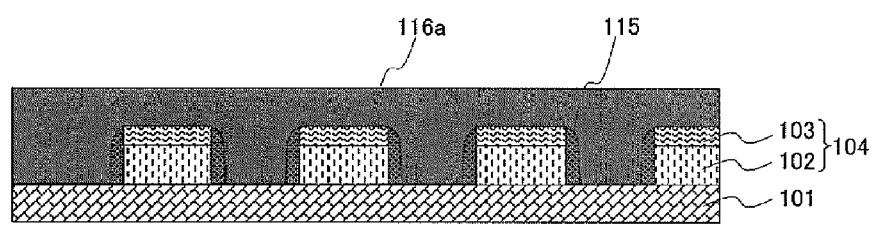
FIG. 18B is a sectional view along a I-I' line of FIG. 18A.
Figure 18C:
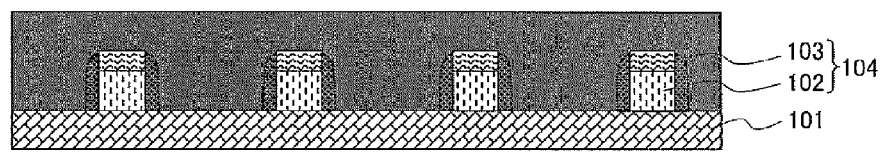
FIG. 18C is a sectional view along a II-II' line of FIG. 18A.
Figure 19A:
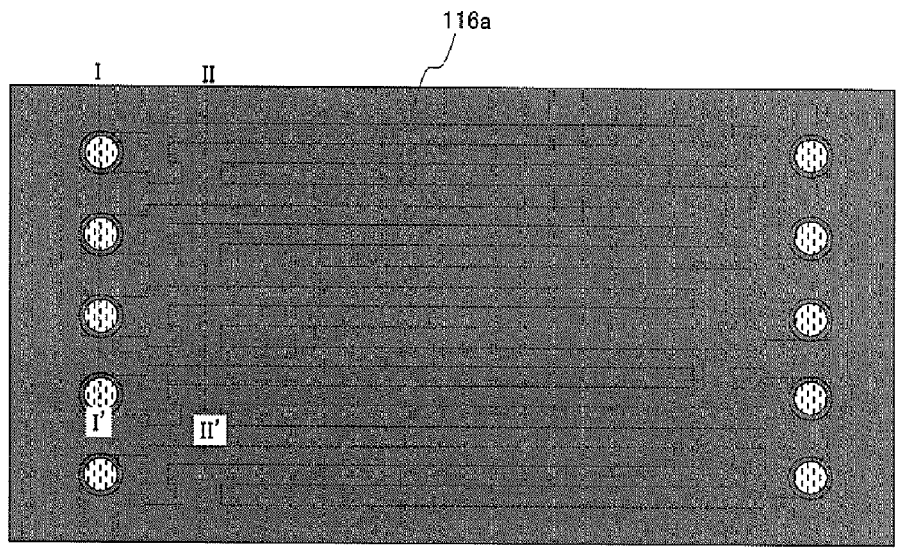
FIG. 19A is a plan view for explaining a process following the process depicted in FIGS. 18A to 18C.
Figure 19B:
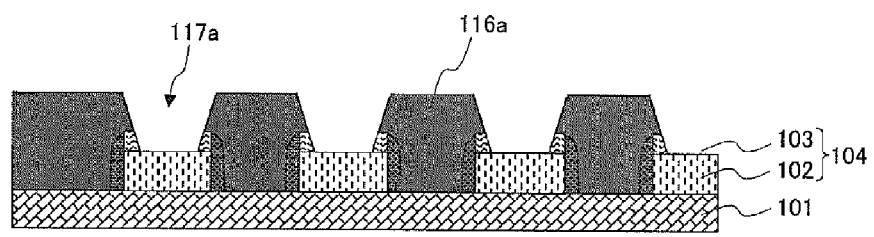
FIG. 19B is a sectional view along a I-I' line of FIG. 19A.
Figure 19C:
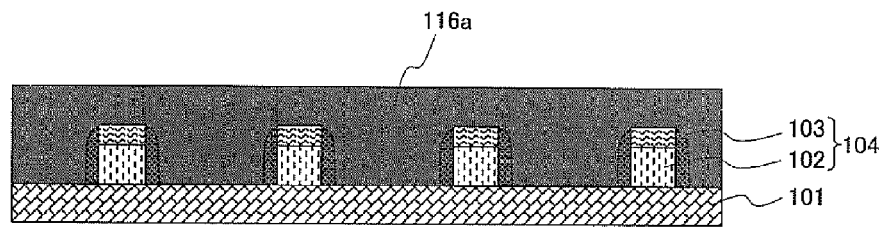
FIG. 19C is a sectional view along a II-II' line of FIG. 19A.

Subsequently, the same process as the process of the related technique follows, that is, the side wall nitride film 115 is formed and then the inter-layer insulating film 116a is formed (FIGS. 18A, 18B, and 18C).

Then, contact holes 117a are formed in the inter-layer insulating film 116a. Through the same process as the process of the related technique, part of the inter-layer insulating film 116a and cap insulating film 103 is eliminated by etching to form the contact holes 117a such that the interconnect conductive film 102 is exposed at the bottoms of the contact holes 117a.

The positions of formation of the contact holes 117a are determined to be the positions corresponding to the tab portions 131 of the MLD oxide film 111 (the tab portions 131 corresponding to the second and third portions 122 and 123 of the spaces 110a). Each tab portion 131 has a first direction width larger than (e.g., 2 times as large as) the first direction width of each long side of the side wall 112. This size relation applies also to the interconnect conductive film 102. When the contact hole 117a is formed at the position corresponding to the tab portion 131, therefore, the bottom diameter of the contact hole 117a can be determined to be equal to or larger than the width of the interconnect conductive film 102 at the position corresponding to the long side of the side wall 112. This means that connection resistance between a contact plug formed in the contact hole and an interconnect can be reduced more than the case of connection resistance reduction by the related technique.

In addition, because an alignment accuracy margin is increased, an increase in connection resistance between the contact plug and the interconnect conductive film 102 due to improper alignment and leakage between the contact plug and the substrate caused by etching of the substrate film can be avoided.

According to this embodiment, compared to the related technique, the line-and-space pattern interconnect of the minimum processed dimensions can be formed without increasing the number of processes.

A second embodiment of the present invention will then be described, referring to FIGS. 20A to 28C.

Figure 20A:
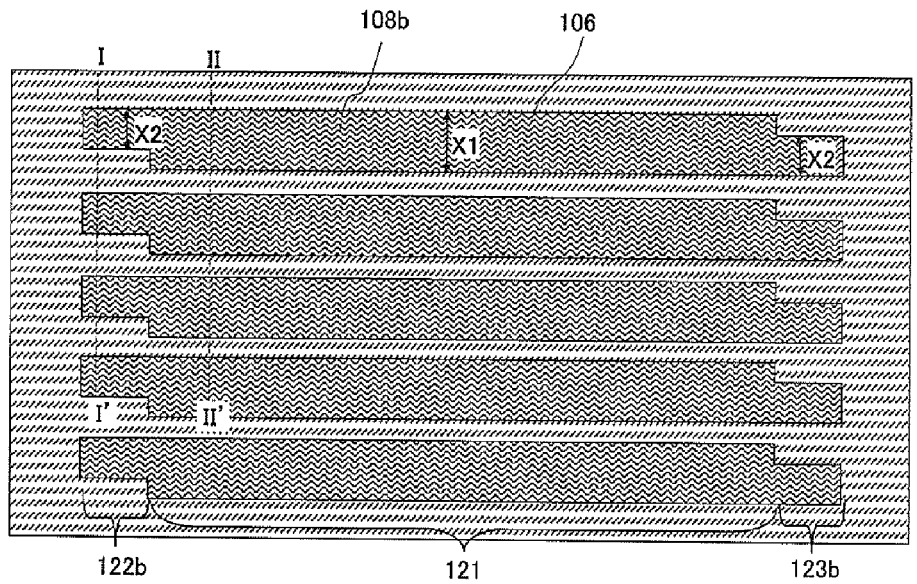
FIG. 20A is a plan view for explaining a manufacturing method for a semiconductor device according to a second embodiment of the present invention.
Figure 20B:
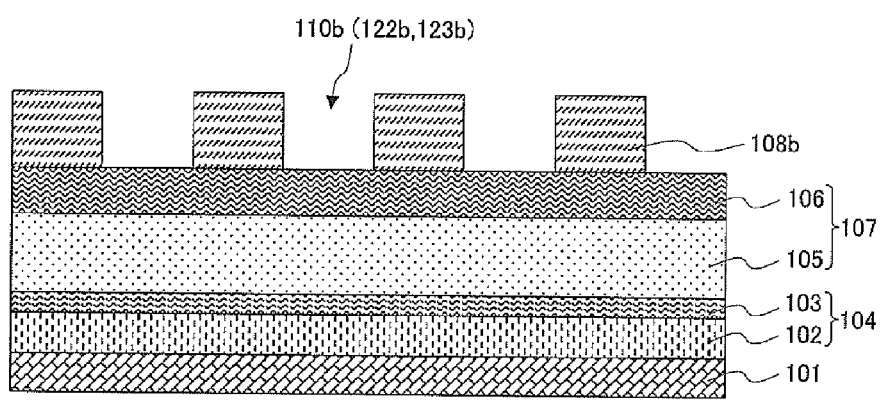
FIG. 20B is a sectional view along a I-I' line of FIG. 20.
Figure 20C:
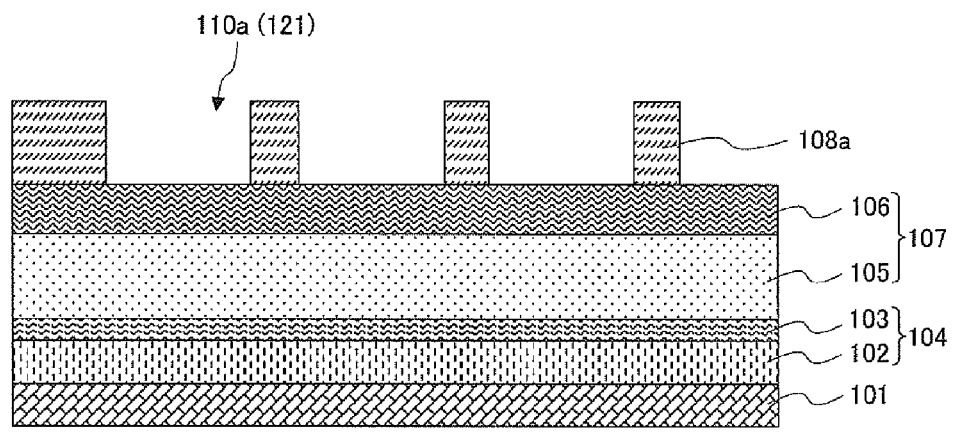
FIG. 20C is a sectional view along a II-II' line of FIG. 20A.
Figure 21A:
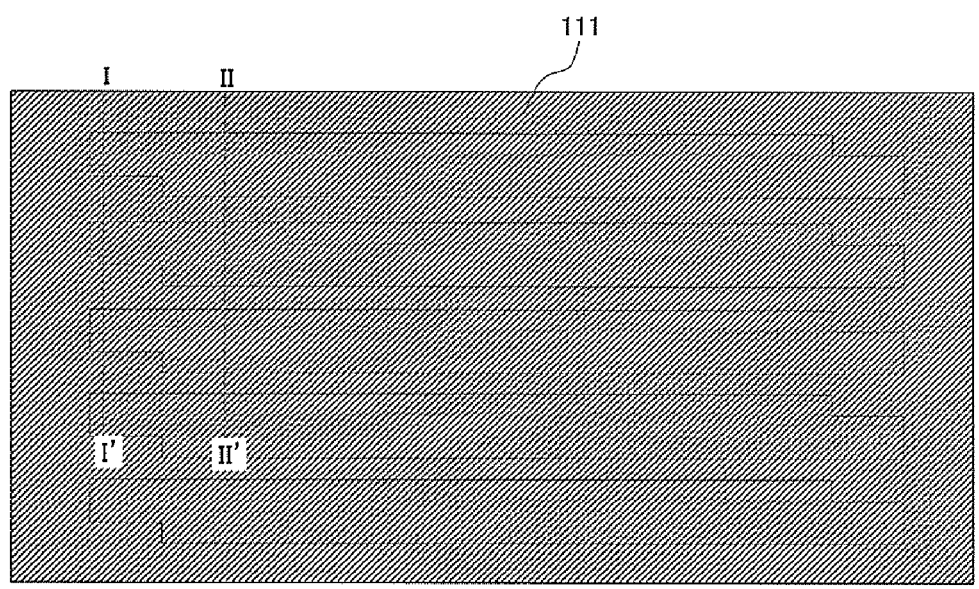
FIG. 21A is a plan view for explaining a process following the process depicted in FIGS. 20A to 20C.
Figure 21B:
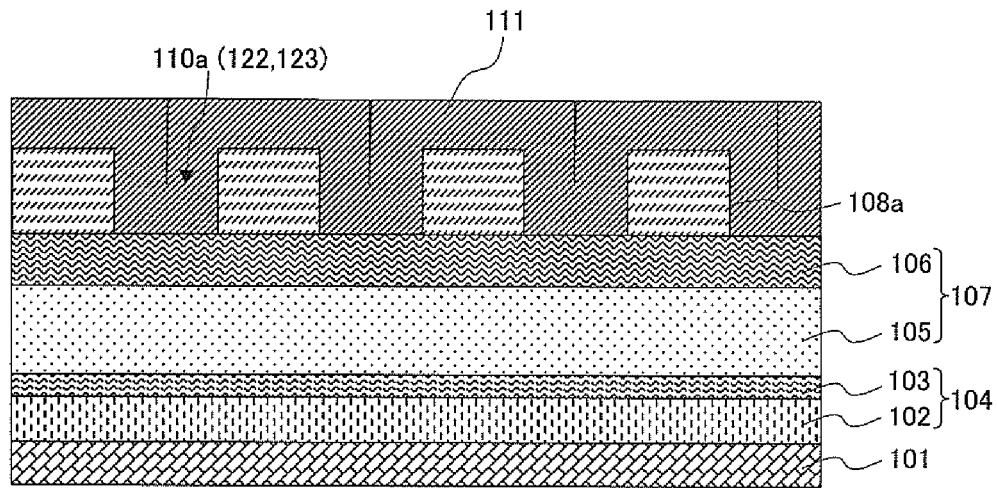
FIG. 21B is a sectional view along a I-I' line of FIG. 20A.
Figure 21C:
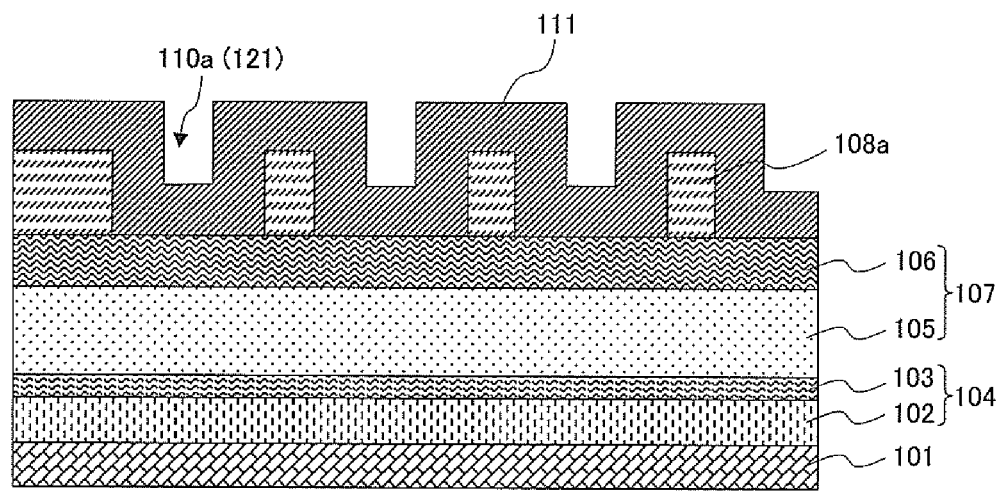
FIG. 21C is a sectional view along a II-II' line of FIG. 20A.
Figure 22A:
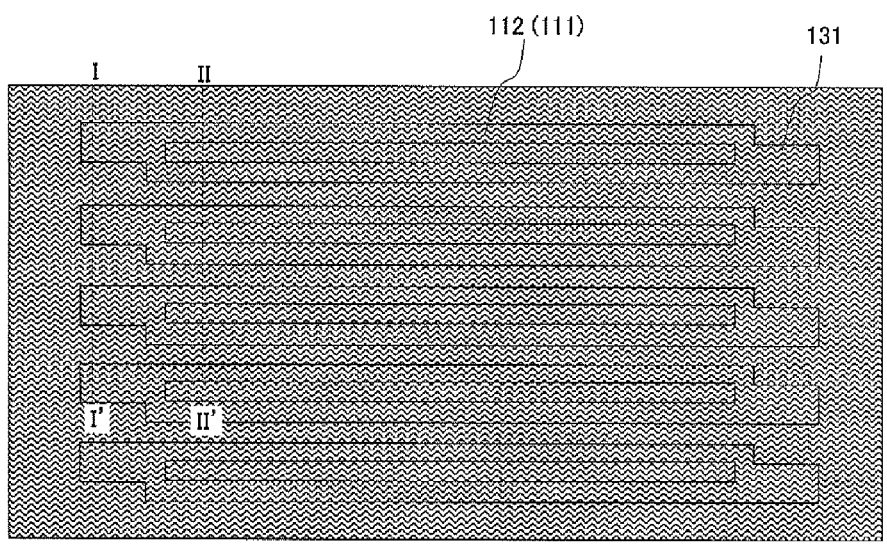
FIG. 22A is a plan view for explaining a process following the process depicted in FIGS. 21A to 21C.
Figure 22B:
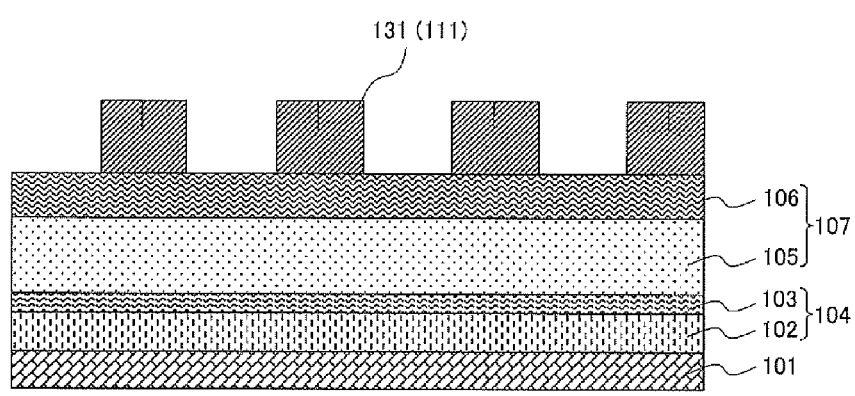
FIG. 22B is a sectional view along a I-I' line of FIG. 22A.
Figure 22C:
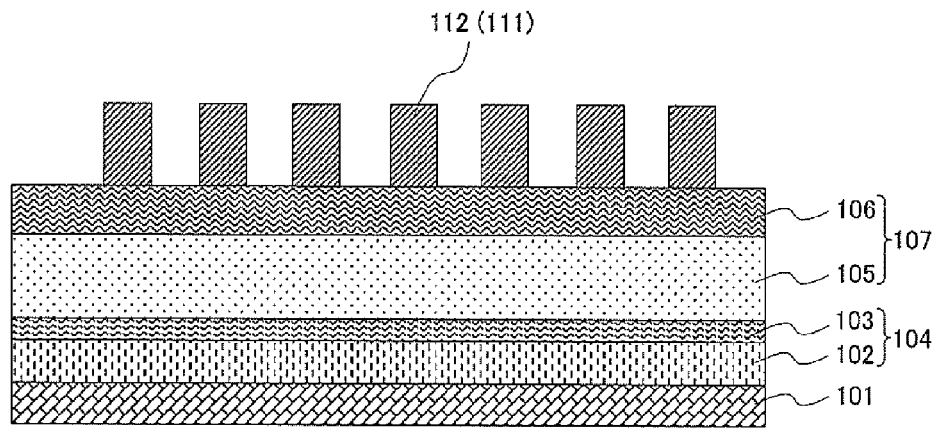
FIG. 22C is a sectional view along a II-II' line of FIG. 22A.
Figure 23A:
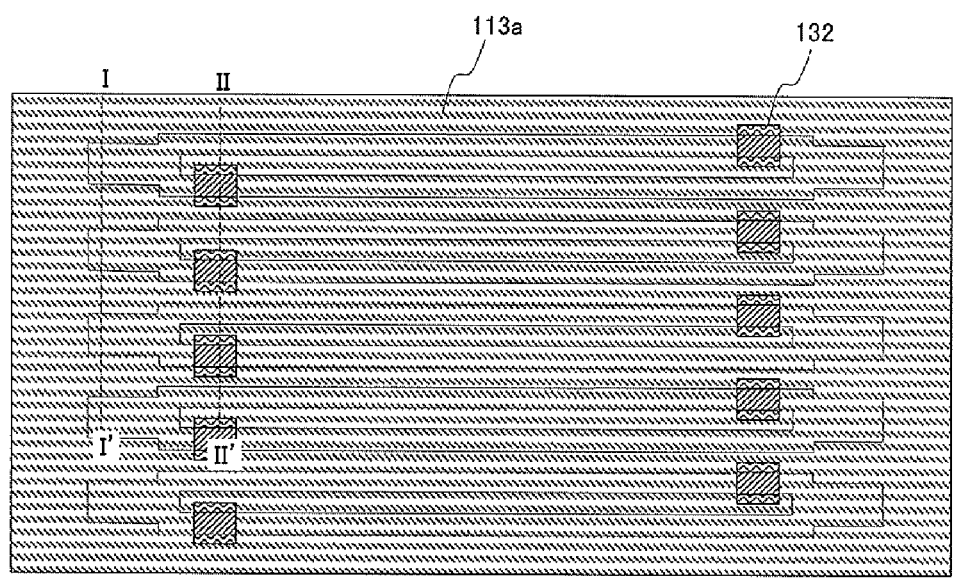
FIG. 23A is a plan view for explaining a process following the process depicted in FIGS. 22A to 22C.
Figure 23B:
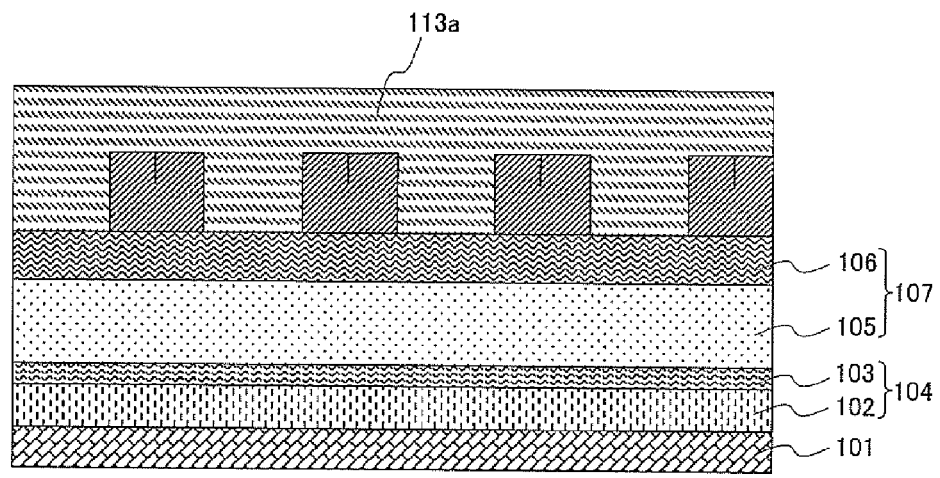
FIG. 23B is a sectional view along a I-I' line of FIG. 23A.
Figure 23C:
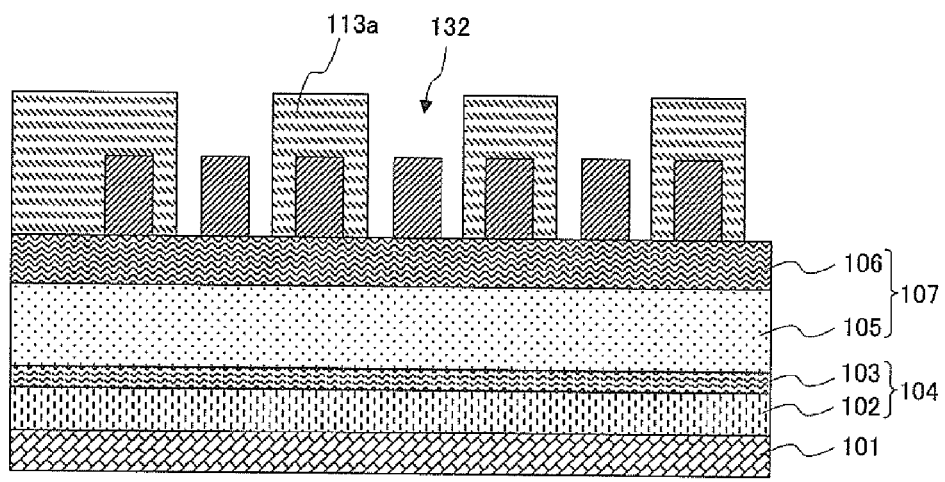
FIG. 23C is a sectional view along a II-II' line of FIG. 23A.
Figure 24A:
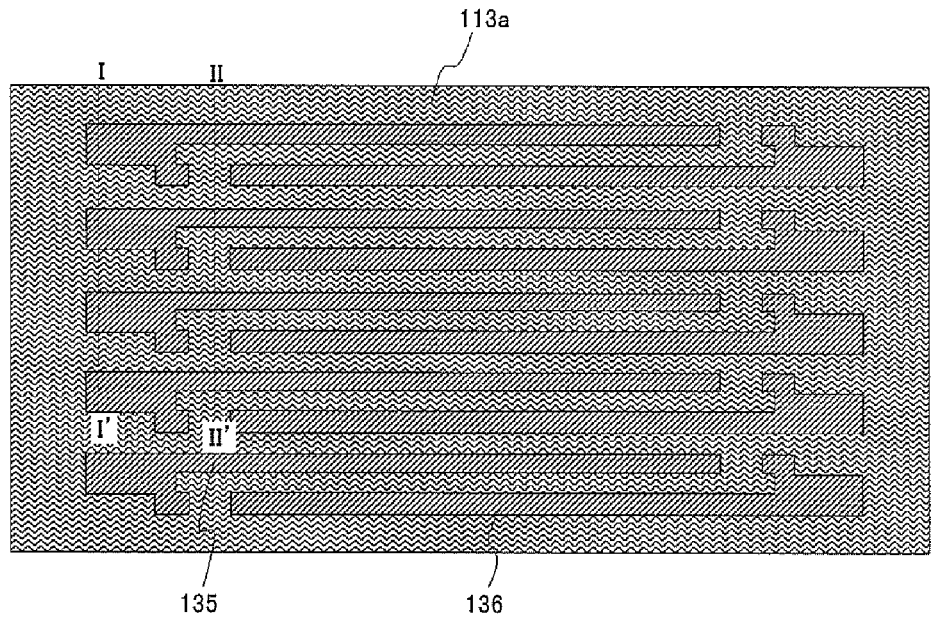
FIG. 24A is a plan view for explaining a process following the process depicted in FIGS. 23A to 23C.
Figure 24B:
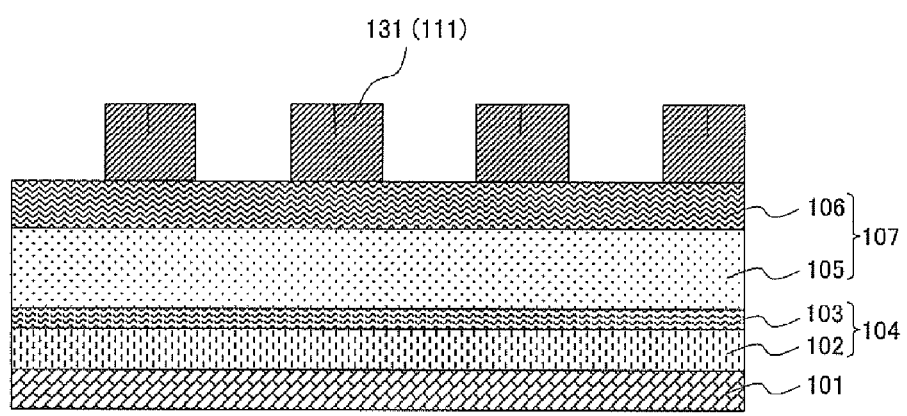
FIG. 24B is a sectional view along a I-I' line of FIG. 24A.
Figure 24C:
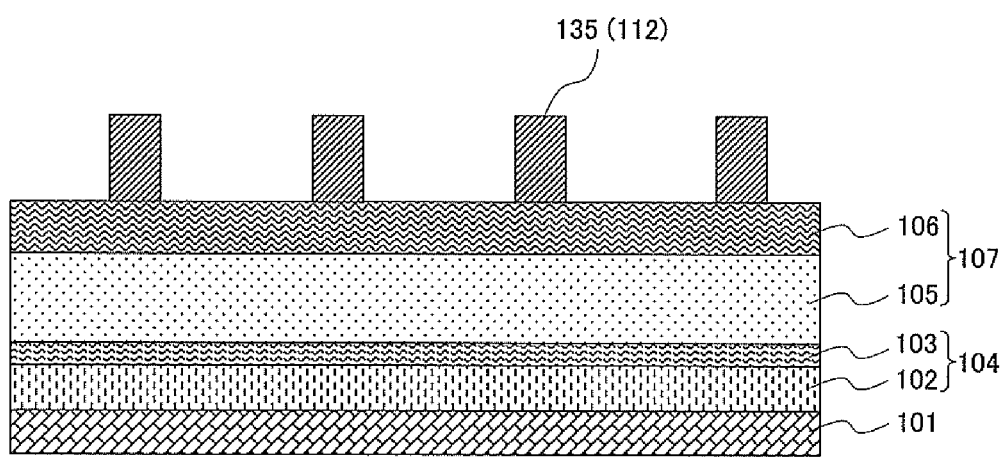
FIG. 24C is a sectional view along a II-II' line of FIG. 24A.
Figure 25A:
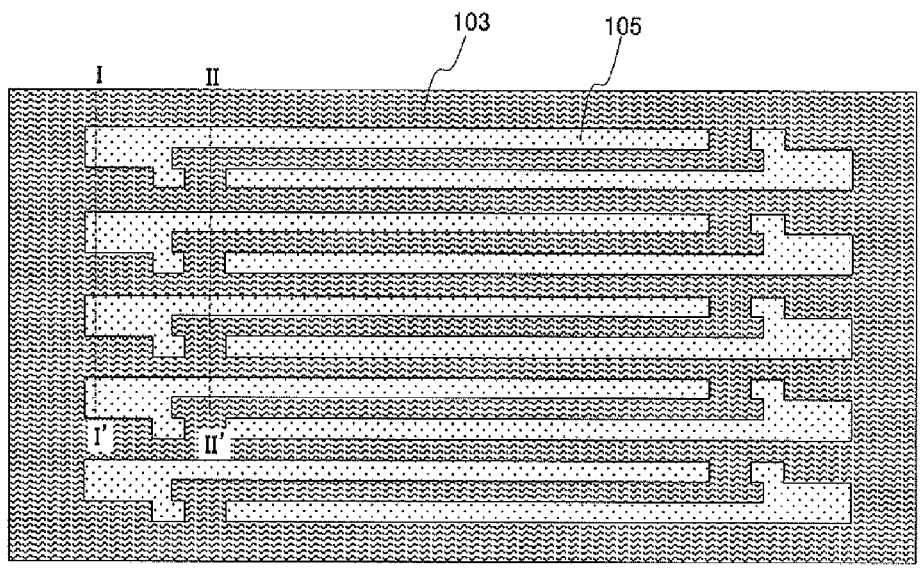
FIG. 25A is a plan view for explaining a process following the process depicted in FIGS. 24A to 24C.
Figure 25B:
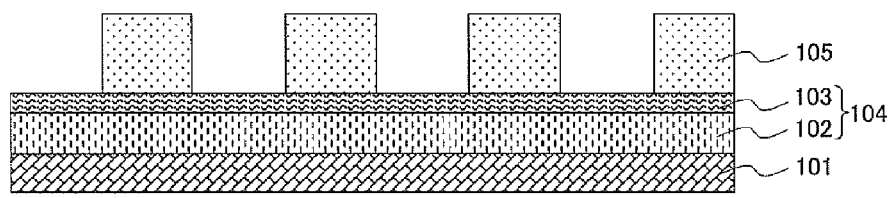
FIG. 25B is a sectional view along a I-I' line of FIG. 25A.
Figure 25C:
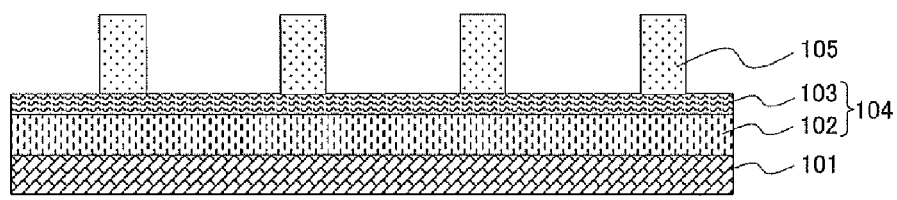
FIG. 25C is a sectional view along a II-II' line of FIG. 25A.
Figure 26A:
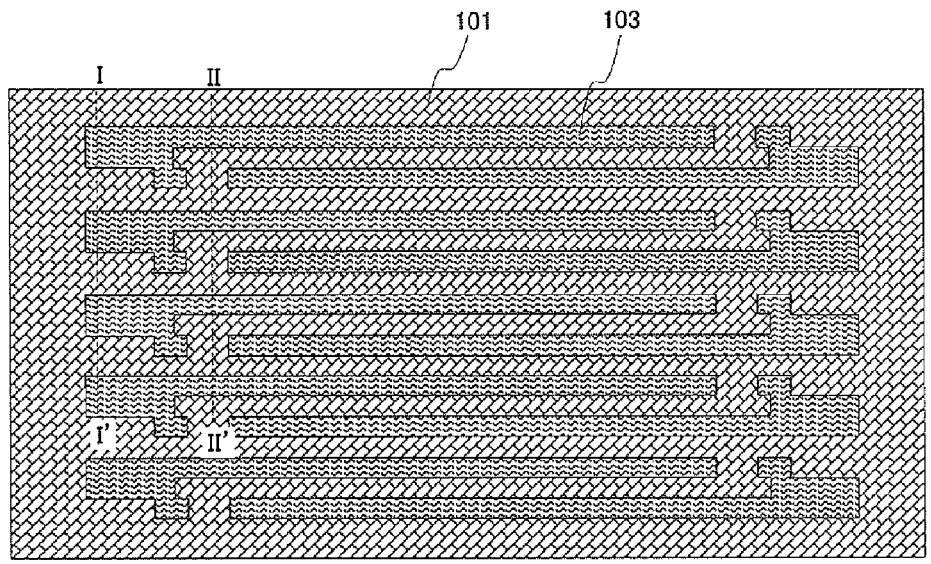
FIG. 26A is a plan view for explaining a process following the process depicted in FIGS. 25A to 25C.
Figure 26B:
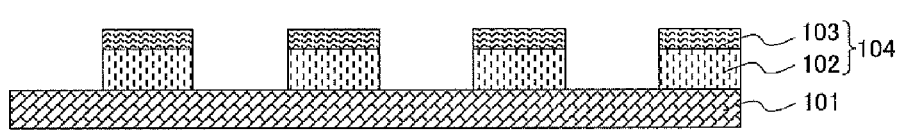
FIG. 26B is a sectional view along a I-I' line of FIG. 26A.
Figure 26C:
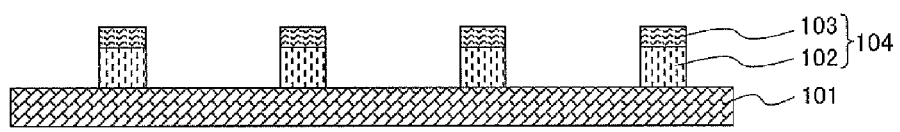
FIG. 26C is a sectional view along a II-II' line of FIG. 26A.
Figure 27A:
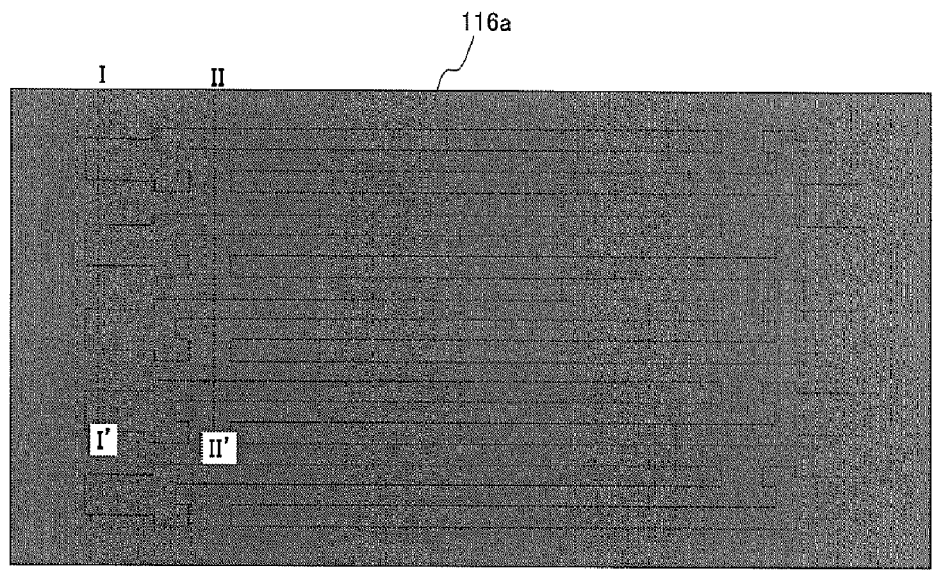
FIG. 27A is a plan view for explaining a process following the process depicted in FIGS. 26A to 26C.
Figure 27B:
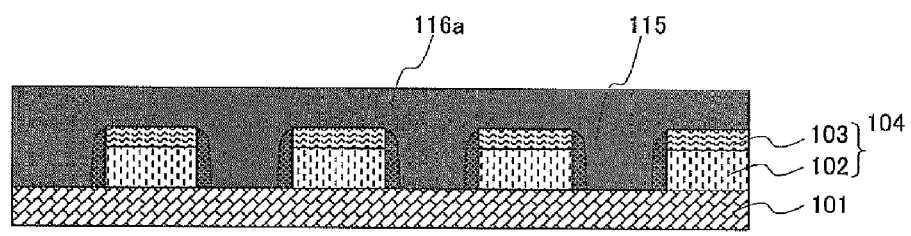
FIG. 27B is a sectional view along a I-I' line of FIG. 27A.
Figure 27C:
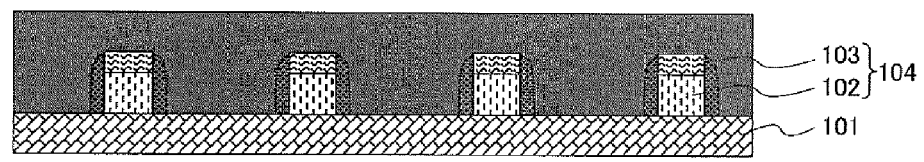
FIG. 27C is a sectional view along a II-II' line of FIG. 27A.
Figure 28A:
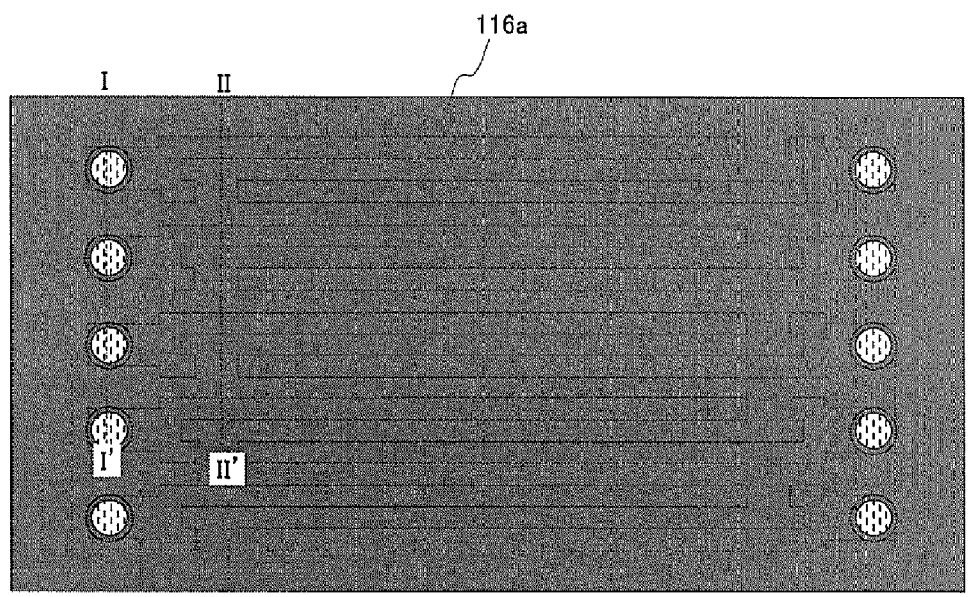
FIG. 28A is a plan view for explaining a process following the process depicted in FIGS. 27A to 27C.
Figure 28B:
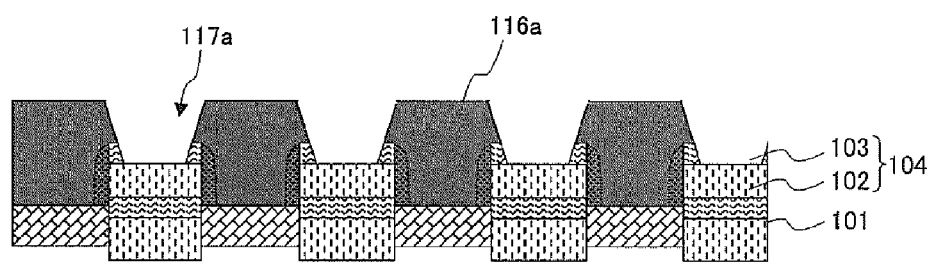
FIG. 28B is a sectional view along a I-I' line of FIG. 28A.
Figure 28C:
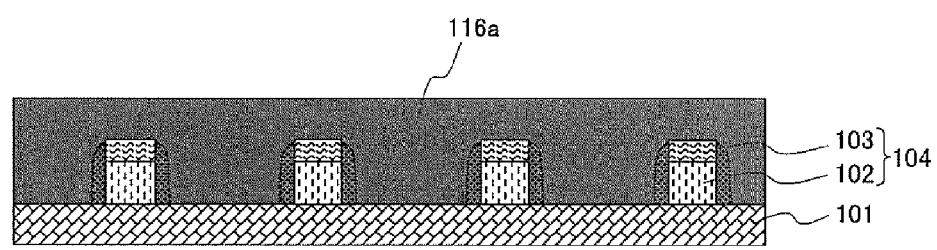
FIG. 28C is a sectional view along a II-II' line of FIG. 28A.

It is understood by observing FIG. 20A that according to this embodiment, the plane shape of spaces 110b of a first organic film pattern 108b is different from the plane shape of the spaces 110a of the first organic film pattern 108a of the first embodiment.

The spaces 110b of this embodiment are arranged repeatedly at the same pitch (e.g., 80 nm) in a first direction (vertical direction in FIG. 20A). Each space 110b has the first portion 121 having the first width X1 (e.g., 60 nm) and second and third portions 122b and 123b each having the second width X2 (e.g., 40 nm) smaller than the first width X1. The second portion 122b and the third portion 123b are located on both sides of the first portion 121 to sandwich the first portion 121 between the second portion 122b and the third portion 123b. The space 110b as a whole extends in the second direction. Similar to the first embodiment, the second width X2 should preferably be equal to or larger than ½ and equal to or smaller than ⅔ of the first width X1.

According to this embodiment, one of a pair of long sides of the first portion 121 is continuous linearly with one of a pair of long sides of the second portion 122b, and the other of the pair of long sides of the first portion 121 is continuous linearly with one of a pair of long sides of the third portion 123b. In other words, one of a pair of side walls equivalent to the long sides of the first portion 121 is flush with one of the side walls of the second portion 122b, and the other of the pair of side walls equivalent to the long sides of the first portion 121 is flush with one of the side walls of the third portion 123b. Hence the second portion 122b and the third portion 123b are located diagonal to each other across the first portion 121.

SECOND EMBODIMENT

This embodiment is the same as the first embodiment except that the shape of the first organic film pattern 108a of the first embodiment is different from the shape of the first organic film pattern 108b of the second embodiment. For this reason, the processes up to the formation of the contact holes 117a are depicted in FIGS. 20A to 28C and are not described further.

THIRD EMBODIMENT

A third embodiment will then be described, referring to FIGS. 29 to 44F.

A semiconductor device to which this embodiment applies will first be described. As an example of the semiconductor device, a DRAM (Dynamic Random Access Memory) will be described.

Figure 29:
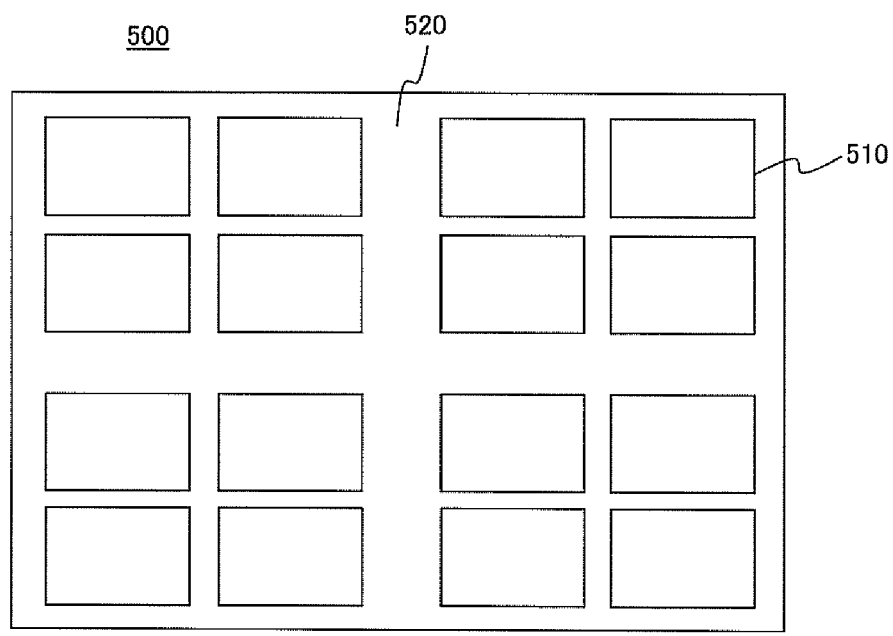
FIG. 29 is a block diagram schematically showing a configuration of a semiconductor device according to a third embodiment of the present invention.

FIG. 29 is a block diagram schematically showing a configuration of a semiconductor device (DRAM) 500. As shown in FIG. 29, the semiconductor device 500 includes arrays of (16) memory cell regions 510, and peripheral circuit regions 520 surrounding the memory cell regions 510. In each memory cell region 510, multiple memory cells including MOS (Metal Oxide Semiconductor) transistors and capacitors are formed. In the peripheral circuit region 520, circuits that perform control over access to the memory cells and over input/output to/from external circuits are formed.

Figure 30A:
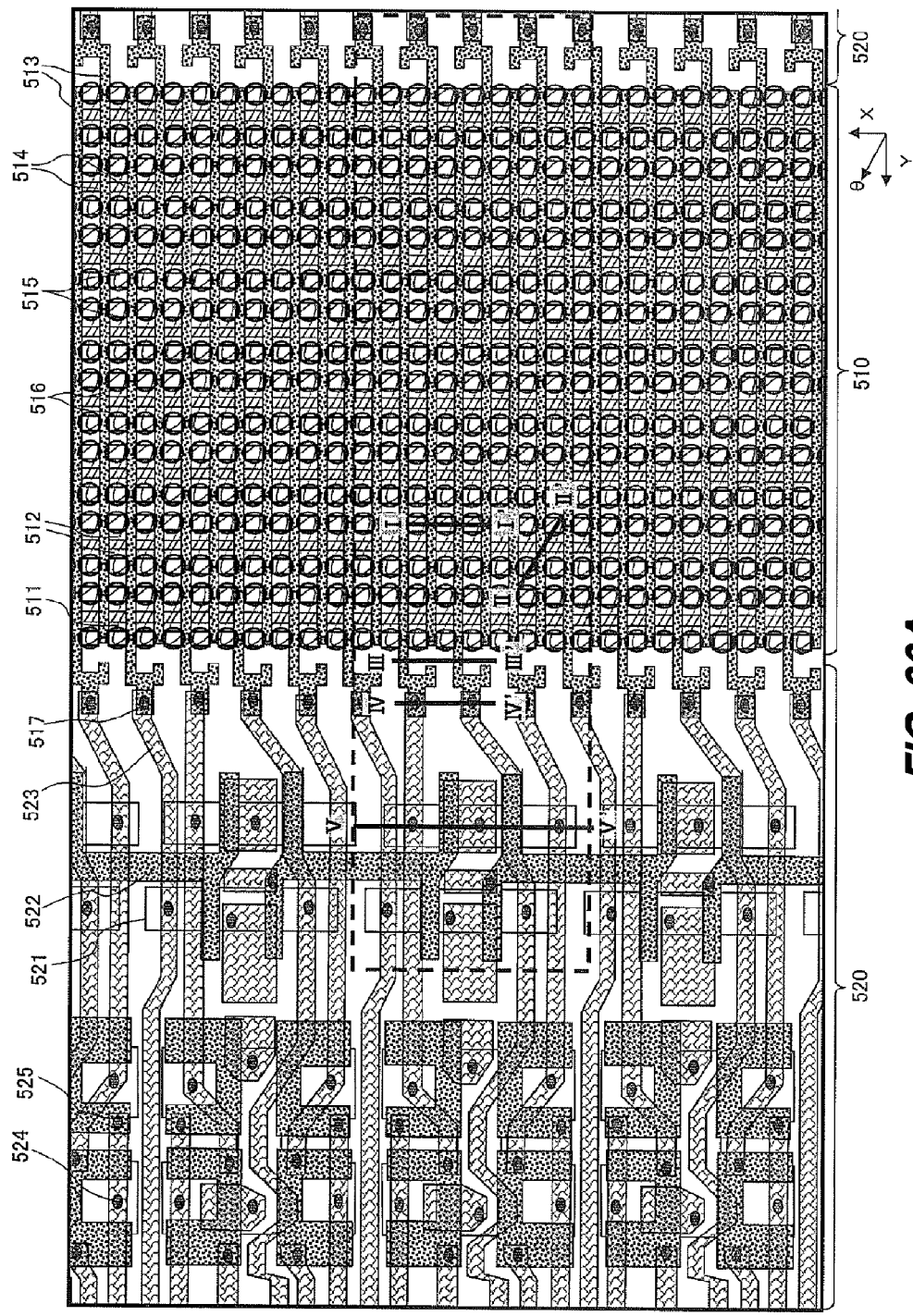
FIG. 30A is a plan view schematically showing a configuration of a part of the semiconductor device of FIG. 29.

FIG. 30A is a diagram schematically showing a configuration of part of the memory cell region 510 and peripheral circuit regions 520 adjacent thereto. For better visibility of the diagram, a metal interconnect layer, etc., formed as an upper layer is omitted from the diagram. The peripheral circuit region 520 shown on the left in FIG. 30A may be referred to as first peripheral circuit region, and the peripheral circuit region 520 shown on the right in FIG. 30A may be referred to as second peripheral circuit region.

The memory cell region 510 has first active regions 511, buried gates 512, bit lines 513, bit contacts 514, capacitance contacts 515, capacitors 516, and first peripheral contacts 517.

The multiple first active regions 511 are arranged in the X and Y directions. The plane shape of each first active region 511 is an elliptical shape elongated in a θ direction making an angle θ against the Y direction.

The multiple buried gates 512 extend in the X direction and are arranged repeatedly in the Y direction. Specifically, for each row of first active regions 511 in the X direction, a pair of buried gates 512 are disposed. The buried gates 512 are so formed that they divide each first active region 511 into three subregions (central subregion and both side subregions). The central subregion of the first active region 511 functions as the source (or drain) of a transistor, while both side subregions function as the drain (or source).

The multiple bit lines of conductive layer 513 are formed by the same process as the process of the first embodiment. These bit lines 513 have portions (first and fourth portions) extending in the Y direction and arranged in the X direction repeatedly at the same interval. The bit lines 513 also have portions (third and sixth portions) extending in the direction reverse to the direction of extension of the first and fourth portions, and short portions (second and fifth portions) extending in the same direction of extension of the first and fourth portions. The first and fourth portions are connected to the second and fifth portions via the third and sixth portions, respectively.

Each bit line 513 corresponds to each row of first active regions 511 in the Y direction. Each bit line 513 passes above the central subregions of the corresponding row of first active regions 511.

The multiple bit contacts 514 correspond to the multiple first active regions 511, respectively. Each bit contact 514 is disposed above the central subregion of the corresponding first active region 511. The central subregion of each first active region 511 is electrically connected to the corresponding bit line 513 via the bit contact 514.

The multiple pairs of capacitance contacts 515 correspond to the multiple first active regions 511, respectively. Each pair of capacitance contacts 515 are disposed above the both side subregions of the corresponding first active region 511. On the capacitance contacts 515, the capacitors 516 are formed, respectively. Both side subregions of the first active region 511 are electrically connected to the lower electrodes of the capacitors 516 via the pair of capacitance contacts 515, respectively.

Each of the multiple first peripheral contacts 517 is disposed on one end of each bit line 513. In FIG. 30A, the multiple first peripheral contacts 517 are disposed on the left and right of the row of bit lines 513 alternately. Each first peripheral contact 517 electrically connects the corresponding bit line to a W (tungsten) interconnect of conductive layer 523 in the first peripheral circuit region or second peripheral circuit region.

Each peripheral circuit region 520 includes second active regions 521, peripheral gates 522, W interconnects 523, second peripheral contacts 524, and third peripheral contacts 525.

The second active regions 521 are substantially larger than the first active regions 511. Each second active region 521 is divided into three subregions (central subregion and both side subregions) by a pair of peripheral gates 522.

Each peripheral gate 522 is so formed as to stride across four adjacent second active regions 521.

The W interconnects 523 are used to connect the first to third peripheral contacts or interconnect layers to each other.

Each second peripheral contact 524 is used to connect any one of the W interconnects 523 to any one of the peripheral gates 522, and each third peripheral contact 525 is used to connect any one of the W interconnects 523 to any one of the second active regions 521.

Sectional views taken along a I-I' line, a II-II' line, a line, a IV-IV' line, and a V-V' line of FIG. 30A are shown in FIGS. 30B, 30C, 30D, 30E, and 30F, respectively.

Figure 30B:
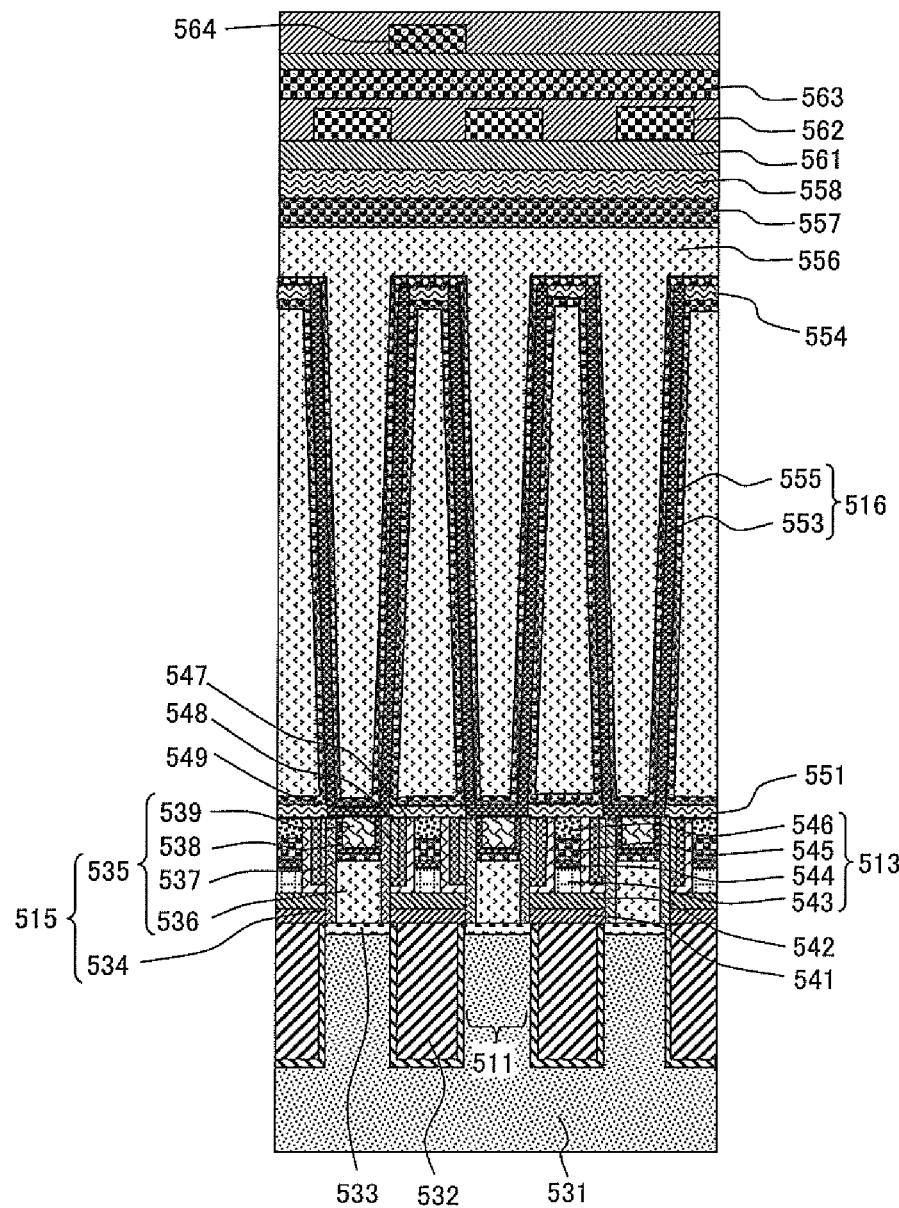
FIG. 30B is a sectional view along a I-I' line of FIG. 30A.

FIG. 30B is a sectional view including sections of four bit lies 513 along the X direction. These bit lines 513 are formed by the same process (double number of pitch-intervals process) as described in the first embodiment.

FIG. 30B indicates that STIs (Shallow Trench Isolation) 532 are formed to demarcate first active regions 511 in a semiconductor substrate 531.

On each first active region 511, a capacitance contact heavily-doped impurity diffusion layer 533 is formed. The capacitance contact heavily-doped impurity diffusion layer 533 makes up at least part of the source or drain. On the capacitance contact heavily-doped impurity diffusion layer 533, a capacitance contact 515 is formed. The capacitance contact 515 is formed between bit lines 513 adjacent to each other.

The capacitance contact 515 includes a capacitance contact liner 534 covering the side walls of a contact hole, and a capacitance contact plug 535 formed inside the capacitance contact liner 534. The capacitance contact plug 535 includes a third DOPOS (DOped POly Silicon) film 536, a CoSi film 537, a TiN film 538, and a second W film 539.

On each STI 532, a mask oxide film 541, a bit contact inter-layer film 542, and the bit line 513 are formed. The mask oxide film 541 is used as a mask when a trench for a buried gate 512 is formed.

The bit line 513 includes a second DOPOS film 543, a WSi/TiN/Ti laminated film 544, a first W film 545, and a cap insulating film 546. The side walls of the bit line 513 is covered with a first SW (Side Wall) nitride film 547, a second SW nitride film 548, and a first inter-layer insulating film 549. The first and second SW nitride films 547 and 548 function as an anti-oxidation barrier film when the first inter-layer insulating film 549 is formed, thus preventing the oxidation of the bit line 513.

On the bit line 513, a stopper nitride film 551 is formed. On the capacitance contacts 515, lower electrodes 553 making up capacitors 516 are formed, respectively. Each lower electrode 553 is crown-shaped, and has its lower end electrically connected to the capacitance contact heavily-doped impurity diffusion layer 533 (source or drain) via the capacitance contact plug 535. The lower electrode 553 has its upper end connected to an adjacent different lower electrode 553 via a support nitride film 554.

A capacitance insulating film (not depicted) is so formed that it covers the upper surface of the stopper nitride film 551, the inner/outer peripheral surfaces of the lower electrode 553, and the upper/lower surfaces of the support nitride film 554. The upper electrode 555 of the capacitor 516 is so formed that the upper electrode 555 covers the surface of the capacitance insulating film.

A fourth DOPOS/BSiGe laminated film 556 is so formed that it fills up the space surrounding the capacitor 516. On the fourth DOPOS/BSiGe laminated film 556, a plate electrode 557 and a plate nitride film 558 are formed. On the plate nitride film 558, a first metal interconnect layer 562, a second metal interconnect layer 563, and a third metal interconnect layer 564 are formed via an inter-layer insulating film 561.

Figure 30C:
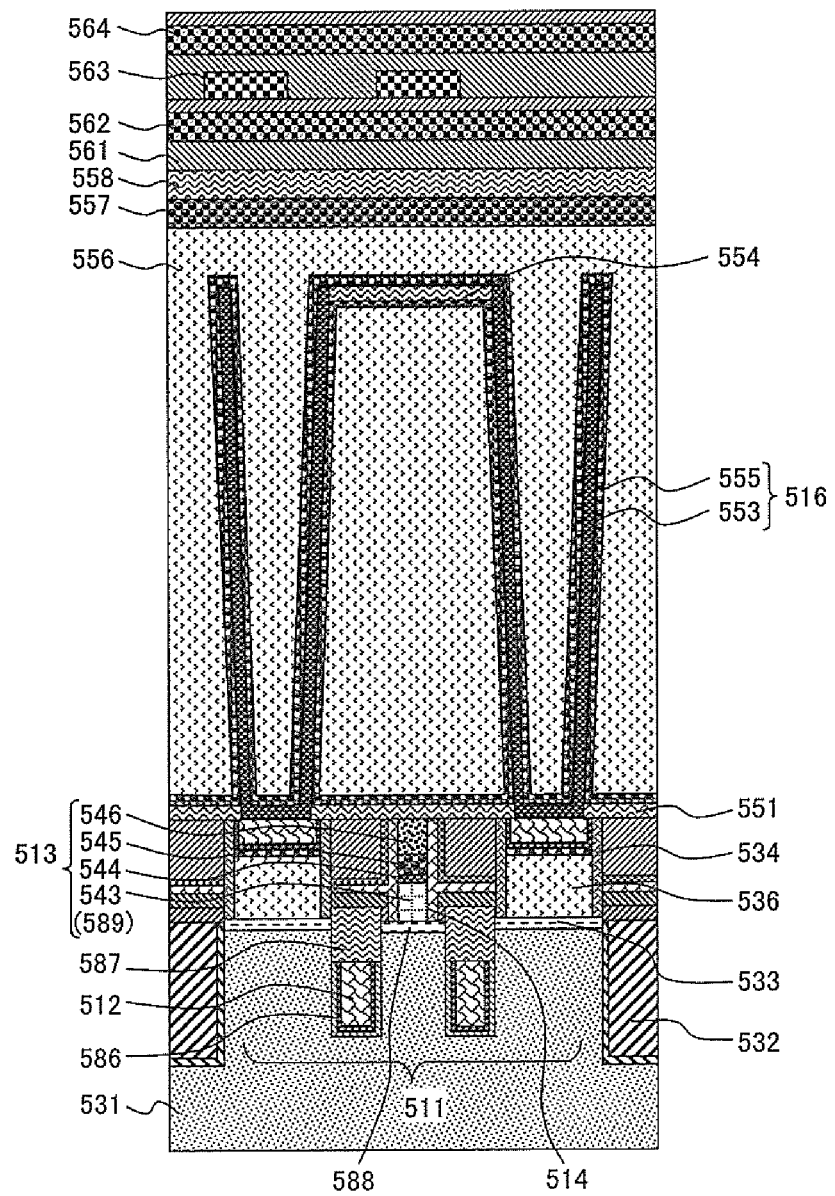
FIG. 30C is a sectional view along a II-II' line of FIG. 30A.

FIG. 30C is a sectional view including a section of the first active region 511 along its major axis direction (A direction). FIG. 30C shows sections of a pair of transistors making up a memory cell (the transistors sharing the source or drain) and two capacitors 516 corresponding to the transistors, respectively.

FIG. 30C indicates that each buried gate 512 is buried in a gate trench formed in the semiconductor substrate 531. The inner wall of the lower part of the gate trench is covered with a buried gate insulating film 586, inside of which the buried gate 512 is formed. The upper part of the gate trench is filled with a cap insulating film 587, which is a silicon nitride film.

A bit contact heavily-doped impurity diffusion layer 588 is formed on the surface of the semiconductor substrate 531 in the region between a pair of the buried gates 512. The bit contact heavily-doped impurity diffusion layer 588 is electrically connected to the bit line 513 via a bit contact 514. The bit contact 514 includes a bit contact plug 589 that is formed together with the second DOPOS film 543 making up the bit line 513.

Figure 30D:
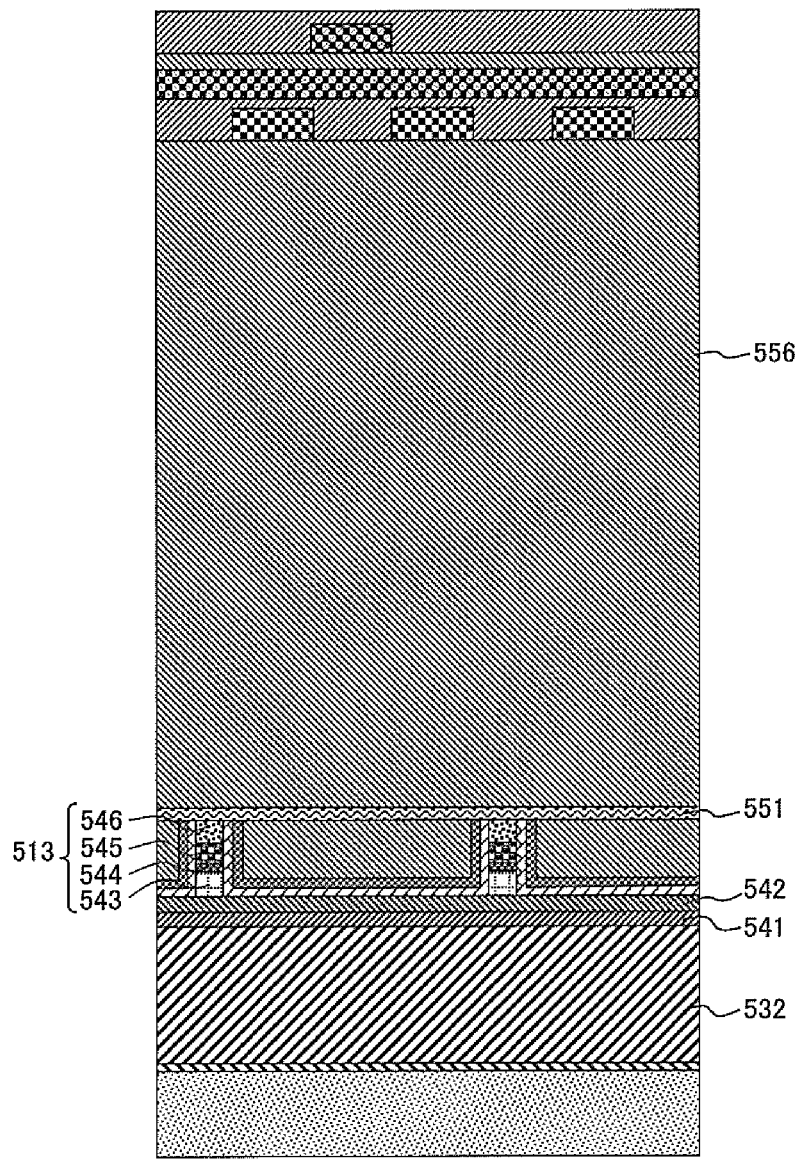
FIG. 30D is a sectional view along a line of FIG. 30A.

FIG. 30D is a sectional view including a section of the vicinity of ends of the bit lines 513 taken along the X direction. This is the sectional view at a location corresponding to a location where rectangular-frame-shaped side walls 112 formed by the double number of pitch-intervals process are cut into divided portions. The sectional view thus includes sections of respective one bit lines 513 of two pairs of bit lines 513 adjacent to each other.

Figure 30E:
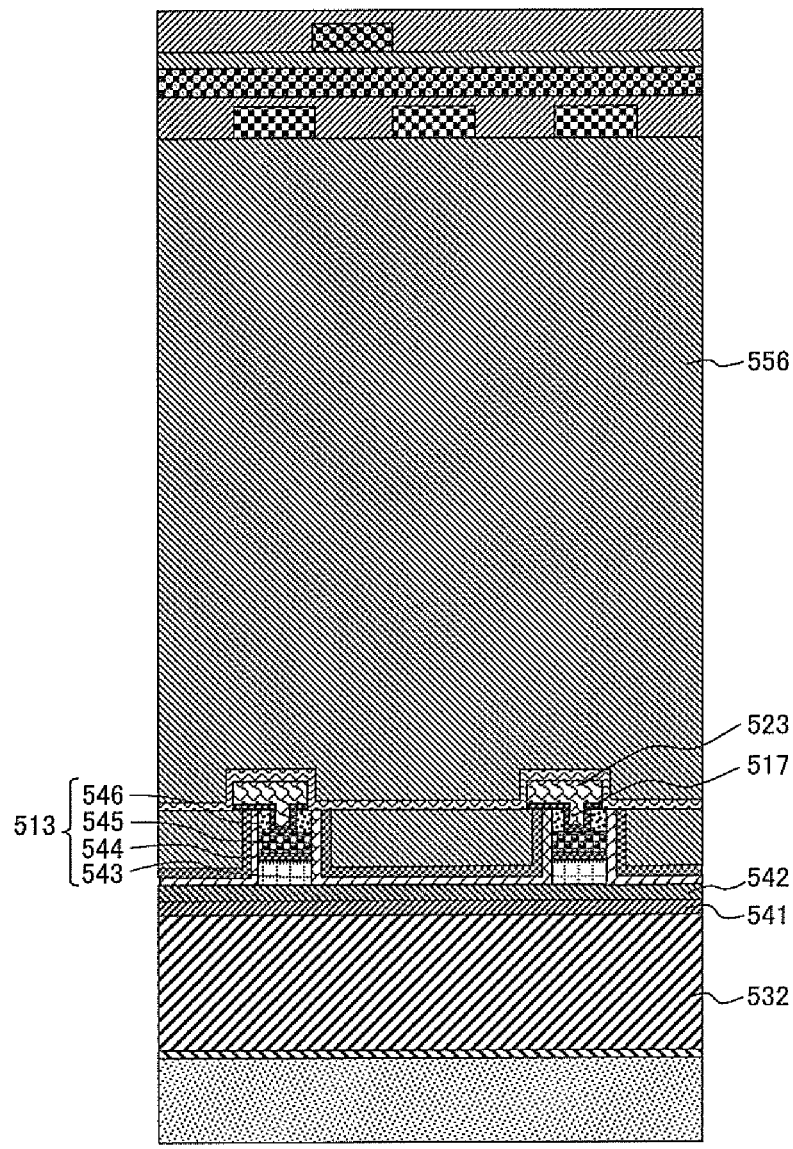
FIG. 30E is a sectional view along a IV-IV' line of FIG. 30A.

FIG. 30E is a sectional view including a section of ends (tab portions) of the bit lines 513. As shown in FIG. 30E, the bit lines 513 are connected to the W interconnects 523 via the first peripheral contacts 517, respectively.

Figure 30F:
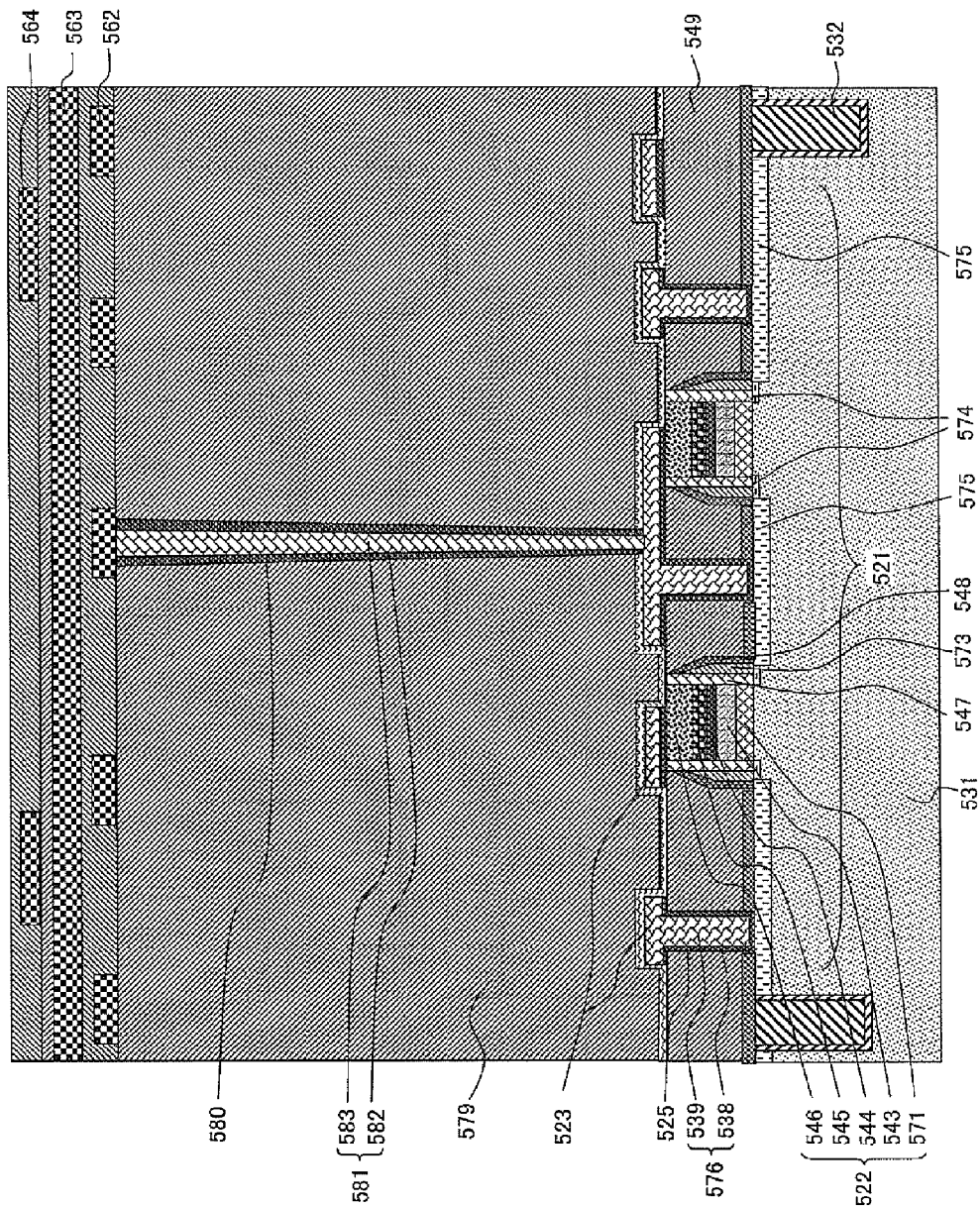
FIG. 30F is a sectional view along a V-V' line of FIG. 30A.
Figure 31A:
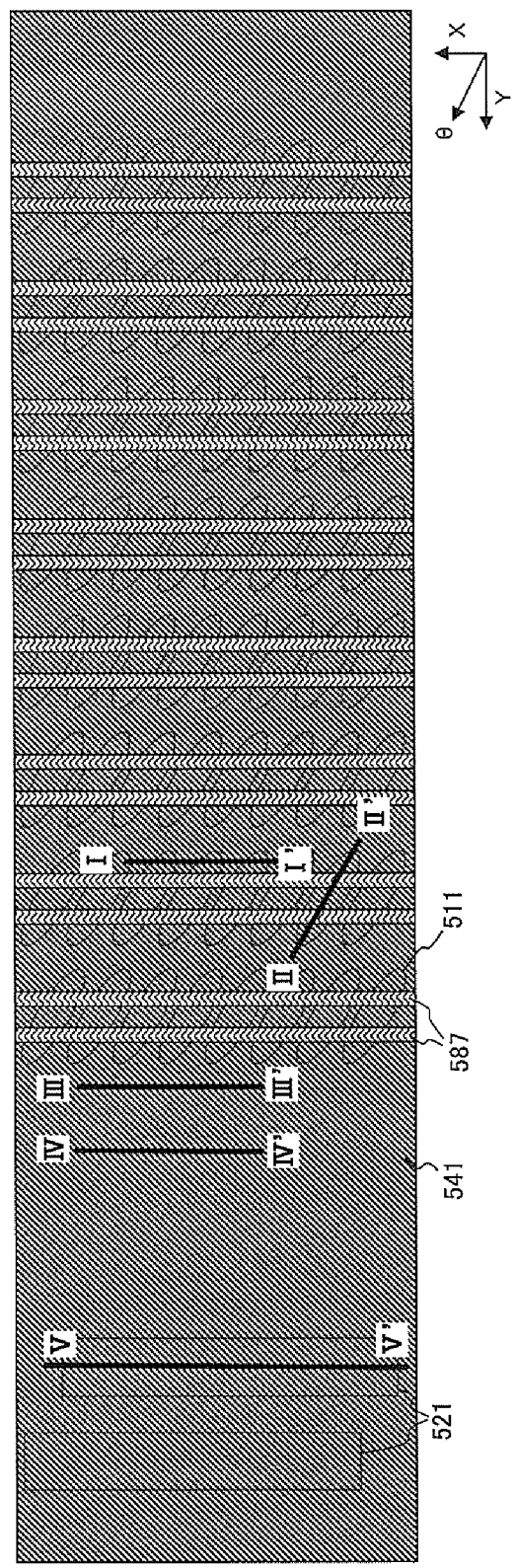
FIG. 31A is a plan view for explaining a manufacturing method for the semiconductor device depicted in FIGS. 30A to 30F.
Figure 31B:
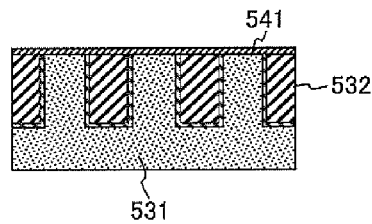
FIG. 31B is a sectional view along a I-I' line of FIG. 31A.
Figure 31C:
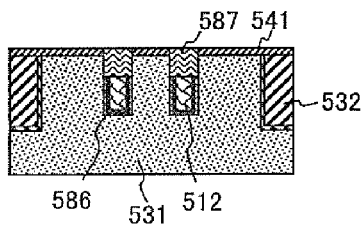
FIG. 31C is a sectional view along a II-II' line of FIG. 31A.
Figure 31D:
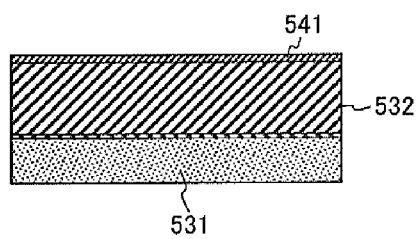
FIG. 31D is a sectional view along a line of FIG. 31A.
Figure 31E:
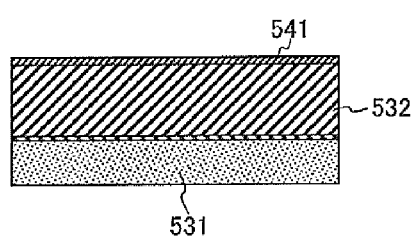
FIG. 31E is a sectional view along a IV-IV' line of FIG. 31A.
Figure 31F:
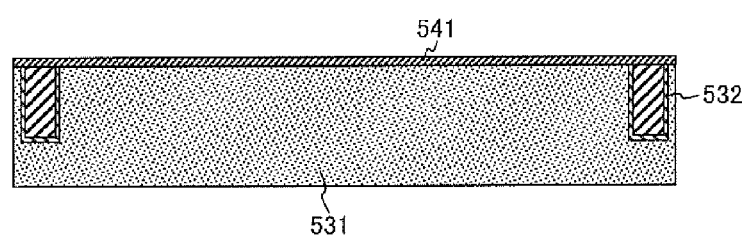
FIG. 31F is a sectional view along a V-V' line of FIG. 31A.
Figure 32A:
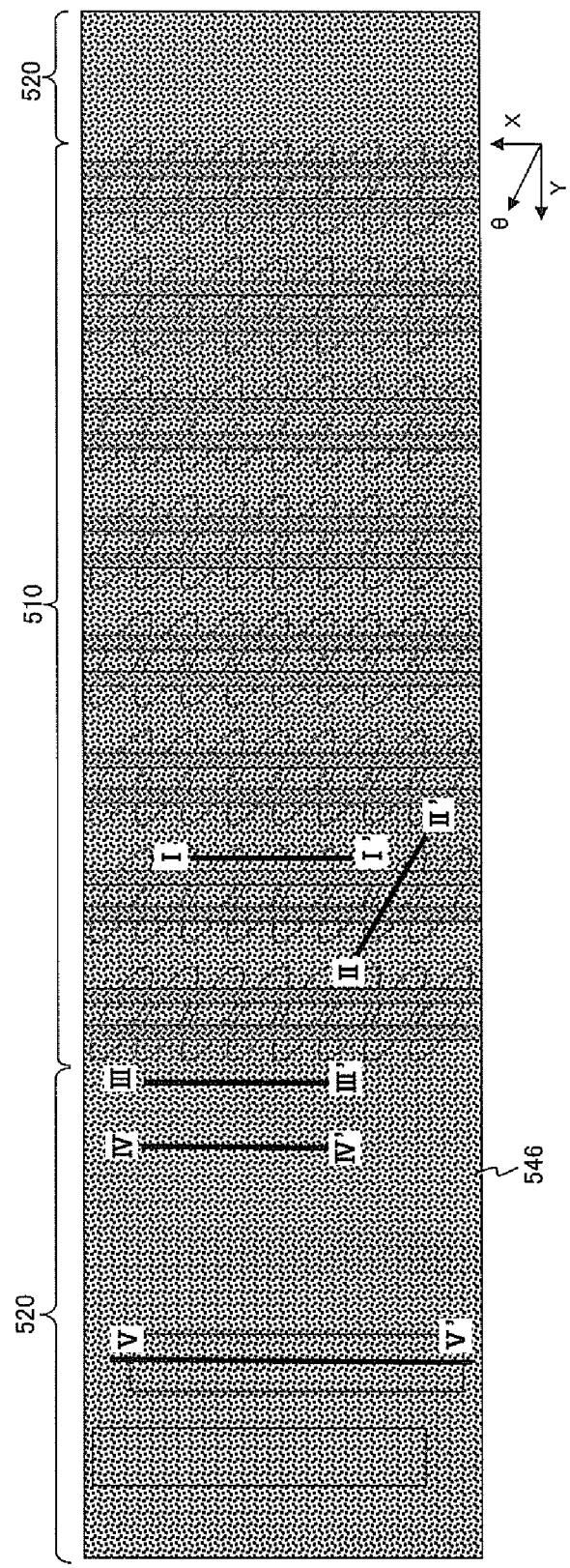
FIG. 32A is a plan view for explaining a process following the process depicted in FIGS. 31A to 31F.
Figure 32B:
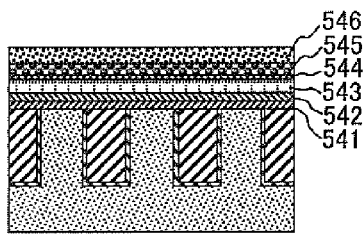
FIG. 32B is a sectional view along a I-I' line of FIG. 32A.
Figure 32C:
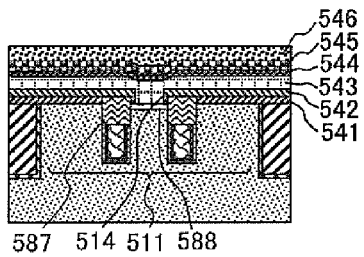
FIG. 32C is a sectional view along a II-II' line of FIG. 32A.
Figure 33D:
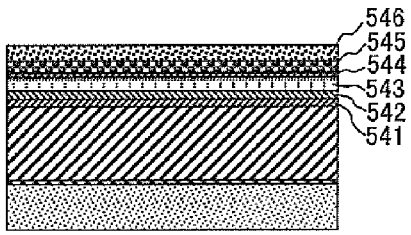
FIG. 33D is a sectional view along a line of FIG. 33A.
Figure 32E:
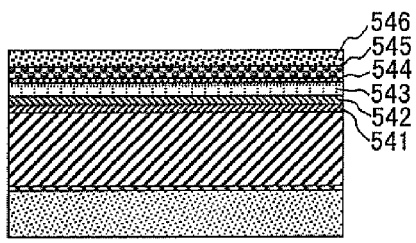
FIG. 32E is a sectional view along a IV-IV' line of FIG. 32A.
Figure 32F:
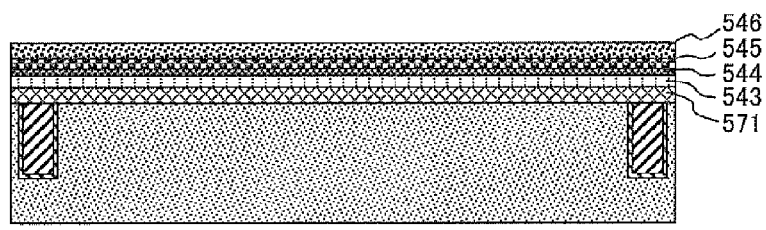
FIG. 32F is a sectional view along a V-V' line of FIG. 32A.
Figure 33A:
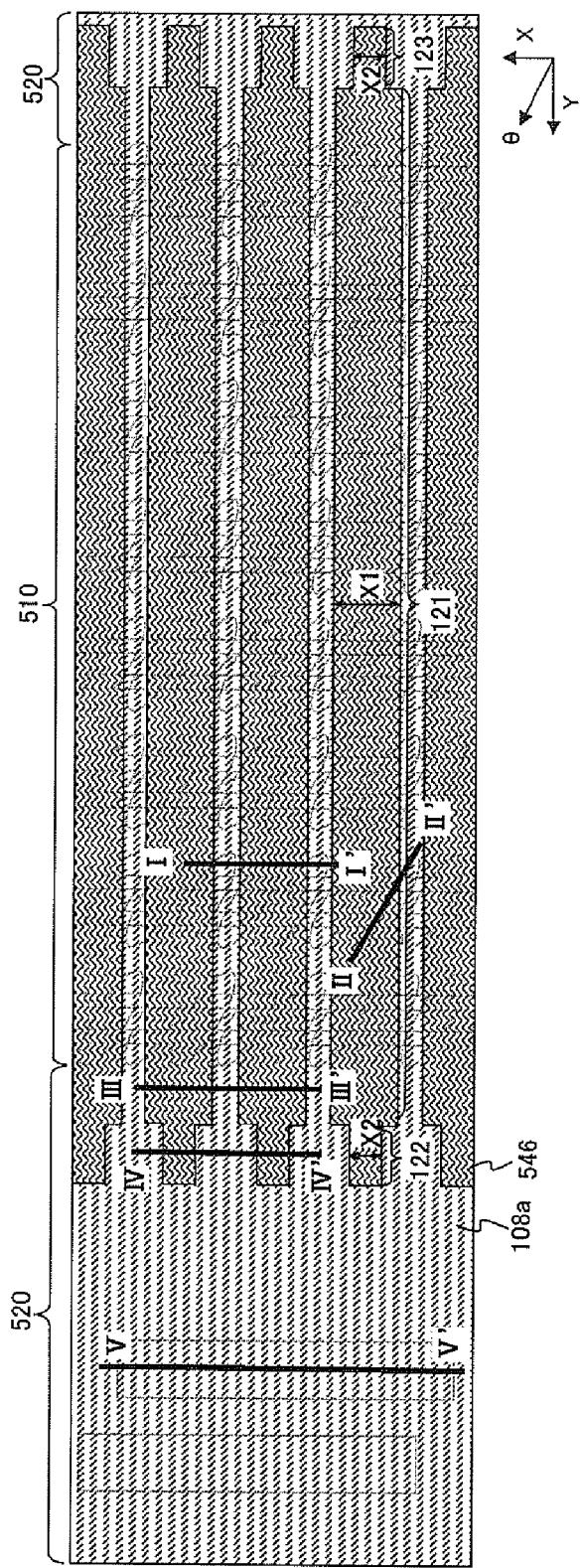
FIG. 33A is a plan view for explaining the manufacturing method for the semiconductor device depicted in FIGS. 32A to 32F.
Figure 33B:
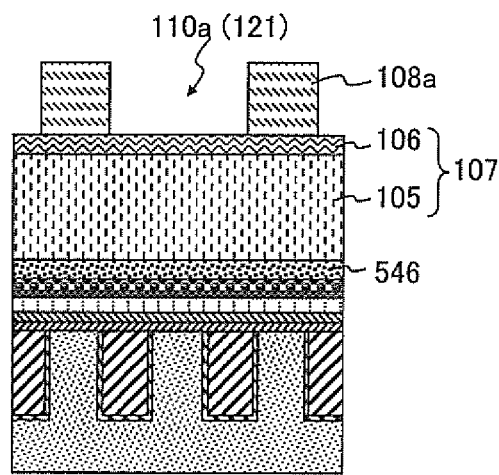
FIG. 33B is a sectional view along a I-I' line of FIG. 33A.
Figure 33C:
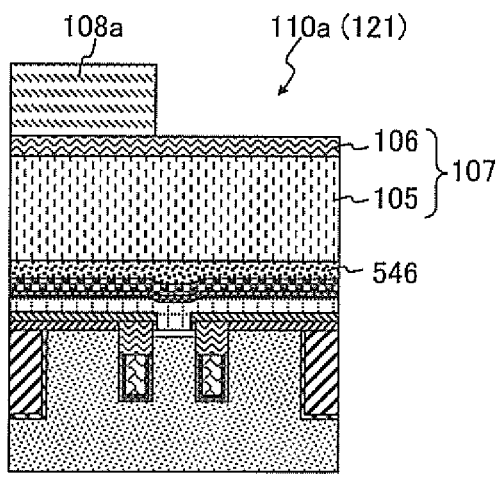
FIG. 33C is a sectional view along a II-II' line of FIG. 33A.
Figure 33D:
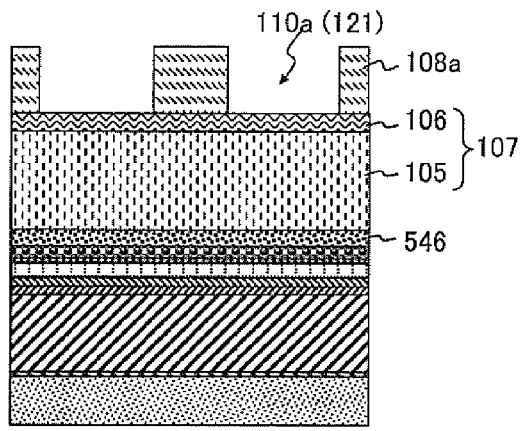
Figure 33E:
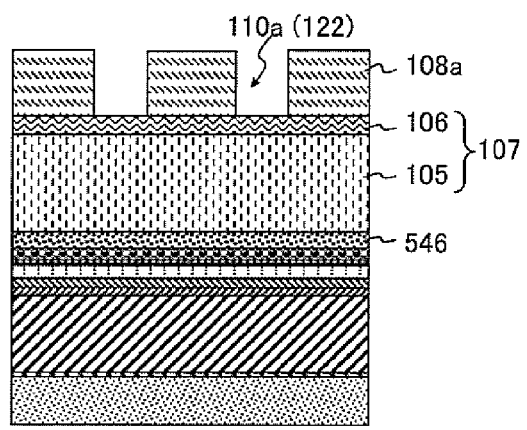
FIG. 33E is a sectional view along a IV-IV' line of FIG. 33A.
Figure 33F:
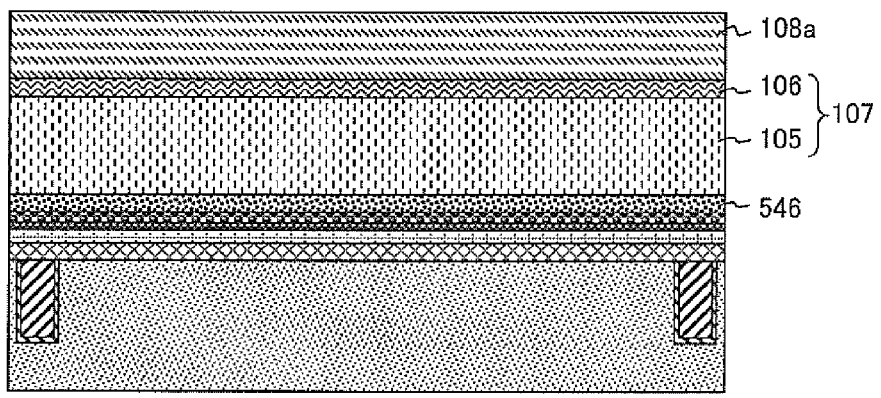
FIG. 33F is a sectional view along a V-V' line of FIG. 33A.
Figure 34A:
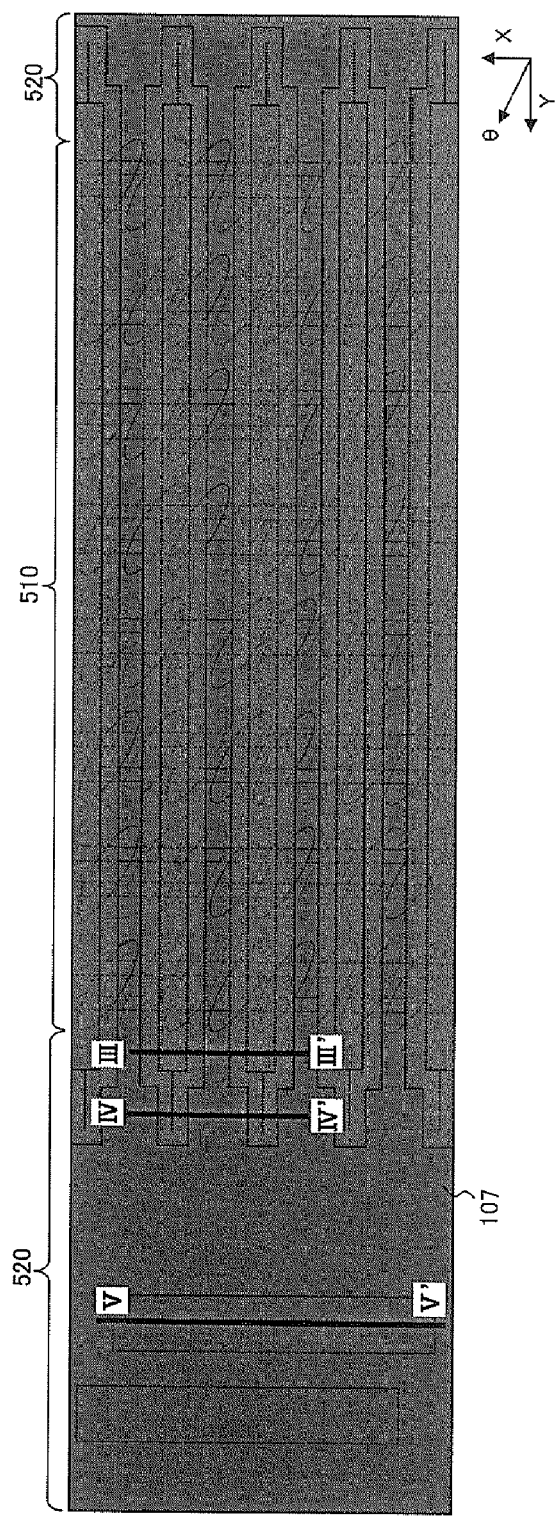
FIG. 34A is a plan view for explaining the manufacturing method for the semiconductor device depicted in FIGS. 33A to 33F.
Figure 34D:
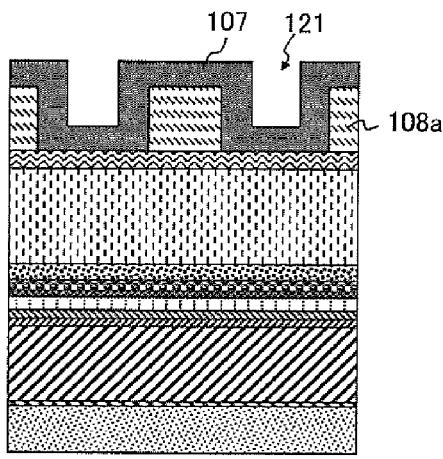
FIG. 34D is a sectional view along a line of FIG. 34A.
Figure 34E:
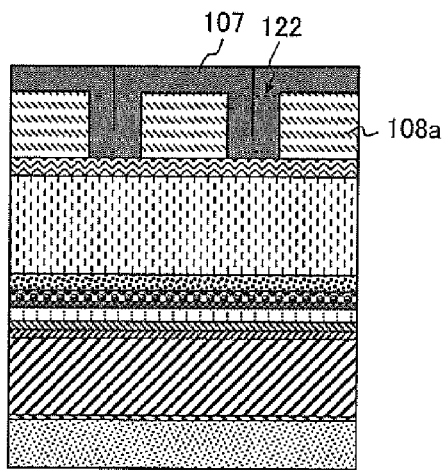
FIG. 34E is a sectional view along a IV-IV' line of FIG. 34A.
Figure 34F:
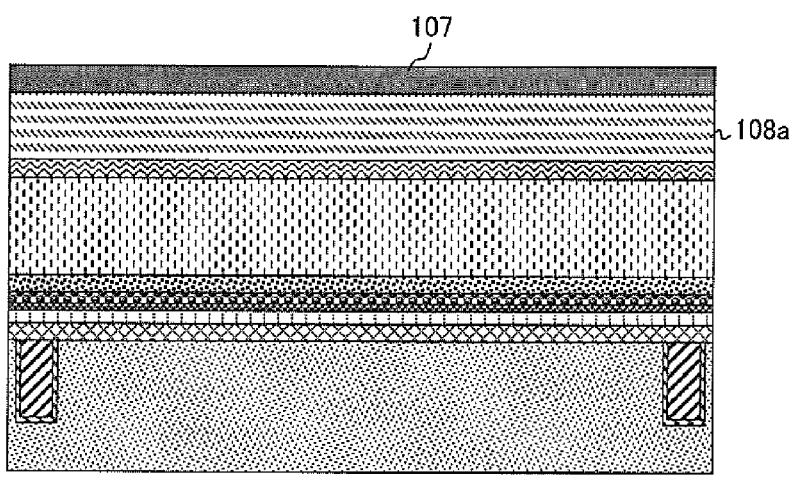
FIG. 34F is a sectional view along a V-V' line of FIG. 34A.
Figure 35A:
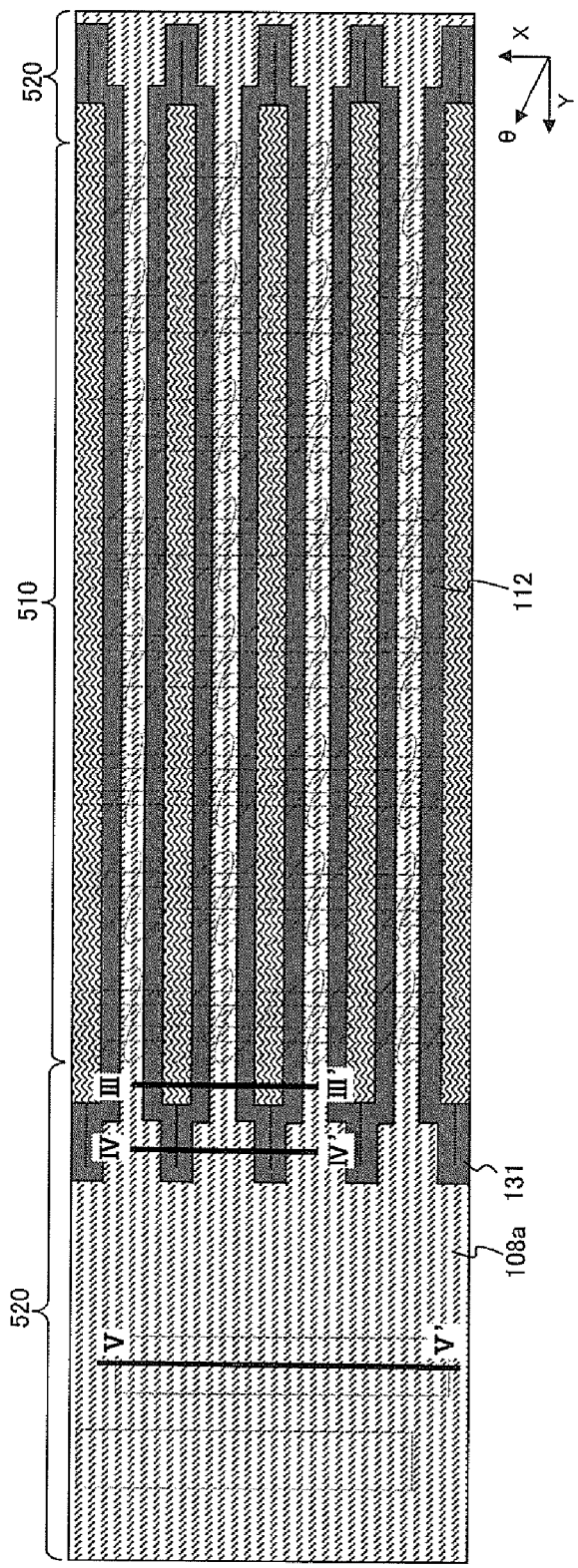
FIG. 35A is a plan view for explaining the manufacturing method for the semiconductor device depicted in FIGS. 34A and 34D to 34F.
Figure 35D:
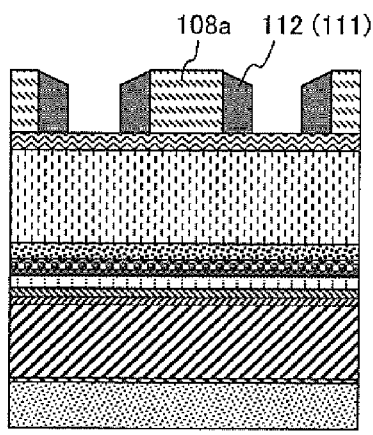
FIG. 35D is a sectional view along a line of FIG. 35A.
Figure 35E:
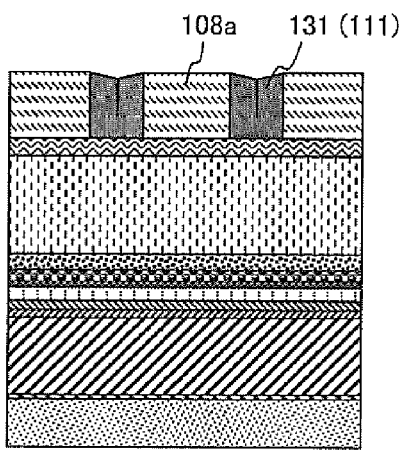
FIG. 35E is a sectional view along a IV-IV' line of FIG. 35A.
Figure 35F:
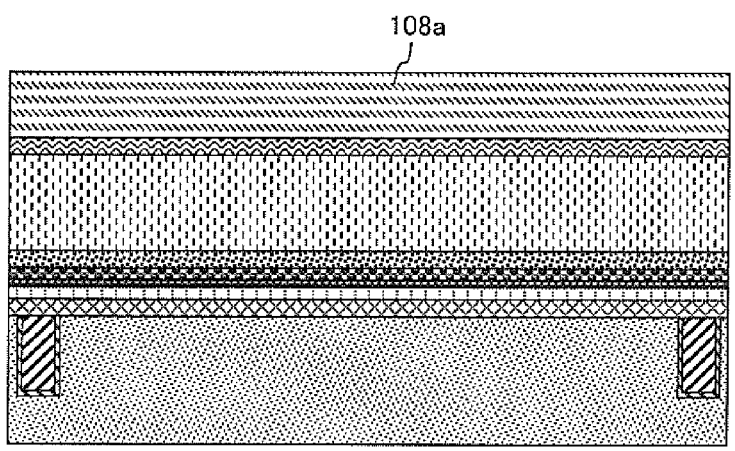
FIG. 35F is a sectional view along a V-V' line of FIG. 35A.

FIG. 30F is a sectional view including sections of the second active region 521 and two peripheral gates 522 traversing the second active region 521 in the Y direction, which sections are taken along the X direction. FIG. 30F indicates that the STIs 532 demarcate the second active region 521. On the second active region 521, two peripheral gates 522 are formed at the locations where the peripheral gates 522 divide the second active region 521 into three subregions.

The peripheral gate 522 includes a first DOPOS film 571, the second DOPOS film 543, the WSi/TiN/Ti laminated film 544, the first W film 545, and the cap insulating film 546. On the sides of the peripheral gate 522, side walls are formed, each of which is composed of the first SW nitride film 547, a SW oxide film 573, and the second SW nitride film 548.

Under the side walls formed on the sides of the peripheral gate 522, peripheral lightly-doped impurity diffusion layers 574 are formed, by the side of which peripheral heavily-doped impurity diffusion layers 575 are formed.

On the first inter-layer insulating film 549 covering the peripheral heavily-doped impurity diffusion layers 575 and filling the space around the peripheral gate 522, the W interconnects 523 are formed. The W interconnect 523 is electrically connected to the peripheral heavily-doped impurity diffusion layer 575 via the third peripheral contact 525, which includes a third peripheral contact plug 576. The third peripheral contact plug 576 is formed together with the W interconnect 523, and includes the TiN film 538 covering the inner wall of a hole for the third peripheral contact 525 and the second W film 539 filling the hole.

The first to third metal interconnect layers 562 to 564 are formed above the W interconnect 523 via a second inter-layer insulating film 579 covering the W interconnect 523. A first trough-hole 580 is formed as a through-hole electrically connecting the first metal interconnect layer 562 to the W interconnect 523. The first through-hole 580 includes a first through-hole plug 581 plugging a hole penetrating the second inter-layer insulating film 579. The first through-hole plug 581 is composed of a TiN film 582 and a fourth W film 583.

A manufacturing method for the semiconductor device of FIGS. 30A to 30F will then be described, referring to FIGS. 31A to 44F. FIGS. 31A to 44A are plane views of an area corresponding to an area encircled with a broken line in FIG. 30A. FIGS. 31B to 44F are sectional views taken along I-I' lines, II-II' lines, lines, IV-IV' lines, and V-V' lines of FIGS. 31A to 44A corresponding to FIGS. 31B to 31F, respectively.

As shown in FIGS. 31A to 31F, the STIs 532 are formed on one surface of the semiconductor substrate 531 to demarcate the first active regions 511 and the second active regions 521. Subsequently, the buried gates 512 are formed in the memory cell regions 510.

Each buried gate 512 is formed in the lower part of each gate trench, whose upper part is filled with the cap insulating film 587. The buried gate 512 is composed of a Ti film formed on the buried gate insulating film 586 covering the inner surface of the lower part of the gate trench and of a W film filling the interior space of the Ti film.

The mask oxide film 541 used for the formation of the buried gate trenches remains on the upper surfaces of the semiconductor substrate 531 and STIs 532.

Subsequently, as shown in FIGS. 32A to 32F, the bit contact inter-layer film 542, the first DOPOS film 571, the second DOPOS film 543, the WSi/TiN/Ti laminated film 544, the first W film 545, and the cap insulating film 546 are formed, and the bit contact heavily-doped impurity diffusion layer 588 is also formed.

Specifically, the bit contact inter-layer film 542 of about 15 nm in thickness is formed on the mask oxide film 541 and on the cap insulating film 587, which is followed by elimination of the bit contact inter-layer film 542 and mask oxide film 541 formed in the peripheral circuit region 520. Then, a peripheral gate oxide film (not depicted) is formed on the surface of the exposed second active region 521.

The first DOPOS film 571 of about 15 nm in thickness is formed to cover the whole surface of the second active region 521.

Subsequently, a resist mask is formed on the peripheral circuit region 520, and phosphorus ions serving as N-type impurity are injected selectively to the first active region 511 in the memory cell region 510 to form a lightly-doped impurity diffusion layer (not depicted). A dose of ion injection is determined to be, for example, 5E12 to 5E13 atoms/cm². The injected impurity is activated by an annealing process. Hence the lightly-doped impurity diffusion layer functions as the source/drain of the buried gate type MOS transistor disposed in the memory cell region 510.

Subsequently, a resist mask is formed on the peripheral circuit region 520, and the first DOPOS film 571 present in the memory cell region 510 is eliminated by dry etching. Then, the bit contact inter-layer film 542 and the mask oxide film 541 present in the area of memory cell region 510 where the bit contact 514 is formed are eliminated by dry etching. At this time, part of the bit contact inter-layer film 542 and mask oxide film 541 may be eliminated so that a trench bridging multiple first active regions 511 lined up in the X direction (bit contact trench) is formed. This means that the plane shape of an opening of the mask used in this etching process may be a linear shape extending in the X direction.

Subsequently, phosphorus ions serving as N-type impurity are injected into the first active region 511 exposed in the formed bit contact trench to form the bit contact heavily-doped impurity diffusion layer 588. A dose of this ion injection is determined to be, for example, 1E14 to 5E14 atoms/cm². The heavily-doped impurity diffusion layer 588 functions as the source or drain of the buried gate type MOS transistor disposed in the memory cell region 510, and exerts a function of reducing the contact resistance of connection to the bit line 513.

Subsequently, the second DOPOS film 543 having a thickness of, for example, 20 nm is formed. Then, a Ti film, a TiN film, and a WSi film are deposited in order to form the WSi/TiN/Ti laminated film 544. The thicknesses of the Ti film, the TiN film, and the WSi film are determined to be, for example, 3 nm, 5 nm, and 5 nm, respectively. The WSi/TiN/Ti laminated film 544 is then overlaid with tungsten to form the first W film 545. Finally, a silicon nitride film of about 150 nm in thickness is formed on the first W film 545 by plasma CVD, which silicon nitride film serves as the cap insulating film 546.

Afterward, the same process as the process of the first or second embodiment follows.

First, as shown in FIGS. 33A to 33F, the amorphous carbon film 105 and silicon nitride film 106, which make up the first mask layer 107, and the first organic film pattern 108a are formed on the cap insulating film 546.

The first organic film pattern 108a defines the multiple spaces 110a which are so disposed as to stride over the memory cell region 510, are extended in the Y direction, and are arranged repeatedly at the same pitch in the X direction.

Each space 110a has the first portion 121 located at its center in the Y direction, and the second and third portions 122 and 123 located on both sides of the first portion 121 in the Y direction to sandwich the first portion 121 between the second and third portions 122 and 123. The first portion has the first width X1 in the X direction, and each of the second and third portions 122 and 123 has the second width X2 smaller than the first width X1 in the X direction. It is preferable that the second width X2 be determined to be equal to or larger than ½ and equal to or smaller than ⅔ of the first width X1. For example, when the first width X1 is 50 nm, the second width X2 may be determined to be 30 nm.

The first organic film pattern 108a is formed such that the first portion 121 strides over the memory cell region 510. The second portion 122 and the third portion 123 are located respectively in the first peripheral circuit region 520 and the second peripheral circuit region 520 sandwiching the memory cell region 510 therebetween. The first organic film pattern 108 forms the liner-and-space (L/S) pattern in the memory cell region 510. The line width and the space width of the liner-and-space pattern can be determined to be, for example, 20 nm and 50 nm, respectively.

Subsequently, as shown in FIGS. 34A and 34D to 34F, the MLD oxide film 111 is formed such that the MLD oxide film 111 covers the upper surface of the first organic film pattern 108a as well as the side walls and bottoms of the spaces 110a. The thickness of the MLD oxide film 111 is determined to be a thickness with which the MLD oxide film 111 completely fills up the second and third portions 122 and 123 of the spaces 110a but leaves spaces on the first portions 121. When the widths X1 and X2 of the space 110a are determined in the above manner, the thickness of the MLD oxide film 111 can be determined to be 15 nm. When the MLD oxide film 111 of 15 nm in thickness is formed, the spaces 110a of the first organic film pattern 108a are filled with the MLD oxide film 111 such that the second and third portions 122 and 133 are filled up completely while only the bottom side of first portions 121 that is closer to the first mask layer 107 is filled partially.

Subsequently, as shown in FIGS. 35A and 35D to 35F, the MLD oxide film 111 is etched (etched back) selectively by the same process as the process of the first or second embodiment. As a result, the top surface of the first organic film pattern 108a is exposed and the silicon nitride film 106 (first mask layer 107) is partly exposed at the bottom of the first portions 121 of the spaces 110a of the first organic film pattern 108a.

Subsequently, as shown in FIGS. 36A and 36D to 36F, the whole of the first organic film pattern 108a is eliminated.

Figure 36A:
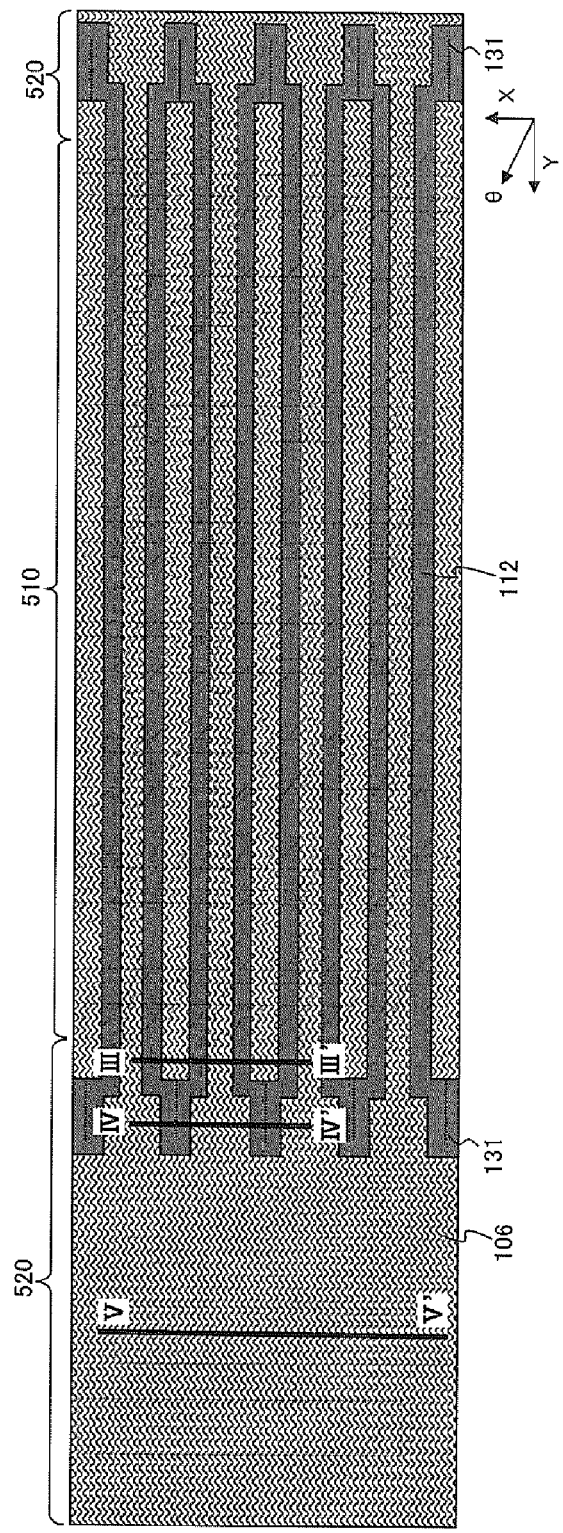
FIG. 36A is a plan view for explaining the manufacturing method for the semiconductor device depicted in FIGS. 35A and 35D to 35F.
Figure 36D:
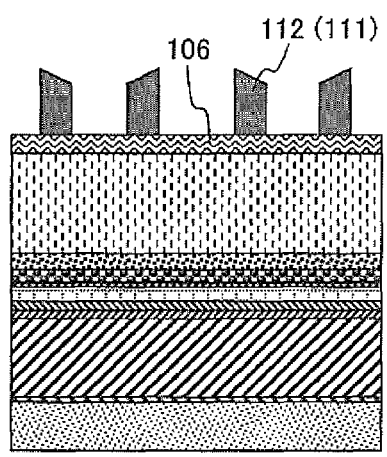
FIG. 36D is a sectional view along a line of FIG. 36A.
Figure 36E:
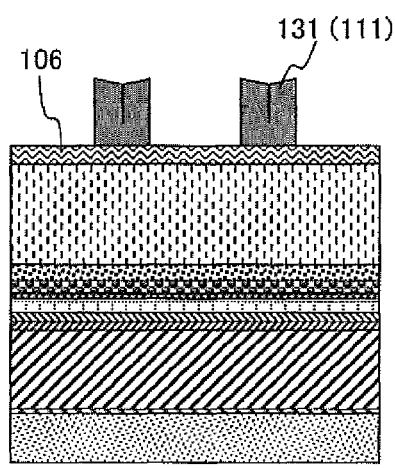
FIG. 36E is a sectional view along a IV-IV' line of FIG. 36A.
Figure 36F:
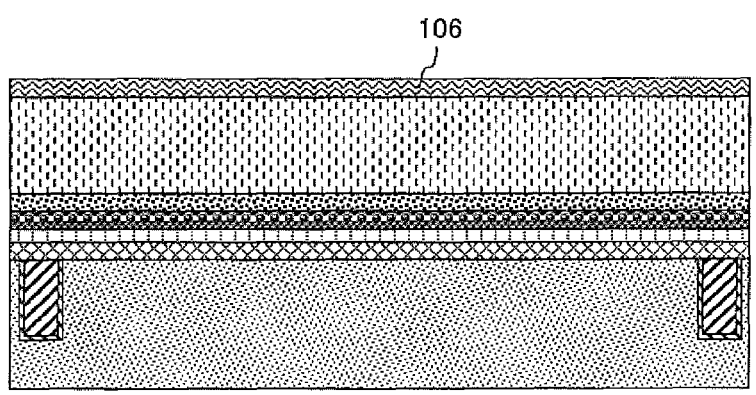
FIG. 36F is a sectional view along a V-V' line of FIG. 36A.
Figure 37A:
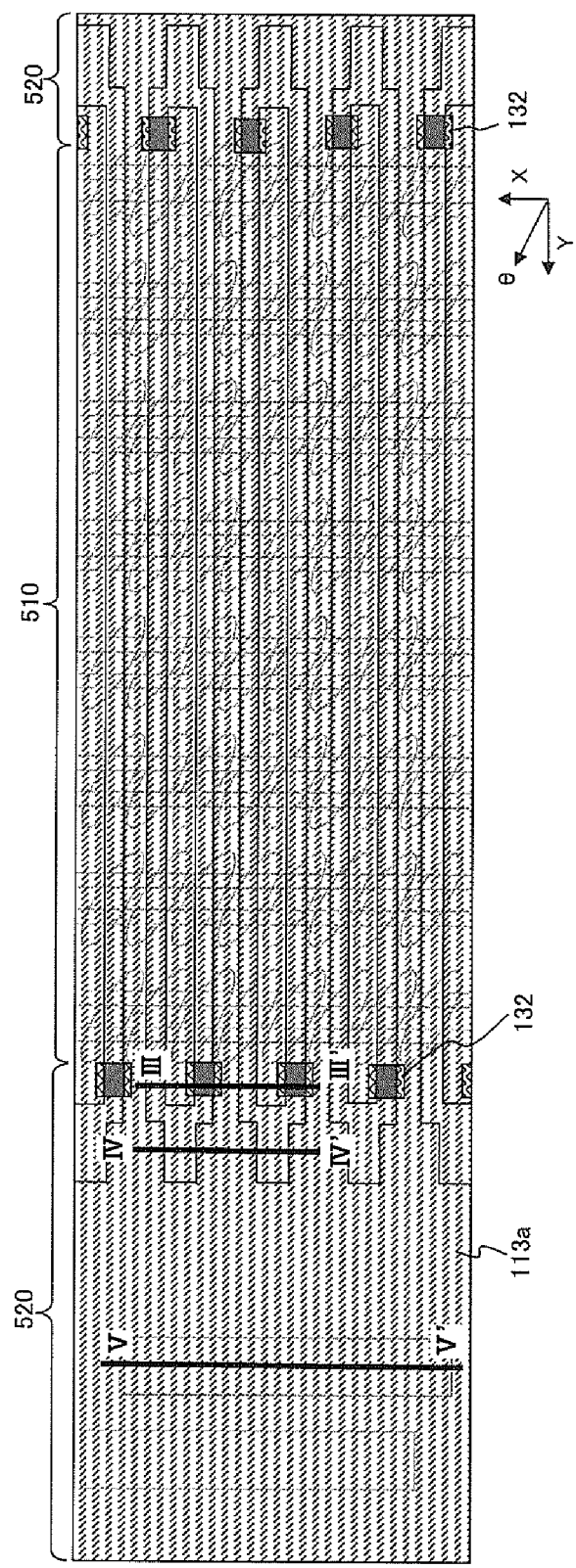
FIG. 37A is a plan view for explaining the manufacturing method for the semiconductor device depicted in FIGS. 36A and 36D to 36F.
Figure 37D:
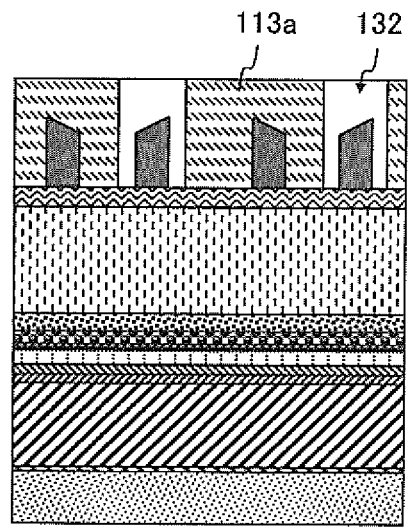
FIG. 37D is a sectional view along a line of FIG. 37A.
Figure 37E:
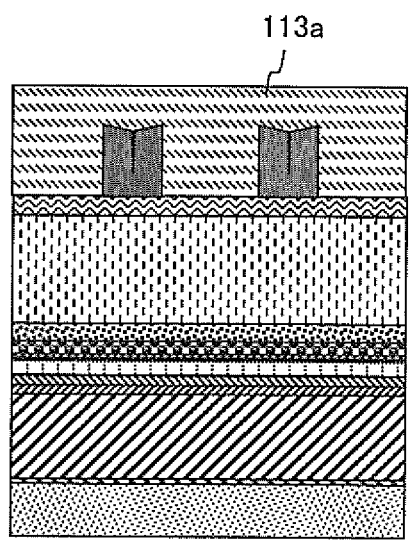
FIG. 37E is a sectional view along a IV-IV' line of FIG. 37A.
Figure 37F:
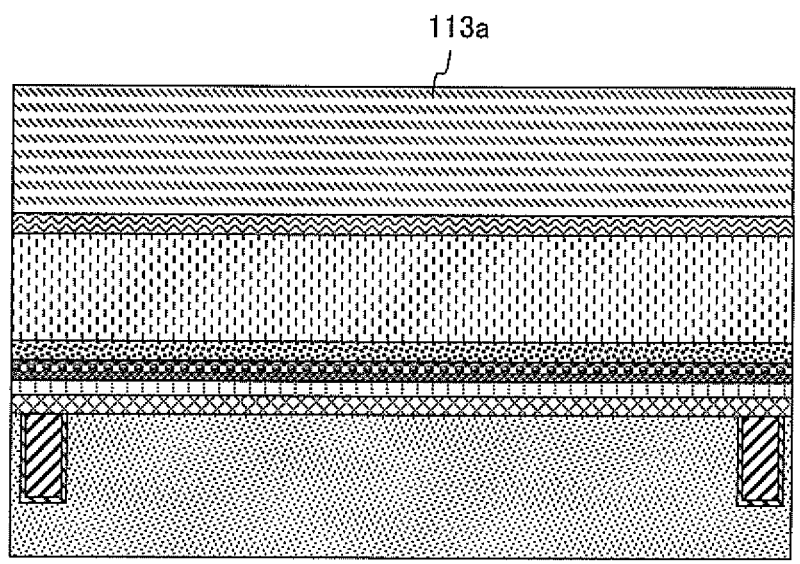
FIG. 37F is a sectional view along a V-V' line of FIG. 37A.
Figure 38A:
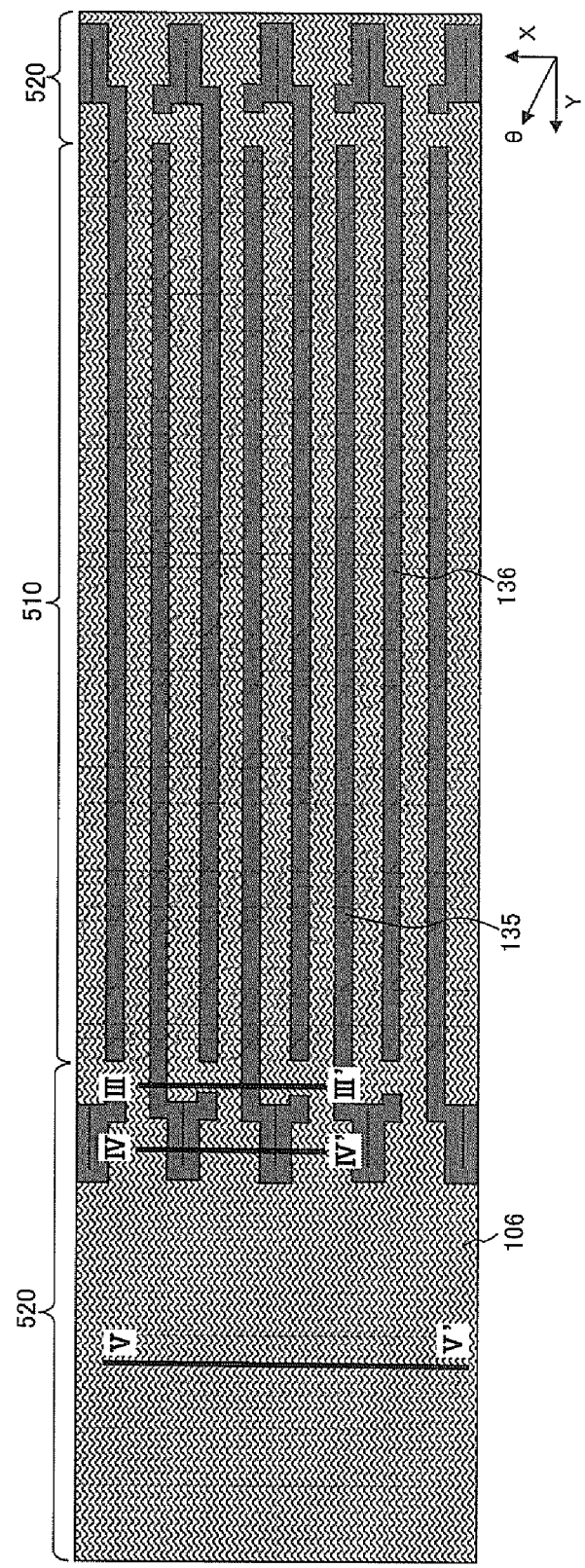
FIG. 38A is a plan view for explaining the manufacturing method for the semiconductor device depicted in FIGS. 37A and 37D to 37F.
Figure 38D:
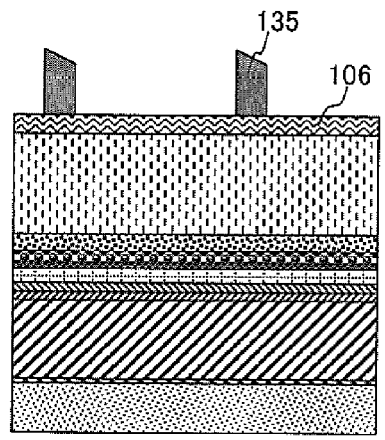
FIG. 38D is a sectional view along a line of FIG. 38A.
Figure 38E:
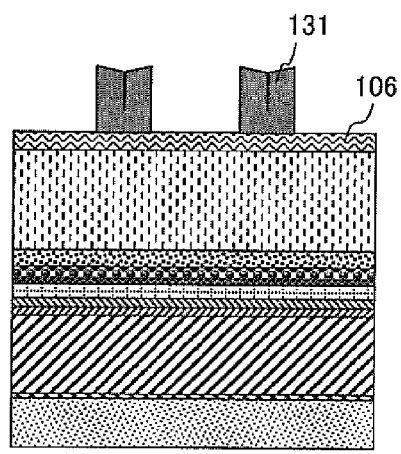
FIG. 38E is a sectional view along a IV-IV line of FIG. 38A.
Figure 38F:
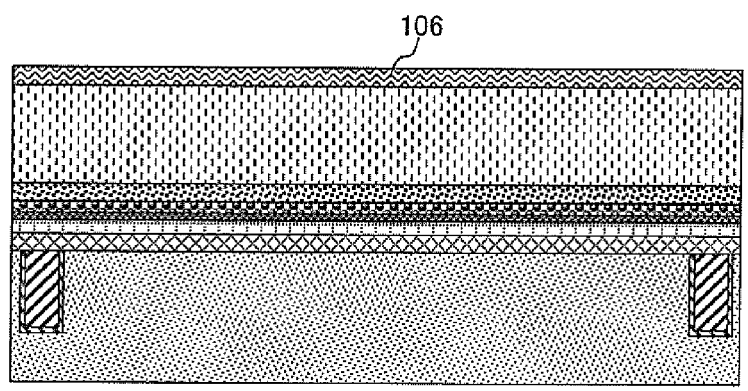
FIG. 38F is a sectional view along a V-V' line of FIG. 38A.
Figure 39A:
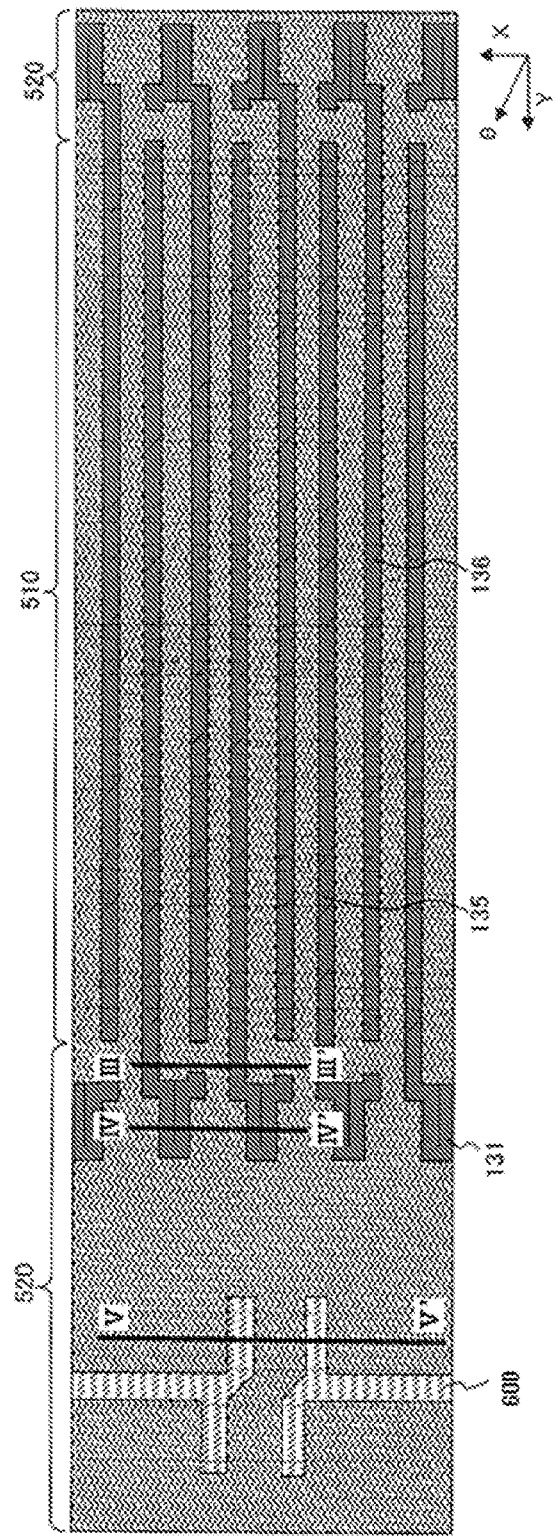
FIG. 39A is a plan view for explaining the manufacturing method for the semiconductor device depicted in FIGS. 38A and 38D to 38F.
Figure 39D:
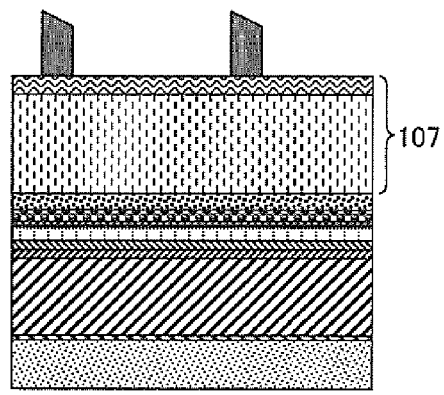
FIG. 39D is a sectional view along a line of FIG. 39A.
Figure 39E:
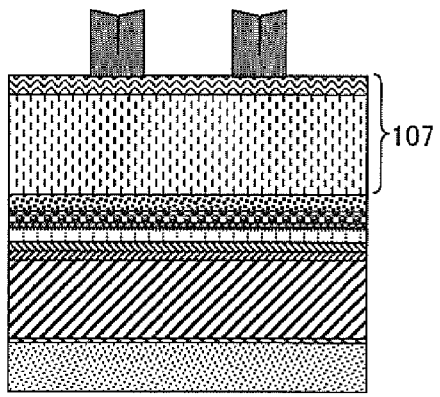
FIG. 39E is a sectional view along a IV-IV line of FIG. 39A.
Figure 39F:
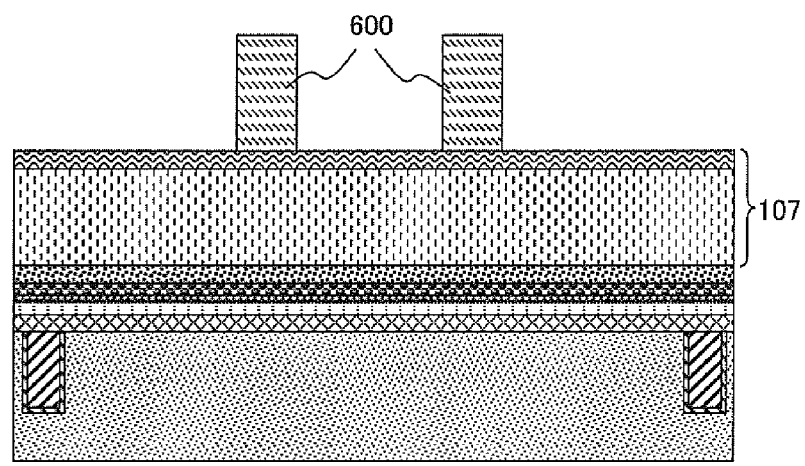
FIG. 39F is a sectional view along a V-V' line of FIG. 39A.
Figure 40A:
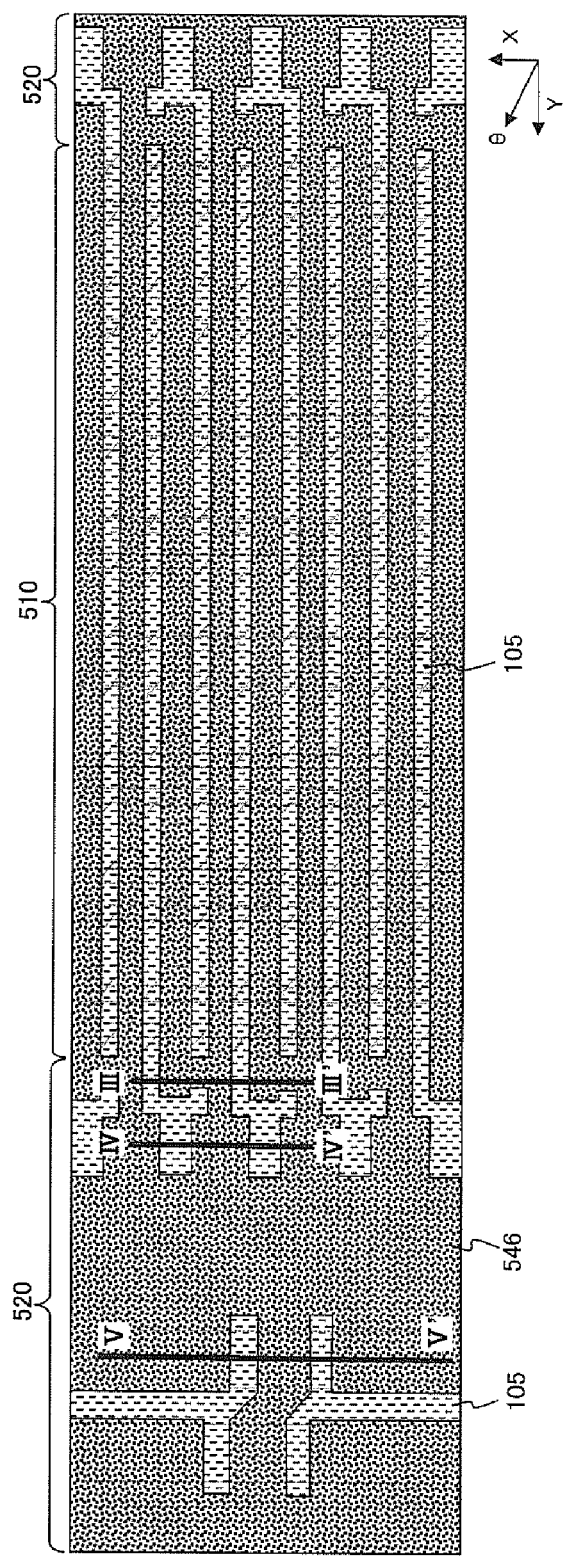
FIG. 40A is a plan view for explaining the manufacturing method for the semiconductor device depicted in FIGS. 39A and 39D to 39F.
Figure 40D:
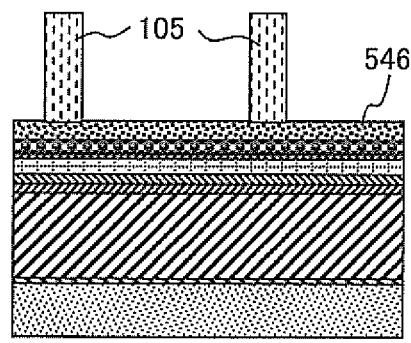
FIG. 40D is a sectional view along a line of FIG. 40A.
Figure 40E:
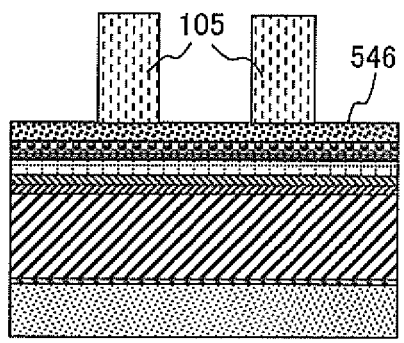
FIG. 40E is a sectional view along a IV-IV line of FIG. 40A.
Figure 40F:
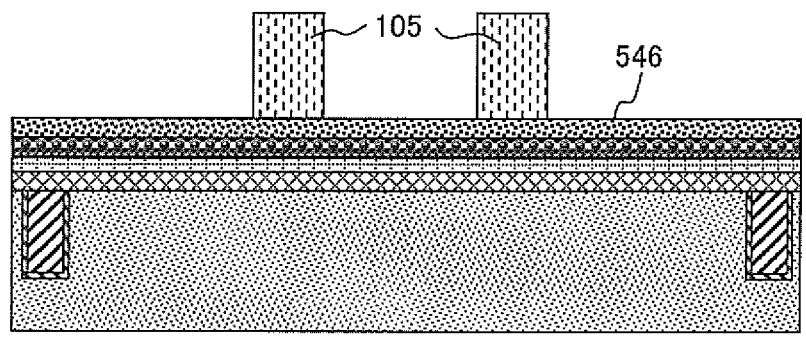
FIG. 40F is a sectional view along a V-V' line of FIG. 40A.
Figure 41A:
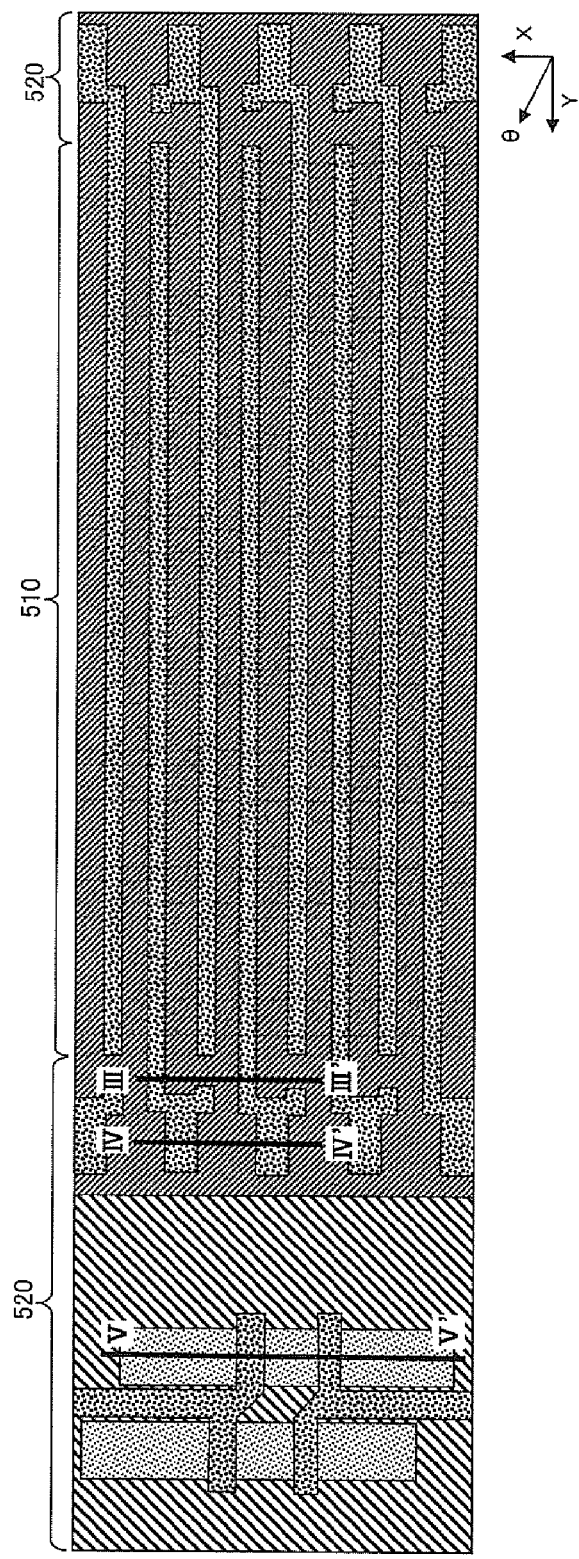
FIG. 41A is a plan view for explaining the manufacturing method for the semiconductor device depicted in FIGS. 40A and 40D to 40F.
Figure 41D:
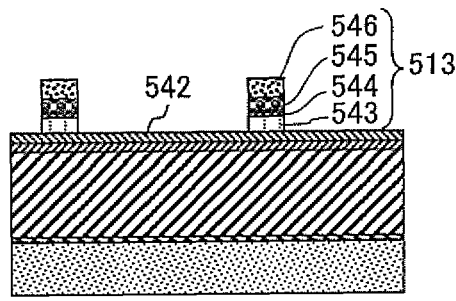
FIG. 41D is a sectional view along a line of FIG. 41A.
Figure 41E:
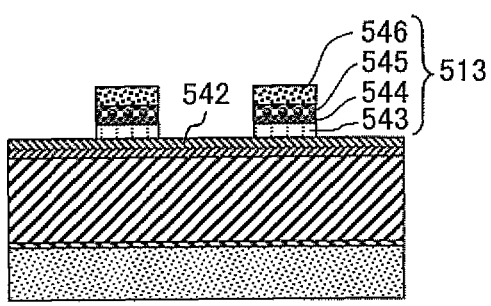
FIG. 41E is a sectional view along a IV-IV line of FIG. 41A.
Figure 41F:
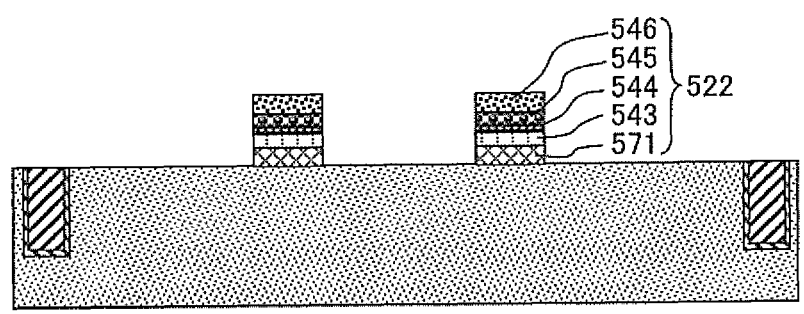
FIG. 41F is a sectional view along a V-V' line of FIG. 41A.

FIG. 36A demonstrates that in the area of the first portions 121 of the spaces 110a of the first organic film pattern 108a, the rectangular-frame-shaped side walls 112 are formed. The pairs of long sides (third and fourth side walls) of the side walls 112 form the line-and-space pattern on the memory cell region 510. The width of the side wall 112 depends on the thickness of the MLD oxide film 111. The width of the long side (line width) of the side wall 112 is substantially equal to the thickness of the MLD oxide film 111, which is, for example, 15 nm.

The MLD oxide film 111 remains in the area of the second and third portions 122 and 123 of the spaces 110a of the first organic film pattern 108a, where the remaining MLD oxide film 111 forms the tab portions 131 and the first mask layer 107 (silicon nitride film 106) is not exposed. The tab portions 131 are continuous with the pair of short sides (first and second walls) of the side wall 121, respectively.

Subsequently, as shown in FIGS. 37A and 37D to 37F, the second organic film pattern 113a covering the side walls 112 and the tab portions 131 is formed. In the second organic film pattern 113a, the multiple openings 132 are formed, where part of the long sides of the side walls 112 (first and second side wall portions) are exposed. The openings are disposed in the peripheral circuit region 520 and are in contact with or close to the boundary between the peripheral circuit region 520 and the memory cell region 510.

Subsequently, the first and second side wall portions (MLD oxide film 111) exposed in the openings 132 are eliminated, using the second organic film pattern 113a as a mask. The second organic film pattern 113a is then eliminated to create a state depicted in FIGS. 38A and 38D to 38F. As shown in FIGS. 38A and 38D to 38F, as a result of removal of the first side wall portion and second side wall portion from each rectangular-frame-shaped side wall 112, the rectangular-frame-shaped side wall 112 is divided into the third side wall portion 135 and the fourth side wall portion 136.

Subsequently, as shown in FIGS. 39A and 39D to 39F, a third organic film pattern 600 for forming the peripheral gates is formed in the peripheral circuit region 520. An ArF resist can be used as the third organic film pattern 600. The ArF resist is applied to the entire surface in the peripheral circuit region 520 and is subjected to exposure and development processes to form the third organic film pattern 600. Because the minimum size of the peripheral gate is about 50 nm, an ordinary ArF exposure apparatus can be used for exposing the ArF resist to light.

At this point, MDL oxide film patterns (135, 136, 131) formed by the double number of pitch-intervals process in the memory cell region 510 and the peripheral circuit region 520 close thereto and the third organic film pattern 600 formed in the peripheral circuit region 520 exist simultaneously on the first mask layer 107.

Subsequently, the silicon nitride film 106 that is the upper layer making up the first mask layer 107 is selectively dry etched, using the remaining MLD oxide films and third organic film pattern 600 as a mask. The amorphous carbon film 105 that is the lower layer making up the first mask layer 107 is then selectively dry etched, using the remaining silicon nitride film 106. These dry etching processes are carried out as the same etching processes carried out in the first or second embodiment. As a result, as shown in FIGS. 40A and 40D to 40F, a pattern of the amorphous carbon film 105 including a part constituting the line-and-space pattern with its number of pitch-intervals doubled is formed in the memory cell region 510 and its nearby area. In the peripheral circuit region 520, a peripheral gate pattern made of the amorphous carbon 105 is formed.

Subsequently, the cap insulating film 546 is selectively dry etched, using the pattern made of the amorphous carbon 105 as a mask, after which the amorphous carbon 105 is eliminated.

Subsequently, as shown in FIGS. 41A and 41D to 41F, etching is carried out, using the remaining cap insulating film 546 as a mask, to selectively eliminate the first W film 545, the WSi/TiN/Ti laminated film 544, the second DOPOS film 543, and the first DOPOS film 571 in order. As a result, the bit lines 513 including the cap insulating film 546, the first W film 545, the WSi/TiN/Ti laminated film 544, and the second DOPOS film 543 are formed in the memory cell region 510 and the peripheral circuit region 520 close thereto. At the same time, in the memory cell region 510, the bit contact plugs (bit contact plugs 589 of FIG. 30C) made of the second DOPOS film are also formed. The peripheral gates 522 including the cap insulating film 546, the first W film 545, the WSi/TiN/Ti laminated film 544, the second DOPOS film 543, and the first DOPOS film 571 are formed in the peripheral circuit region 520.

Figure 42:
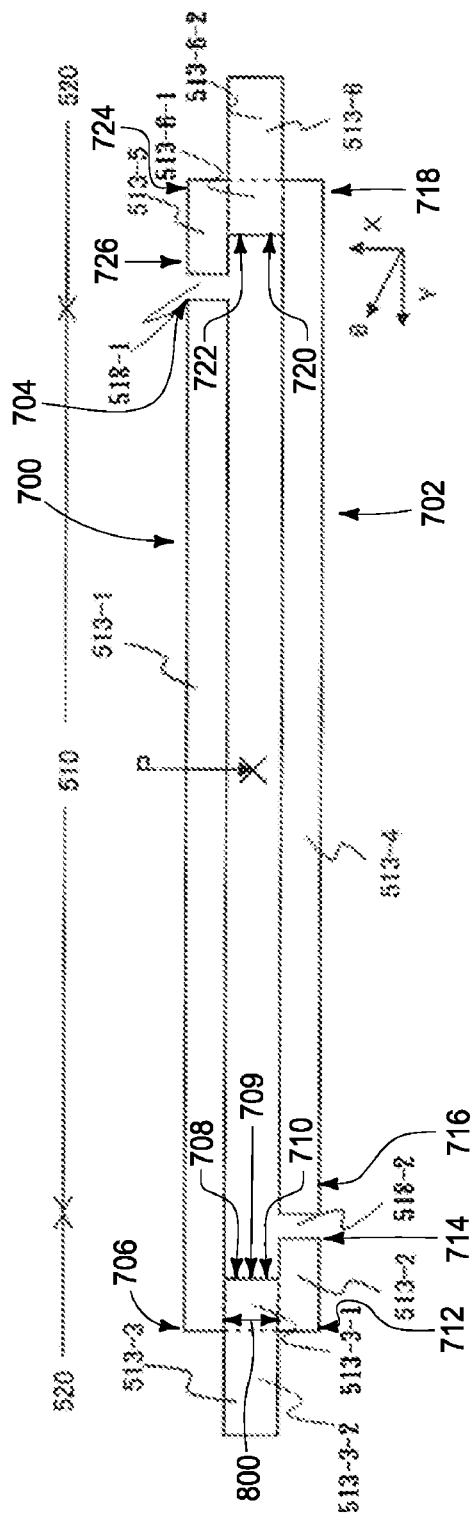
FIG. 42 is a diagrammatical view for explaining a bit line.

As shown in FIG. 42, each of the formed bit lines 513 has three portions (first to third portions or fourth to sixth portions). Two bit lines 513 makes a bit-line pair.

In FIG. 42, the rightward direction (−Y direction) is defined as a first direction while the leftward direction (+Y direction) is defined as a second direction. These first and second directions are different from the first and second directions mentioned in the description of the spaces 108a of the first organic film pattern 108a.

One bit line 700 (first interconnect, first conductive layer or first conductive line) of the bit-line pair has a first portion 513-1 and a second portion 513-2 that extend in the first direction, and a third portion (which may also be referred to as a first tab portion) 513-3 that connects the first and second portions together and that extends in the second (or first) direction. Among these first to third portions 513-1 to 513-3, at least part of the first portion 513-1 is on the memory cell region 510, while the second and third portions 513-2 and 513-3 are on the first peripheral circuit region 520. These first to third portions 513-1 to 513-3 form a first J shape portion from a plan view.

The other bit line 702 (second interconnect, second conductive layer or second conductive line) of the bit-line pair has a fourth portion 513-4 and a fifth portion 513-5 that extend in the second direction, and a sixth portion (which may also be referred to as a second tab portion) 513-6 that connects the fourth and fifth portions together and that extends in the first (or second) direction. Among these fourth to sixth portions 513-4 to 513-6, at least part of the fourth portion 513-4 is on the memory cell region 510, while the fifth and sixth portions 513-5 and 513-6 are on the second peripheral circuit region 520. These fourth to sixth portions 513-4 to 513-6 form a second J shape portion from a plan view.

The two bit lines 700 and 702 making the bit-line pair do not overlap each other and are point symmetrical with respect to a point of symmetry P. The first portion 513-1 and the fifth portion 513-5 are on a straight line (first straight line) extending in the first (or second) direction, while the second portion 513-2 and the fourth portion 513-4 are on another straight line (second straight line) that is different from the first straight line and that extends in the first (or second) direction. Moreover, the two bit lines 700 and 702 form a loop shape sandwiching two openings 518-1 and 518-2 from a plan view.

Subsequently, a silicon nitride film serving as the first SW nitride film 547 is formed as a film of, for example, 8 nm in thickness. The silicon nitride film formed in the peripheral circuit region 520 is so etched back that the silicon nitride film formed on the side walls of the peripheral gate 522 remains as the first SW nitride film 547, as shown in FIGS. 43A and 43D to 43F. For simpler explanation, the silicon nitride film remaining in the memory cell region 510 is also referred to as first SW nitride film 547.

Subsequently, impurity is introduced by ion injection into the second active region 521 on which the peripheral gate 522 is placed, to form the peripheral lightly-doped impurity diffusion layer 574.

Subsequently, a silicon oxide film serving as the SW oxide film 573 is deposited into a film of 40 nm in thickness by, for example, LPCD (Low Pressure Chemical Vapor Deposition). The deposited silicon oxide film is then so etched back that the silicon oxide film remains on the first SW nitride film 547 remaining on the side walls of the peripheral gate 522. Hence the SW oxide film 573 is formed on the first SW nitride film 547 on the side walls of the peripheral gate 522. Following the formation of the SW oxide film 573, impurity is introduced into the second active region 521 by ion injection to form the peripheral heavily-doped impurity diffusion layer 575.

Subsequently, a silicon nitride film serving as the second SW nitride film 548 is deposited into a film of, for example, 8 nm in thickness. At this stage, the silicon nitride film covers the upper surface of the peripheral gate 522. For simpler explanation, the silicon nitride film remaining in the memory cell region 510 is also referred to as second SW nitride film 548. This silicon nitride film functions as an oxidation preventing barrier film when an SOD film to be formed next is annealed.

Subsequently, the SOD film serving as the first inter-layer insulating film 549 is formed with a spin coater. The formed SOD film is then annealed under a steam atmosphere to reform the SDO film into a silicon oxide film, which is the first inter-layer insulating film 549. The first inter-layer insulating film 549 is then polished by CMP until the uppermost layer of the cap insulating film 546 is exposed.

Subsequently, holes for the capacitance contacts 515 are formed on both sides of the first active region 511, which is not depicted in FIGS. 43A and 43D to 43F (see FIG. 30C). A silicon nitride film of, for example, 5 nm in thickness is so formed as to cover the inner surface of the formed hole. The formed silicon nitride film is then etched back to leave the silicon nitride film remaining on the side walls of the hole for the capacitance contact 515. This silicon nitride film serves as the capacitance contact liner 534.

Subsequently, ions of phosphorus, which is N-type impurity, are injected into the first active region 511 exposed at the bottom of the hole for the capacitance contact 515 to form the capacitance contact highly-doped impurity diffusion layer 533 (see FIG. 30C). A dose of ion injection is determined to be, for example, 1E14 to 5E14 atoms/cm$^2$. This capacitance contact highly-doped impurity diffusion layer 533 functions as the source or drain of the buried gate type MOS transistor disposed in the memory cell region 510 and also exerts a function of reducing the connection resistance of connection to the capacitance contact plug 535.

Then, the DOPOS film of 50 nm in thickness is formed and is etched back to leave it remaining on the lower part of the capacitance contact hole. The remaining DOPOS film serves as the third DOPOS film 536.

Figure 43A:
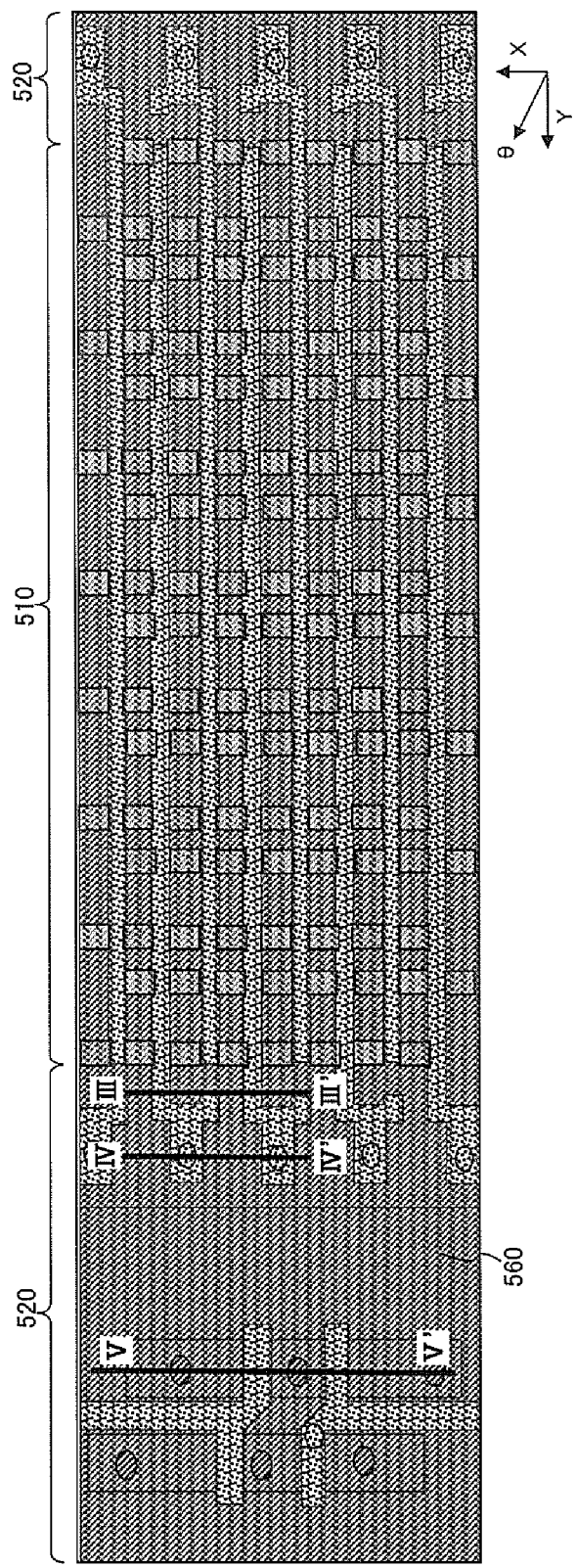
FIG. 43A is a plan view for explaining the manufacturing method for the semiconductor device depicted in FIGS. 41A and 41D to 41F.
Figure 43D:
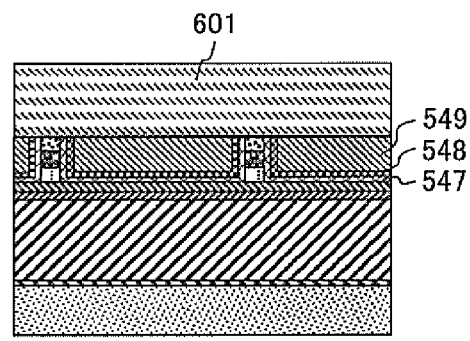
FIG. 43D is a sectional view along a line of FIG. 43A.
Figure 43E:
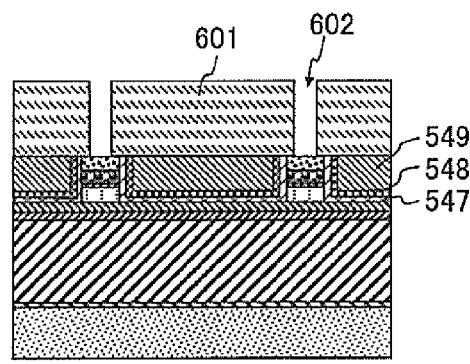
FIG. 43E is a sectional view along a IV-IV line of FIG. 43A.
Figure 43F:
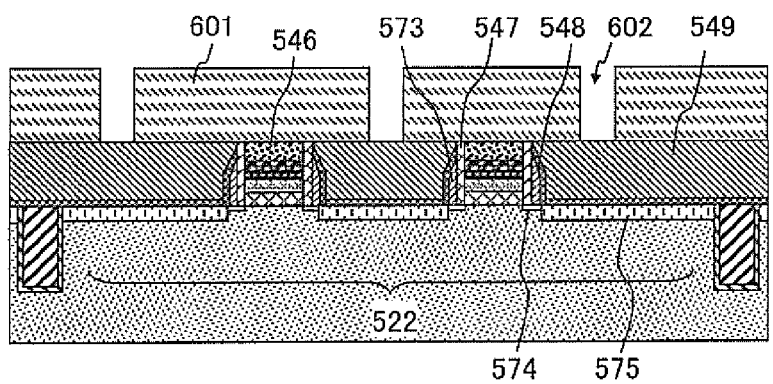
FIG. 43F is a sectional view along a V-V' line of FIG. 43A.

Subsequently, as shown in FIGS. 43A and 43D to 43F, a fourth organic film pattern 601 is formed, using, for example, an ArF resist. Openings 602 for forming the first to third peripheral contacts 517, 524, and 525 are formed on the fourth organic film pattern 601. The opening 602 for the first peripheral contact 517 is formed on the end (tab portion) of the bit line 513, as shown in FIG. 43E. The opening 602 for the second peripheral contact 524 is formed on the peripheral gate 522 at a location not depicted. The opening 602 for the third peripheral contact 525 is formed on the second active region 521, as shown in FIG. 43F.

Subsequently, etching is carried out, using the fourth organic film pattern 601 as a mask, to form holes for the first to third peripheral contacts. Then, a Co film of about 10 nm in thickness is formed by sputtering. The formed Co film is annealed so that the Co film reacts with Si in contact therewith to form the CoSi film. The part of Co film that fails to react with Si is then eliminated by wet etching to leave the CoSi film 537 remaining on the third DOPOS film 536 of the capacitance contact 515 (see FIG. 30B) and also on the second active region 521 exposed in the hole for the third peripheral contact 525 (which is not depicted).

Subsequently, the TiN film 538 of about 5 nm in thickness is formed such that the TiN film 538 covers the inner surface of the hole for the capacitance contact 515 as well as the inner surfaces of the first to third peripheral contacts 517, 524, and 525. The second W film 539 is then formed by CVD such that the second W film 539 fills up each of those contact holes.

Subsequently, a mask pattern, such as an organic film pattern, that corresponds to the pattern of W interconnect 523 is formed on the second W film 539, and the second W film 539 and TiN film 538 are dry etched. Hence the W interconnect 523 composed of the TiN film 538 and second W film 539 is formed, as shown in FIGS. 44A and 44D to 44F. At the same time, contact plugs including the third peripheral contact plug 576 are formed in the contact holes, respectively. The top of the first to third peripheral contacts 517, 524, and 525 is covered with the W interconnect 523.

Subsequently, as shown in FIGS. 30B to 30F, the second inter-layer insulating film 579 is formed, which is followed by the formation of the lower electrode 553 connected to the capacitance contact plug 535. The second inter-layer insulating film 579 in the memory cell region 510 is then eliminated to form the capacitance insulating film and the upper electrode 555. Then, in the memory cell region 510, the fourth DOPOS/BSiGe laminated film 556, the plate electrode 557, the plate nitride film 558, and the inter-layer insulating film 561 are formed.

Subsequently, the first through-hole plug 581 for connecting the W interconnect 523 to the upper electrode 555 of the capacitor 516 is formed. Then, the first to third metal interconnect layers 562 to 564, which are the uppermost layer interconnects, are formed.

Hence the semiconductor device (DRAM) of this embodiment is completed.

According to this embodiment, a portion (tab portion) wider than the other portion (central portion) can be formed on an end of each linear interconnect formed by the double number of pitch-intervals process, without increasing the number of processes or complicating the processes, which is an advantage over the related technique. As a result, when the contact plug hole connected to the interconnect is formed, a possibility of the hole's extending out of the interconnect is virtually reduced to zero. This ensures the stable connection between the interconnect and the contact plug. Because the bottom diameter of the contact plug can be determined to be larger than the width of the central portion of the interconnect, connection resistance between the contact plug and the interconnect can be reduced. Hence product flaws resulting from signal delays caused by connection resistance are reduced to improve product yield.

Figure 44A:
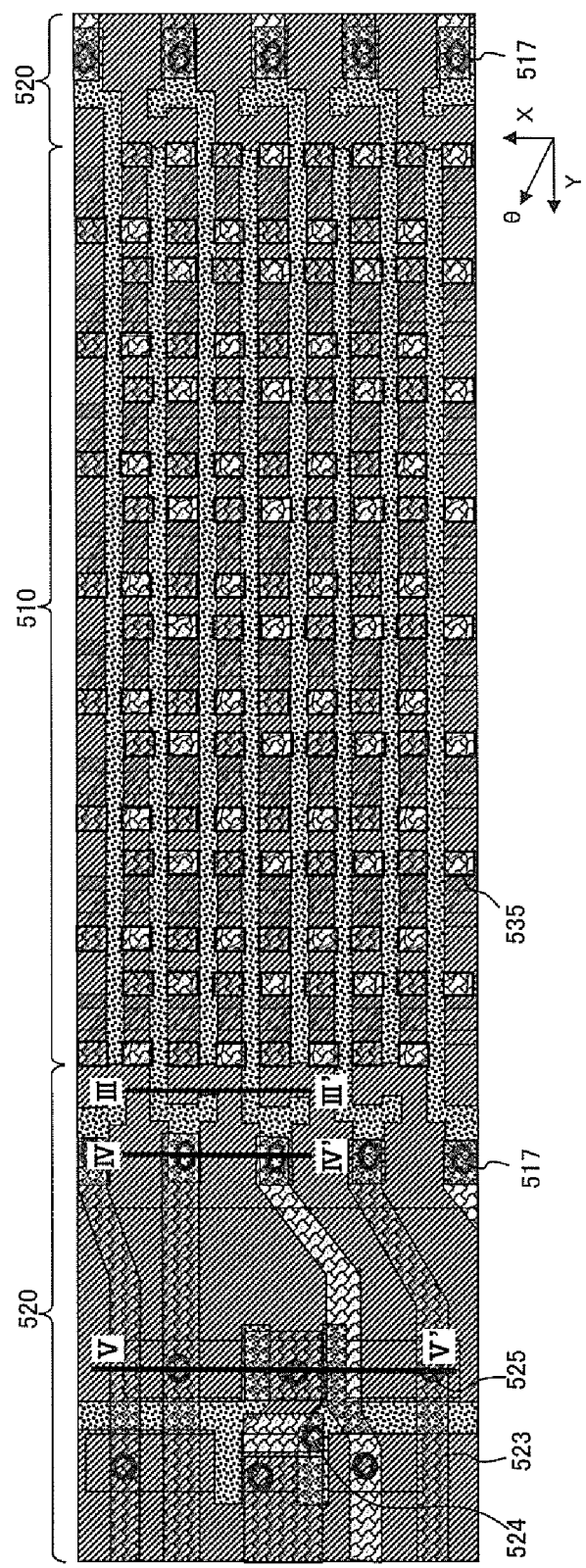
FIG. 44A is a plan view for explaining the manufacturing method for the semiconductor device depicted in FIGS. 43A and 43D to 43F.
Figure 44D:
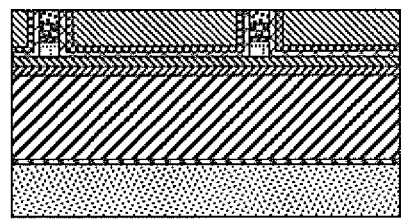
FIG. 44D is a sectional view along a line of FIG. 44A.
Figure 44E:
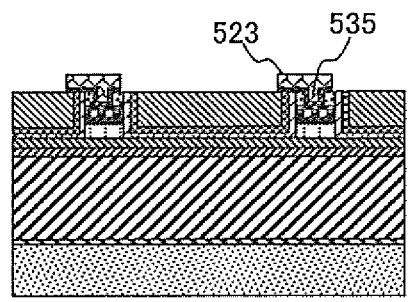
FIG. 44E is a sectional view along a IV-IV line of FIG. 44A.
Figure 44F:
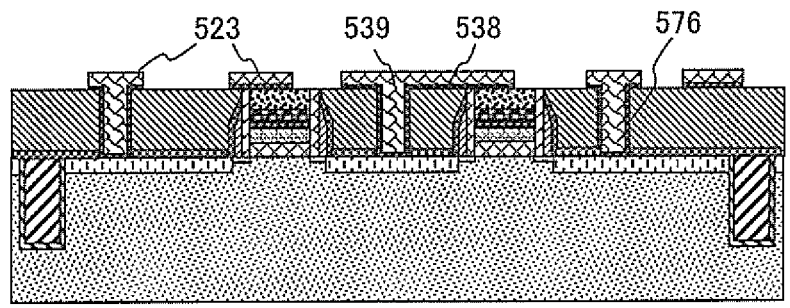
FIG. 44F is a sectional view along a V-V' line of FIG. 44A.

Some embodiments include a semiconductor device which comprises a first conductive line 700 as shown in FIG. 42. The first conductive line comprises a first portion 513-1 extending in a first direction (e.g., Y direction of FIG. 42) and including first and second end parts 704 and 706, a second portion 513-3-1 (which may also be referred to as an inner tab portion) (e.g., 513-3-1) extending in a second direction from the second end part 706 of the first portion and including third and fourth end parts 708 and 710, a third portion 513-2 extending in the first direction from the fourth end part 710 of the second portion toward the first end part 704 of the first portion and including fifth and sixth end parts 712 and 714, and a fourth portion 513-3-2 (which may also be referred to as an outer tab portion) extending in the first direction from the second portion 513-3-1 on an opposite side to the first end part 704 of the first portion 513-1. The second direction is substantially perpendicular to the first direction. The third end part 708 of the second portion 513-3-1 merges with the second end part 706 of the first portion 513-1. The fifth end part 712 of the third portion 513-2 merges with the fourth end part 710 of the second portion 513-3-1. An intermediate part 709 of the second portion 513-3-1 is between the third and fourth end parts 708 and 710, and the fourth portion 513-3-2 is in contact with, and extends from, such intermediate part. A space 800 is between the first portion 513-1 and the third portion 513-2. A conductive plug (for instance plug 517 of FIG. 44A) may be provided on fourth portion 513-3-2, as shown in FIG. 44A. Such plug may have a diameter smaller than a size of the fourth portion as shown in FIG. 44A.

Some embodiments include a semiconductor device which comprises a first conductive line 700 and a second conductive line 702 as shown in FIG. 42. The first conductive line 700 comprising a first portion 513-1 extending in a first direction (e.g., Y direction of FIG. 42) and including first and second end parts 704 and 706, a second portion 513-3-1 (which may also be referred to as an inner tab portion) extending in a second direction from the second end part 706 of the first portion and including third and fourth end parts 708 and 710, a third portion 513-2 extending in the first direction from the fourth end part 710 of the second portion toward the first end part 704 of the first portion and including fifth and sixth end parts 712 and 714, and a first tab portion 513-3-2 (which may also be referred to as an outer tab portion) extending in the first direction from the second portion 513-3-1 on an opposite side to the first end part 704 of the first portion 513-1. The second direction is substantially perpendicular to the first direction. The third end part 708 of the second portion 513-3-1 merges with the second end part 706 of the first portion 513-1. The fifth end part 712 of the third portion 513-2 merges with the fourth end part 710 of the second portion 513-3-1. The second conductive line 702 comprises a fourth portion 513-4 extending in the first direction and including seventh and eighth end parts 716 and 718, a fifth portion 513-6-1 (which may also be referred to as an inner tab portion) extending in the second direction from the eighth end part 718 of the fourth portion and including ninth and tenth end parts 720 and 222, a sixth portion 513-5 extending in the first direction from the tenth end part 722 of the fifth portion toward the seventh end part 716 of the fourth portion 513-4 and including eleventh and twelfth end parts 724 and 726, and a second tab portion 513-6-2 (which may also be referred to as an outer tab portion) extending in the first direction from the fifth portion 513-6-1 on an opposite side to the seventh end part 716 of the fourth portion 513-4. The ninth end part 720 of the fifth portion 513-6-1 merges with the eighth end part 718 of the fourth portion 513-4. The eleventh end part 724 of the sixth portion 513-5 merges with the tenth end part 722 of the fifth portion 513-6-1. The first and second conductive lines are disposed such that the first portion 513-1 of the first conductive line and the sixth portion 513-5 of the second conductive line are in line and the third portion 513-2 of the first conductive line and the fourth portion 513-4 of the second conductive line are in line.

Some embodiments include a semiconductor device comprising a first conductive layer (e.g., a layer comprising the regions 513-1, 513-2, 513-3, 513-4, 513-5, 513-6 shown in FIG. 42) formed on the semiconductor substrate (e.g., 531 shown in FIG. 30B) and a first conductive plug (e.g., 517 shown in FIG. 44A) connected to the first conductive layer. The first conductive layer includes a plurality of loops (e.g., 513-1, 513-2, 513-3, 513-4, 513-5, 513-6 shown in FIG. 42)) of conductive material over the semiconductor substrate. Each of the plurality of loops comprises a first opening and a second opening (e.g., 518-1, 518-2 shown in FIG. 42), a first portion (e.g., 513-1 shown in FIG. 42) and a second portion (e.g., 513-5 shown in FIG. 42) sandwiching the first opening, a third portion (e.g., 513-2 shown in FIG. 42) and a fourth portion (e.g., 513-4 shown in FIG. 42) sandwiching the second opening, a first tab portion (e.g., 513-3 shown in FIG. 42) connected to the first portion 513-1 and the third portion 513-2 and having a first length in a first direction (e.g., Y direction of FIG. 42) and a first width in a second direction perpendicular to the first direction, and a second tab portion (e.g., 513-6 shown in FIG. 42) connected to the second portion and the fourth portion and having a second length in the first direction and a second width in the second direction. The first tab portion 513-3 is divided into a first inner tab portion (e.g., 513-3-1 shown in FIG. 42) and a first outer tab portion (e.g., 513-3-2 shown in FIG. 42). The first inner tab portion is sandwiched between the first portion 513-1 and the third portion 513-2. The first outer tab portion 513-3-2 is located out of a region which the first portion 513-1 and the third portion 513-2 sandwich. The second tab portion is divided into a second inner tab portion (e.g., 513-6-1 shown in FIG. 42) and a second outer tab portion (e.g., 513-6-2 shown in FIG. 42). The second inner tab portion is sandwiched between the second portion 513-5 and the fourth portion 513-4. The second outer tab portion 513-6-2 is located out of a region which the second portion 513-5 and the fourth portion 513-4 sandwich. The first conductive plug 517 is provided over the first outer tab portion of the first tab potion. The first conductive plug 517 has a diameter smaller than the first length and smaller than the first width (see, for example, FIG. 44A).

Several embodiments of the present invention have been described. The present invention is not limited to the above embodiments but various modification and alterations of the present invention can be made on the condition that the modifications and alterations do not deviate from the substance of the invention. For example, the present invention applies not only to the DRAM but also to all types of devices having interconnects formed as line patterns.

I claim:

1. A semiconductor device comprising a first conductive line, the first conductive line comprising:
    a first portion extending in a first direction and including first and second end parts;
    a second portion extending in a second direction from the second end part of the first portion, the second direction being substantially perpendicular to the first direction, the second portion including third and fourth end parts, the third end part of the second portion merging with the second end part of the first portion;
    a third portion extending in the first direction from the fourth end part of the second portion toward the first end part of the first portion, the third portion including fifth and sixth end parts, the fifth end part of the third portion merging with the fourth end part of the second portion;
    a fourth portion extending in the first direction from the second portion on an opposite side to the first end part of the first portion; and
    wherein the second portion includes an intermediate part between the third and fourth end parts, and the fourth portion being in contact with the intermediate part of the second portion.

2. The device as claimed in claim 1, wherein the fourth portion is larger in the second direction than a space between the first and third portions.

3. A semiconductor device comprising a first conductive line, the first conductive line comprising:
    a first portion extending in a first direction and including first and second end parts;
    a second portion extending in a second direction from the second end part of the first portion, the second direction being substantially perpendicular to the first direction, the second portion including third and fourth end parts, the third end part of the second portion merging with the second end part of the first portion;
    a third portion extending in the first direction from the fourth end part of the second portion toward the first end part of the first portion, the third portion including fifth and sixth end parts, the fifth end part of the third portion merging with the fourth end part of the second portion;
    a fourth portion extending in the first direction from the second portion on an opposite side to the first end part of the first portion; and
    wherein the fourth portion is no less in the second direction than a space between the first and third portions.

4. A semiconductor device comprising a first conductive line, the first conductive line comprising:
    a first portion extending in a first direction and including first and second end parts;
    a second portion extending in a second direction from the second end part of the first portion, the second direction being substantially perpendicular to the first direction, the second portion including third and fourth end parts, the third end part of the second portion merging with the second end part of the first portion;
a third portion extending in the first direction from the fourth end part of the second portion toward the first end part of the first portion, the third portion including fifth and sixth end parts, the fifth end part of the third portion merging with the fourth end part of the second portion;
a fourth portion extending in the first direction from the second portion on an opposite side to the first end part of the first portion; and
a conductive plug on the fourth portion and having a diameter smaller than a size of the fourth portion.

5. A semiconductor device comprising a first conductive line and a second conductive line,
the first conductive line comprising:
a first portion extending in a first direction and including first and second end parts;
a second portion extending in a second direction from the second end part of the first portion, the second direction being substantially perpendicular to the first direction, the second portion including third and fourth end parts, the third end part of the second portion merging with the second end part of the first portion;
a third portion extending in the first direction from the fourth end part of the second portion toward the first end part of the first portion, the third portion including fifth and sixth end parts, the fifth end part of the third portion merging with the fourth end part of the second portion; and
a first tab portion extending in the first direction from the second portion on an opposite side to the first end part of the first portion;
the second conductive line comprising:
a fourth portion extending in the first direction and including seventh and eighth end parts;
a fifth portion extending in the second direction from the eighth end part of the fourth portion, the fifth portion including ninth and tenth end parts, the ninth end part of the fifth portion merging with the eighth end part of the fourth portion;
a sixth portion extending in a first direction from the tenth end part of the fifth portion toward the seventh end part of the fourth portion, the sixth portion including eleventh and twelfth end parts, the eleventh end part of the sixth portion merging with the tenth end part of the fifth portion; and
a second tab portion extending in the first direction from the fifth portion on an opposite side to the seventh end part of the first portion; and
the first and second conductive lines being disposed such that the first portion of the first conductive line and the sixth portion of the second conductive line are in line and the third portion of the first conductive line and the fourth portion of the second conductive line are in line.

6. The device as claimed in claim 5, wherein the first end part of the first portion of the first conductive line is adjacent to the twelfth end portion of the sixth portion of the second conductive line and the sixth end part of the third portion of the first conductive line is adjacent to the seventh end part of the fourth portion of the second conductive line.

7. The device as claimed in claim 6, wherein the first and second conductive lines are disposed such that the first tab portion of the first conductive line and the second tab portion of the second conductive line are in line.

8. The device as claimed in claim 7, wherein the first and second conductive lines are disposed such that the first tab portion of the first conductive line includes a first additional portion and the second tab portion of the second conductive line includes a second additional portion, and the first and second additional portions are out of line.

9. The device as claimed in claim 6, further comprising a first contact plug provided on the first tab portion, wherein the first tab portion has a first length in the first direction and a first width in the second direction, and a diameter of the first contact plug is smaller than each of the first length and the first width of the first tab portion.

10. The device as claimed in claim 9, further comprising a second contact plug provided on the second tab portion, wherein the second tab portion has a second length in the first direction and a second width in the second direction, and a diameter of the second contact plug is smaller than each of the second length and the second width of the second tab portion.

11. The device as claimed in claim 6, wherein each of the first and second conductive lines comprises a conductive film and a cap insulating film.

12. The device as claimed in claim 6, further comprising a plurality of memory cells provided at an area where the first portion of the first conductive line and the fifth portion of the second conductive line overlap.

13. The device as claimed in claim 6, wherein the first conductive line and the second conductive line are in a point symmetry.

14. A semiconductor device, comprising:
a semiconductor substrate;
a conductive layer including a plurality of loops of conductive material over the semiconductor substrate, each of the plurality of loops comprising:
a first opening and a second opening;
a first portion and a second portion sandwiching the first opening;
a third portion and a fourth portion sandwiching the second opening;
a first tab portion connected to the first portion and the third portion and having a first length in a first direction and a first width in a second direction perpendicular to the first direction, the first tab portion being divided into a first inner tab portion and a first outer tab portion, the first inner tab portion being sandwiched between the first portion and the third portion, the first outer tab portion being located out of a region which the first portion and the third portion sandwich; and
a second tab portion connected to the second portion and the fourth portion and having a second length in the first direction and a second width in the second direction, the second tab portion being divided into a second inner tab portion and a second outer tab portion, the second inner tab portion being sandwiched between the second portion and the fourth portion, the second outer tab portion being located out of a region which the second portion and the fourth portion sandwich; and
a plurality of first conductive plugs, with each of the conductive plugs being provided over the first outer tab portion of the respective first tab potion of one of the conductive loops, the conductive plugs each having a diameter smaller than the first length and smaller than the first width.

15. The semiconductor device, according to the claim 14, further comprising a plurality of second conductive plugs, with each of the second conductive plugs being provided over the second outer tab portion of the respective second tab portion, the second conductive plugs each having a diameter smaller than the second length and smaller than the second width.

16. The semiconductor device, according to claim 15, wherein the plurality of first conductive plugs are arranged on a first line, the plurality of second conductive plugs are arranged on a second line parallel with the first line, the first openings are arranged on a third line parallel with the first line, and the second openings are arranged on a fourth line parallel with the first line.

17. The semiconductor device, according to the claim 14, wherein the first and fourth portions are longer than the second and third portions respectively and the first and fourth portions are arranged in parallel to each other so that a plurality of memory cells are provided at an area overlapping the first and fourth portions.

18. The semiconductor device, according to claim 17, wherein the plurality of loops of conductive material are arranged in parallel to one another so that first and second loops are adjacently arranged, and the first portion of the first loop is adjacently arranged to the fourth portion of the second loop.

19. The semiconductor device, according to claim 14, wherein the first and second outer tab portions are arranged aside to the third and fourth portions respectively.

\* \* \* \* \*